US010222277B2

(12) United States Patent
Matsuoka et al.

(10) Patent No.: US 10,222,277 B2
(45) Date of Patent: Mar. 5, 2019

(54) METHODS AND SYSTEMS FOR GENERATING VIRTUAL SMART-METER DATA

(71) Applicant: Google LLC, Mountain View, CA (US)

(72) Inventors: Yoky Matsuoka, Palo Alto, CA (US); Scott McGaraghan, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 671 days.

(21) Appl. No.: 14/563,917

(22) Filed: Dec. 8, 2014

(65) Prior Publication Data

US 2015/0161020 A1 Jun. 11, 2015

Related U.S. Application Data

(60) Provisional application No. 61/913,384, filed on Dec. 8, 2013.

(51) Int. Cl.
| | | |
|---|---|---|
| *G06F 11/30* | (2006.01) | |
| *G01F 11/00* | (2006.01) | |
| *G01K 17/00* | (2006.01) | |
| *G01R 21/00* | (2006.01) | |
| *G01F 15/06* | (2006.01) | |
| *G06N 3/08* | (2006.01) | |

(Continued)

(52) U.S. Cl.
CPC .............. *G01K 17/00* (2013.01); *G01F 11/00* (2013.01); *G01F 15/063* (2013.01); *G06N 3/084* (2013.01); *G01D 4/00* (2013.01); *G01R 21/133* (2013.01); *H04Q 2209/60* (2013.01); *Y02B 90/24* (2013.01); *Y04S 20/30* (2013.01)

(58) Field of Classification Search
CPC ..................................................... G06Q 50/06
See application file for complete search history.

(56) References Cited

U.S. PATENT DOCUMENTS

| | | |
|---|---|---|
| 6,490,174 B1 | 12/2002 | Kompelien |
| 2006/0208099 A1 | 9/2006 | Chapman et al. |

(Continued)

FOREIGN PATENT DOCUMENTS

WO     WO2012068591 A3     5/2012

OTHER PUBLICATIONS

International Search Report and Written Opinion of PCT/US12/00007 dated Jan. 31, 2013, all pages.

(Continued)

*Primary Examiner* — Robert Carpenter
(74) *Attorney, Agent, or Firm* — Kilpatrick Townsend & Stockton LLP

(57) ABSTRACT

Computational methods and systems for generating virtual smart-meter data from operational data collected by intelligent controllers in buildings that do not have smart meters are disclosed. Methods and systems include collecting operational data from a number of intelligent controllers and collecting smart-meter data from a number of smart meters associated with the intelligent controllers. The collected operational data and associated smart-meter data are used to generate a mathematical model relating operational data to smart-meter data. The mathematical model can be used to calculate virtual smart-meter data from operational data collected by an intelligent controller located in a building that does not have a smart meter.

20 Claims, 36 Drawing Sheets

(51) Int. Cl.
*G01D 4/00* (2006.01)
*G01R 21/133* (2006.01)

(56) References Cited

U.S. PATENT DOCUMENTS

| | | |
|---|---|---|
| 2007/0167179 A1 | 7/2007 | Shamoon et al. |
| 2009/0195349 A1 | 8/2009 | Frader-Thompson et al. |
| 2010/0060479 A1 | 3/2010 | Salter |
| 2010/0101854 A1 | 4/2010 | Wallaert et al. |
| 2010/0305891 A1 | 12/2010 | Rodgers |
| 2012/0232969 A1* | 9/2012 | Fadell .................. G06Q 10/20 705/14.4 |
| 2015/0112616 A1* | 4/2015 | Teranishi ............. G01R 21/133 702/60 |

OTHER PUBLICATIONS

International Preliminary Report on Patentability of PCT/US12/00007 dated May 21, 2013, all pages.

* cited by examiner

1) Initialize weights
$$W'_{ij} \in [0,1]$$
2) Repeat steps 3) throught 10) for corresponding sets of $\vec{Q}$ and $\vec{M}$
   3) Receive inputs and outputs
   $$\vec{Q} = [q_1, q_2, \ldots, q_M]^T$$
   $$\vec{S} = [s_1, s_2, \ldots, s_N]^T$$
   4) For each node $j$ in the input layer ($l = 1$) do
   $$a_j \leftarrow q_j$$
   5) For $l = 2$ to $L$ do
   $$sum_i \leftarrow \sum_{j=1} W'_{ji} a_j$$
   $$a_i \leftarrow h(sum_i)$$
   6) For each node $i$ in the output layer ($l = L$) do
   $$Error_i = \tfrac{1}{2}(s_i - a_i)^2$$
   $$\Delta_i \leftarrow h'(sum_i) \times (s_i - a_i)$$
   7) For $l = L - 1$ to 1 do
      8) For each node $j$ in the layer $l$ do
      $$\Delta_j \leftarrow h'(sum_j) \times \sum_{i=1} W'_{ji} \Delta_i$$
      9) For each node $i$ in layer $l + 1$ do
      $$W'_{ji} \leftarrow W'_{ji} + \alpha \times a_j \times \Delta_i$$
10) If for each node $i$ in the output layer
    $$Error_i < Error\_threshold$$
    then
        goto 3)
    else
        goto 5)

FIG. 15B

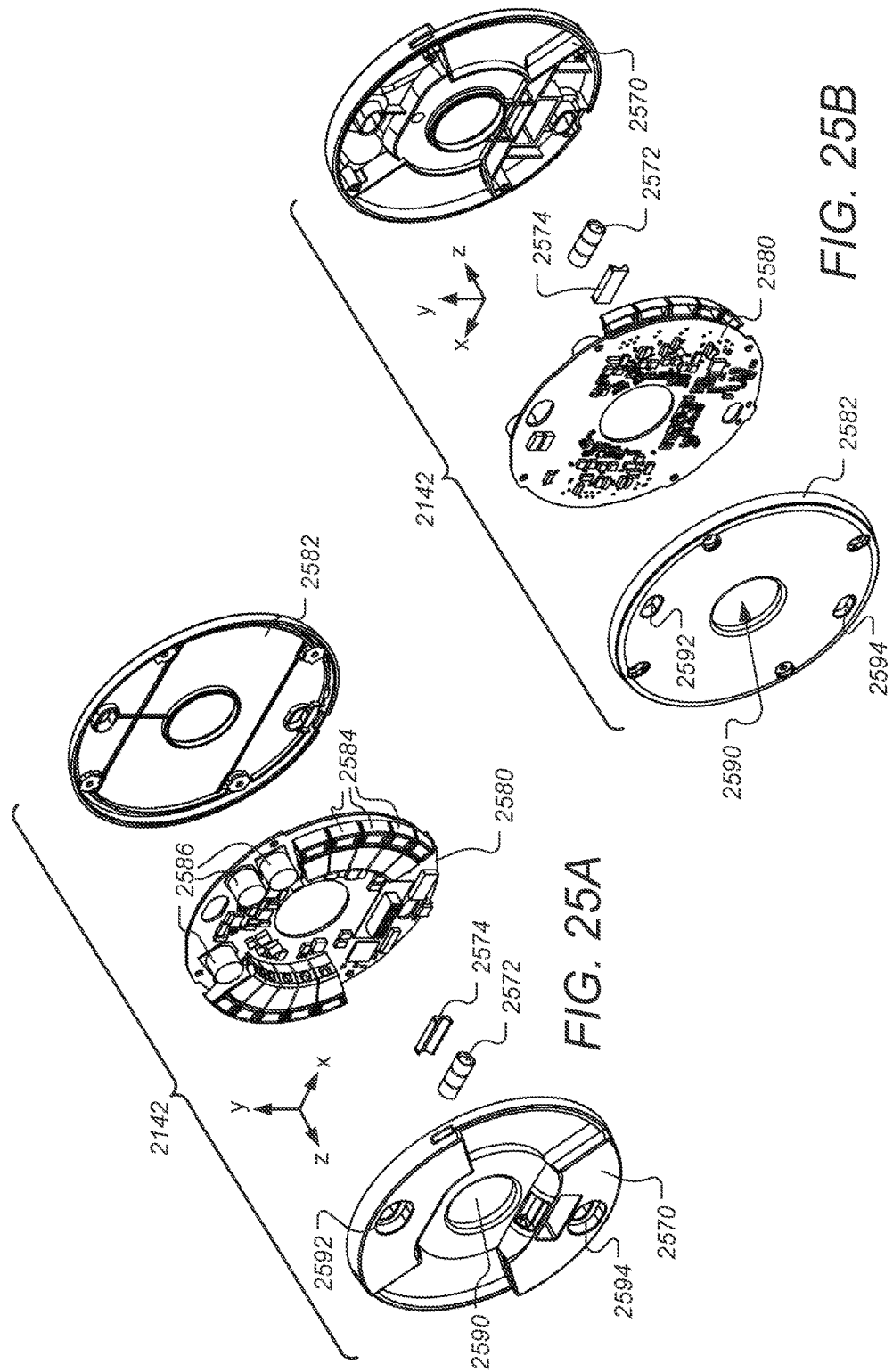

METHODS AND SYSTEMS FOR GENERATING VIRTUAL SMART-METER DATA

CROSS-REFERENCES TO RELATED APPLICATIONS

This application claims the benefit of U.S. Provisional Application No. 61/913,384, filed Dec. 8, 2013, the entire contents of which is hereby incorporated herein in its entirety for all purposes.

TECHNICAL FIELD

The present disclosure is directed to computational systems and methods that can be used to compute virtual meter data based on data collected from an intelligent controller.

BACKGROUND

Control systems and control theory are well-developed fields of research and development that have had a profound impact on the design and development of a large number of systems and technologies, from airplanes, spacecraft, and other vehicle and transportation systems to computer systems, industrial manufacturing and operations facilities, machine tools, process machinery, and consumer devices. Control theory encompasses a large body of practical, system-control-design principles, but is also an important branch of theoretical and applied mathematics. Various different types of controllers are commonly employed in many different application domains, from simple closed-loop feedback controllers to complex, adaptive, state-space and differential-equations-based processor-controlled control system.

Many controllers are designed to output control signals to various dynamical components of a system based on a control model and sensor feedback from the system. Many systems are designed to exhibit a predetermined behavior or mode of operation, and the control components of the system are therefore designed, by traditional design and optimization techniques, to ensure that the predetermined system behavior transpires under normal operational conditions. Many systems are not designed to produce optimal consumption of a utility provided by a utility company. Theoreticians, researchers, and developers of many different types of controllers and automated systems continue to seek approaches that enable controllers to optimize consumption of a utility.

BRIEF SUMMARY

This disclosure is directed to computational methods and systems for generating virtual smart-meter data from operational data collected by intelligent controllers in buildings that do not have smart meters. Methods and systems include collecting operational data from a number of intelligent controllers and collecting smart-meter data from a number of smart meters. Each smart meter monitors and collects smart-meter data relating to a utility provided by a utility company to a building that includes one of the intelligent controllers. A utility can be natural gas, electricity, or water or any other service provided by a utility company. The collected operational data and associated smart-meter data are used to generate a mathematical model that, in general, relates operational data to smart-meter data. The mathematical model can be used to calculate virtual smart-meter data from operational data collected by an intelligent controller located in a building that does not have a smart meter. The virtual smart-meter data can, in turn, be used to generate intelligent-controller commands and information that are transmitted to the intelligent controller to adjust the intelligent controller settings to lower the cost and improve efficient use of the utility. The virtual smart-meter data can also be used to assess the efficiency and performance of devices and systems controlled by the intelligent controller.

BRIEF DESCRIPTION OF THE DRAWINGS

A further understanding of the nature and advantages of the present invention may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

FIG. 15B presents an example of a pseudocode for multilayer feed-forward neural networks that execute learning through back propagation.

FIGS. 25A-25B illustrate exploded front and rear perspective views, respectively, of a backplate of the intelligent thermostat, according to some embodiments.

DETAILED DESCRIPTION

The current disclosure is directed to computational methods and systems for identifying unidentified controlled systems using information provided by a general class of intelligent controllers that includes many different specific types of intelligent controllers that can be applied to, and incorporated within, the controlled systems. Intelligent controllers control the operation of devices, machines, systems, and organizations. The general class of intelligent controllers to which the current disclosure is directed include automated learning components that allow the intelligent controllers to learn desired operational behaviors of the devices, machines, systems, and organizations which they control and incorporate the learned information into control schedules.

The current disclosure presents, in addition to methods and implementations for identifying unidentified controlled systems, a specific example of an intelligent thermostat controller, or intelligent thermostat, and methods employed by the general class of intelligent controllers to which the current disclosure is directed. The intelligent thermostat is presented as an example of an intelligent controller.

The detailed description includes four subsections: (1) an overview of the smart-home environment; (2) automated control-schedule learning; (3) methods for identifying unidentified controlled systems; and (4) an intelligent thermostat as an example of an intelligent controller.

Overview of the Smart-Home Environment

Figure 1:
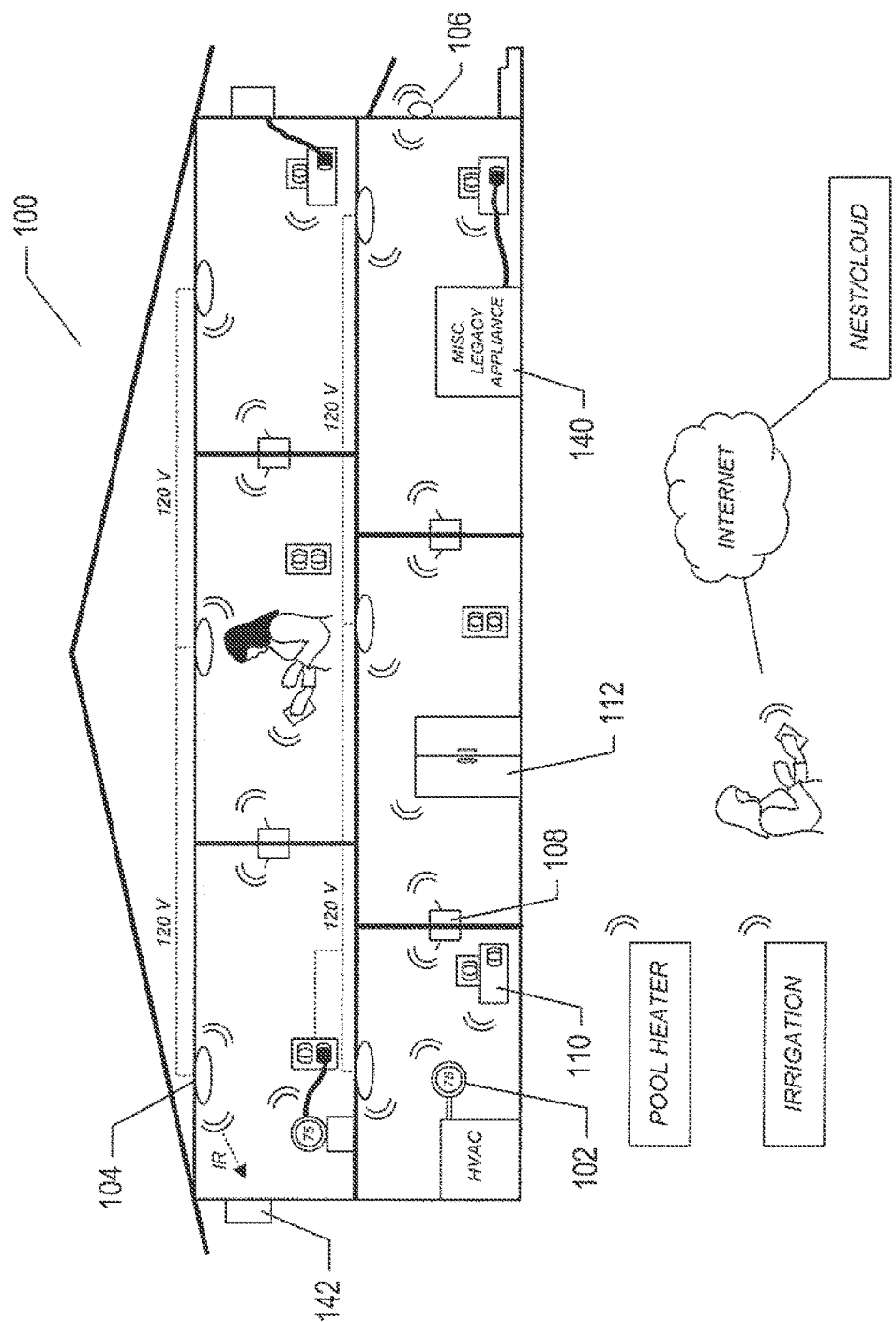
FIG. 1 illustrates a smart-home environment, according to some embodiments.

FIG. 1 illustrates a smart-home environment. The smart-home environment 100 includes a number of intelligent, multi-sensing, network-connected devices. These intelligent controllers intercommunicate and are integrated together within the smart-home environment. The intelligent controllers may also communicate with cloud-based smart-home control and/or data-processing systems in order to distribute control functionality, to access higher-capacity and more reliable computational facilities, and to integrate a particular smart home into a larger, multi-home or geographical smart-home-device-based aggregation.

The intelligent controllers may include one or more intelligent thermostats 102, one or more intelligent hazard-detection units 104, one or more intelligent entryway-interface devices 106, smart switches, including smart wall-like switches 108, smart utilities interfaces and other services interfaces, such as smart wall-plug interfaces 110, and a wide variety of intelligent, multi-sensing, network-connected appliances 112, including refrigerators, televisions, washers, dryers, lights, audio systems, intercom systems, mechanical actuators, wall air conditioners, pool-heating units, irrigation systems, and many other types of intelligent appliances and systems.

In general, intelligent controllers include one or more different types of sensors, one or more controllers and/or actuators, and one or more communications interfaces that connect the intelligent controllers to other intelligent controllers, routers, bridges, and hubs within a local smart-home environment, various different types of local computer systems, and to the Internet, through which a intelligent controller may communicate with cloud-computing servers and other remote computing systems. Data communications are generally carried out using any of a large variety of different types of communications media and protocols, including wireless protocols, such as Wi-Fi, ZigBee, 6LoWPAN, various types of wired protocols, including CAT6 Ethernet, HomePlug, and other such wired protocols, and various other types of communications protocols and technologies. Intelligent controllers may themselves operate as intermediate communications devices, such as repeaters, for other intelligent controllers. The smart-home environment may additionally include a variety of different types of legacy appliances and devices 140 and 142 which lack communications interfaces and processor-based controllers.

Figure 2:
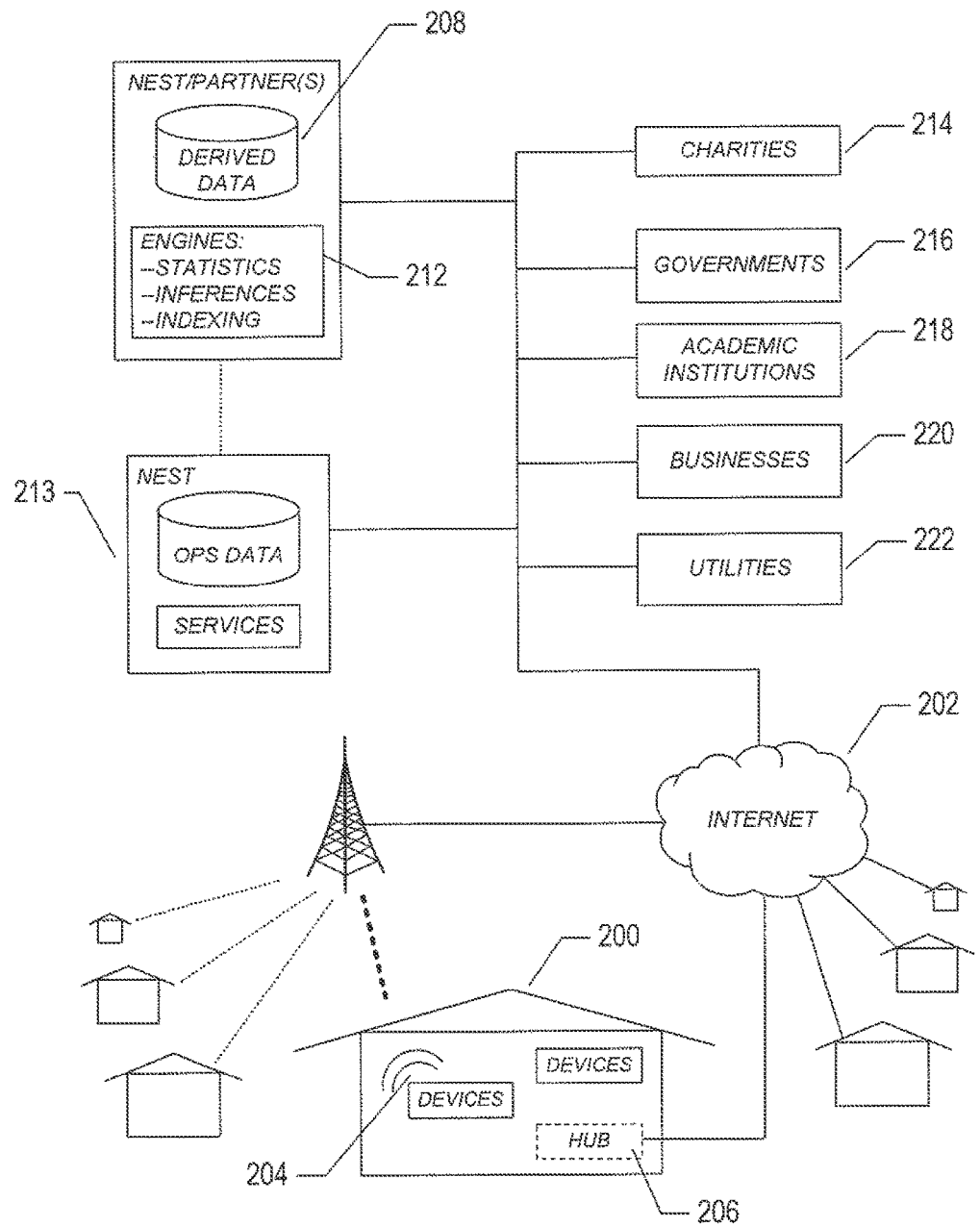
FIG. 2 illustrates integration of intelligent controllers with remote devices and systems according to some embodiments.

FIG. 2 illustrates integration of intelligent controllers with remote devices and systems. Intelligent controllers within a smart-home environment 200 can communicate through the Internet 202 via 3G/4G wireless communications 204, through a hubbed network 206, or by other communications interfaces and protocols. Many different types of smart-home-related data, and data derived from smart-home data 208, can be stored in, and retrieved from, a remote system 210, including a cloud-based remote system. The remote system 210 may include various types of statistics, inference, and indexing engines 212 for data processing and derivation of additional information and rules related to the smart-home environment. The stored data can be exposed, via one or more communications media and protocols, in part or in whole, to various remote systems and organizations, including charities 214, governments 216, academic institutions 218, businesses 220, and utilities 222. In general, the remote data-processing system 210 is managed or operated by an organization or vendor related to intelligent controllers or contracted for remote data-processing and other services by a homeowner, landlord, dweller, or other smart-home-associated user. The data may also be further processed by additional commercial-entity data-processing systems 213 on behalf of the smart-homeowner or manager and/or the commercial entity or vendor which operates the remote data-processing system 210. Thus, external entities 210 and 213 may collect, process, and expose information collected by intelligent controllers within a smart-home environment, may process the information to produce various types of derived results which may be communicated to, and shared with, other remote entities 214, 216, 218, 220, and 222, and may participate in monitoring and control of intelligent controllers within the smart-home environment as well as monitoring and control of the smart-home environment. Of course, in many cases, export of information from within the smart-home environment to remote entities may be strictly controlled and constrained, using encryption, access rights, authentication, and other well-known techniques, to ensure that information deemed confidential by the smart-home manager and/or by the remote data-processing system is not intentionally or unintentionally made available to additional external computing facilities, entities, organizations, and individuals.

Figure 3:
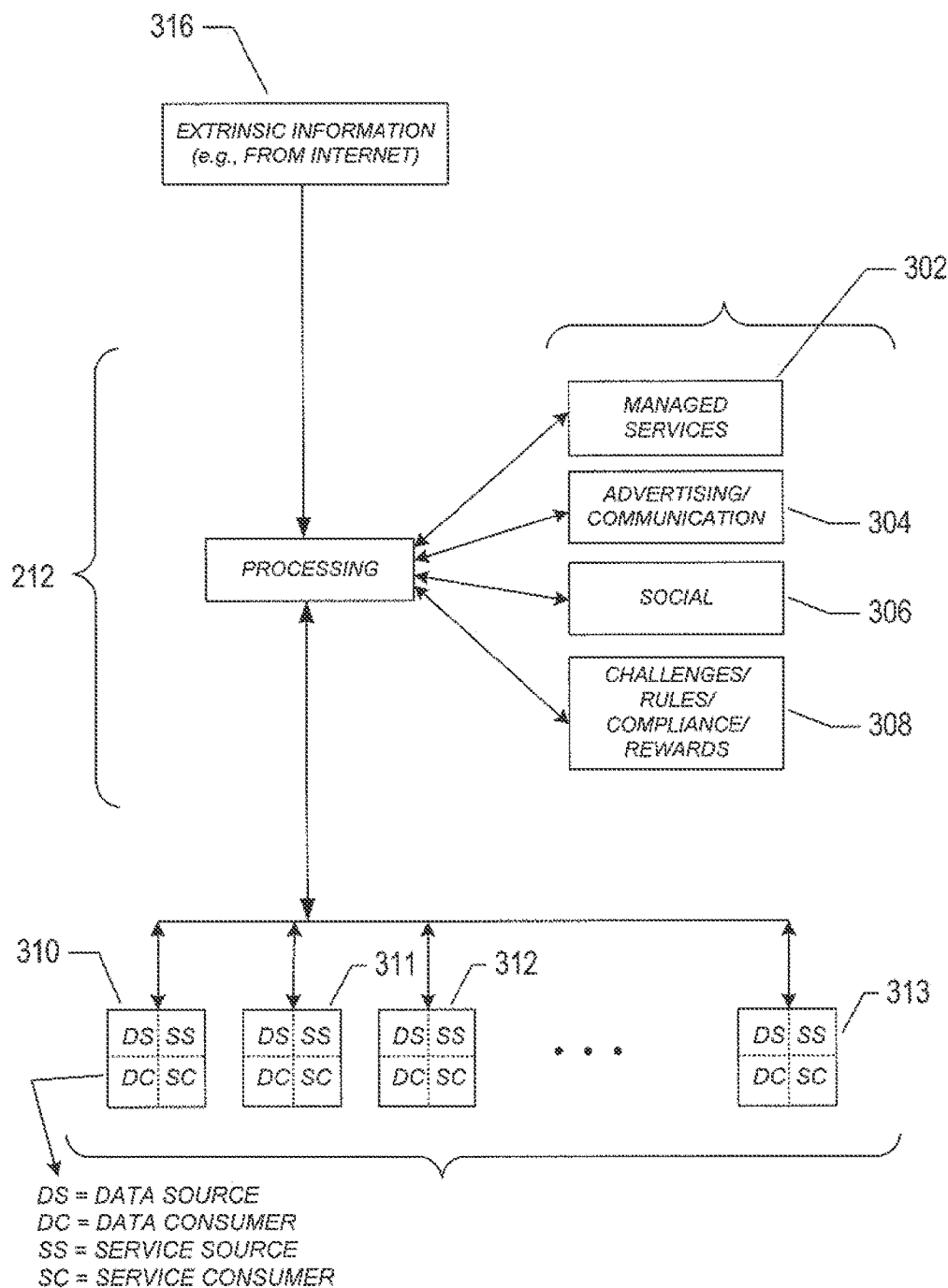
FIG. 3 illustrates information processing within the environment of intercommunicating entities illustrated in FIG. 2, according to some embodiments.

FIG. 3 illustrates information processing within the environment of intercommunicating entities illustrated in FIG. 2. The various processing engines 212 within the external data-processing system 210 can process data with respect to a variety of different goals, including provision of managed services 302, various types of advertizing and communications 304, social-networking exchanges and other electronic social communications 306, and for various types of monitoring and rule-generation activities 308. The various processing engines 212 communicate directly or indirectly with intelligent controllers 310-313, each of which may have data-consumer ("DC"), data-source ("DS"), services-consumer ("SC"), and services-source ("SS") characteristics. In addition, the processing engines may access various other types of external information 316, including information obtained through the Internet, various remote information sources, and even remote sensor, audio, and video feeds and sources.

Automated Schedule Learning

Figure 4:
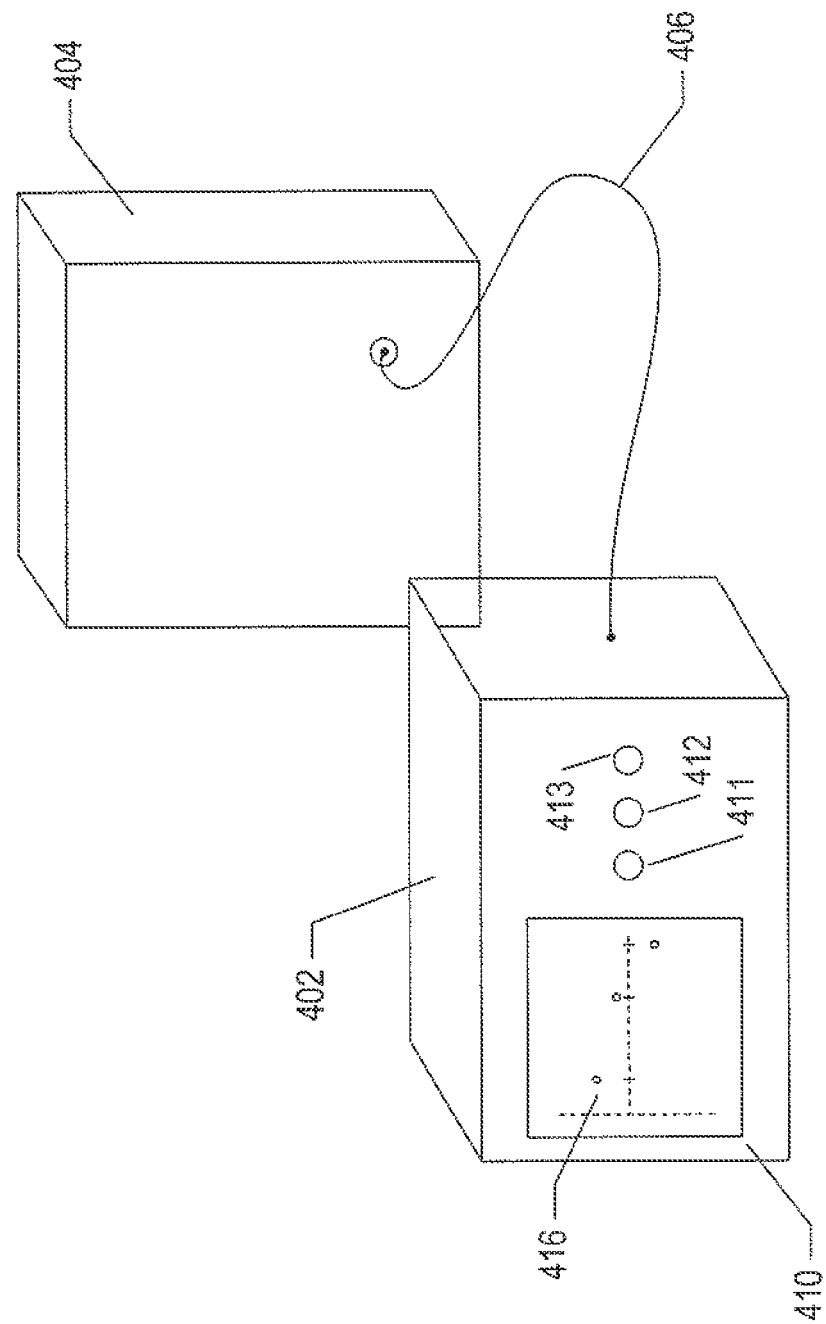
FIG. 4 illustrates a general class of intelligent controllers, according to some embodiments.

FIG. 4 illustrates a general class of intelligent controllers. The intelligent controller 402 controls a controlled entity 404, such as a device, machine, system, or organization 404, via any of various different types of output control signals and receives information about the controlled entity and the environment from sensor output received by the intelligent controller 402 from sensors embedded within the controlled entity 404, the intelligent controller 402, or in the environment of the intelligent controller 402 and/or controlled entity 404. In FIG. 4, the intelligent controller 402 is shown connected to the controlled entity 404 via a wire or fiber-based communications medium 406. However, the intelligent controller 402 may be interconnected with the controlled entity by alternative types of communications media and communications protocols, including wireless communications. In many cases, the intelligent controller 402 and controlled entity 404 may be implemented and packaged together as a single system that includes both the intelligent controller and the controlled entity. The controlled entity 404 may include multiple devices, machines, system, or organizations and the intelligent controller 402 may itself be distributed among multiple components and discrete devices and systems. In addition to outputting control signals to controlled entities and receiving sensor input, the intelligent controller 402 also provides a user interface 410-413 through which a human user or remote entity, including a user-operated processing device or a remote automated control system, can input immediate-control inputs to the intelligent controller 402 as well as create and modify various types of control schedules. In FIG. 4, the intelligent controller 402 provides a graphical-display component 410 that displays a control schedule 416 and includes a number of input components 411-413 that provide a user interface for input of immediate-control directives to the intelligent controller for controlling the controlled entity 404 or entities and input of scheduling-interface commands that control display of one or more control schedules, creation of control schedules, and modification of control schedules.

To summarize, the general class of intelligent controllers receive sensor input, output control signals to one or more controlled entities, and provide a user interface that allows users to input immediate-control command inputs to the intelligent controller for translation by the intelligent controller into output control signals as well as to create and modify one or more control schedules that specify desired controlled-entity operational behavior over one or more time periods. These basic functionalities and features of the general class of intelligent controllers provide a basis upon which automated control-schedule learning, to which the current application is directed, can be implemented.

Figure 5:
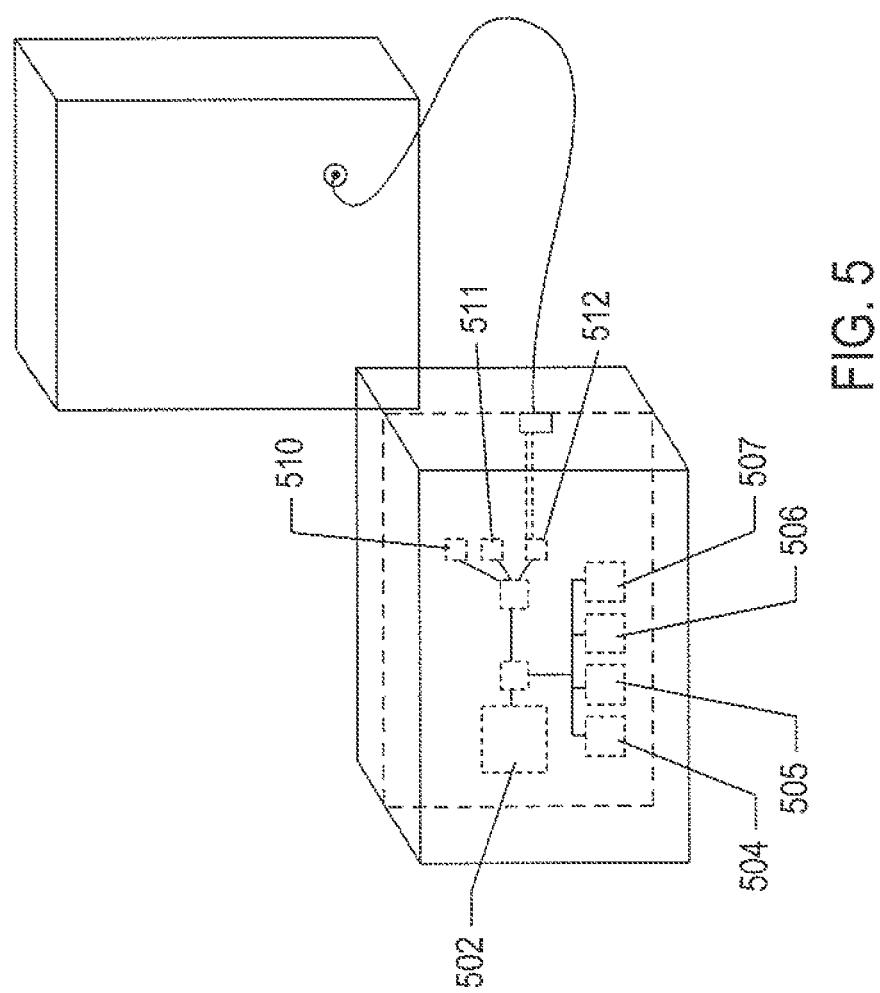
FIG. 5 illustrates additional internal features of an intelligent controller, according to some embodiments.

FIG. 5 illustrates additional internal features of an intelligent controller. An intelligent controller is generally implemented using one or more processors 502, electronic memory 504-507, and various types of microcontrollers 510-512, including a microcontroller 512 and transceiver 514 that together implement a communications port that allows the intelligent controller to exchange data and commands with one or more entities controlled by the intelligent controller, with other intelligent controllers, and with various remote computing facilities, including cloud-computing facilities through cloud-computing servers. Often, an intelligent controller includes multiple different communications ports and interfaces for communicating by various different protocols through different types of communications media. It is common for intelligent controllers, for example, to use wireless communications to communicate with other wireless-enabled intelligent controllers within an environment and with mobile-communications carriers as well as any of various wired communications protocols and media. In certain cases, an intelligent controller may use only a single type of communications protocol, particularly when packaged together with the controlled entities as a single system. Electronic memories within an intelligent controller may include both volatile and non-volatile memories, with low-latency, high-speed volatile memories facilitating execution of machine-readable control routines by the one or more processors and slower, non-volatile memories storing machine-readable control routines and data that need to survive power-on/power-off cycles. Certain types of intelligent controllers may additionally include mass-storage devices.

Figure 6:
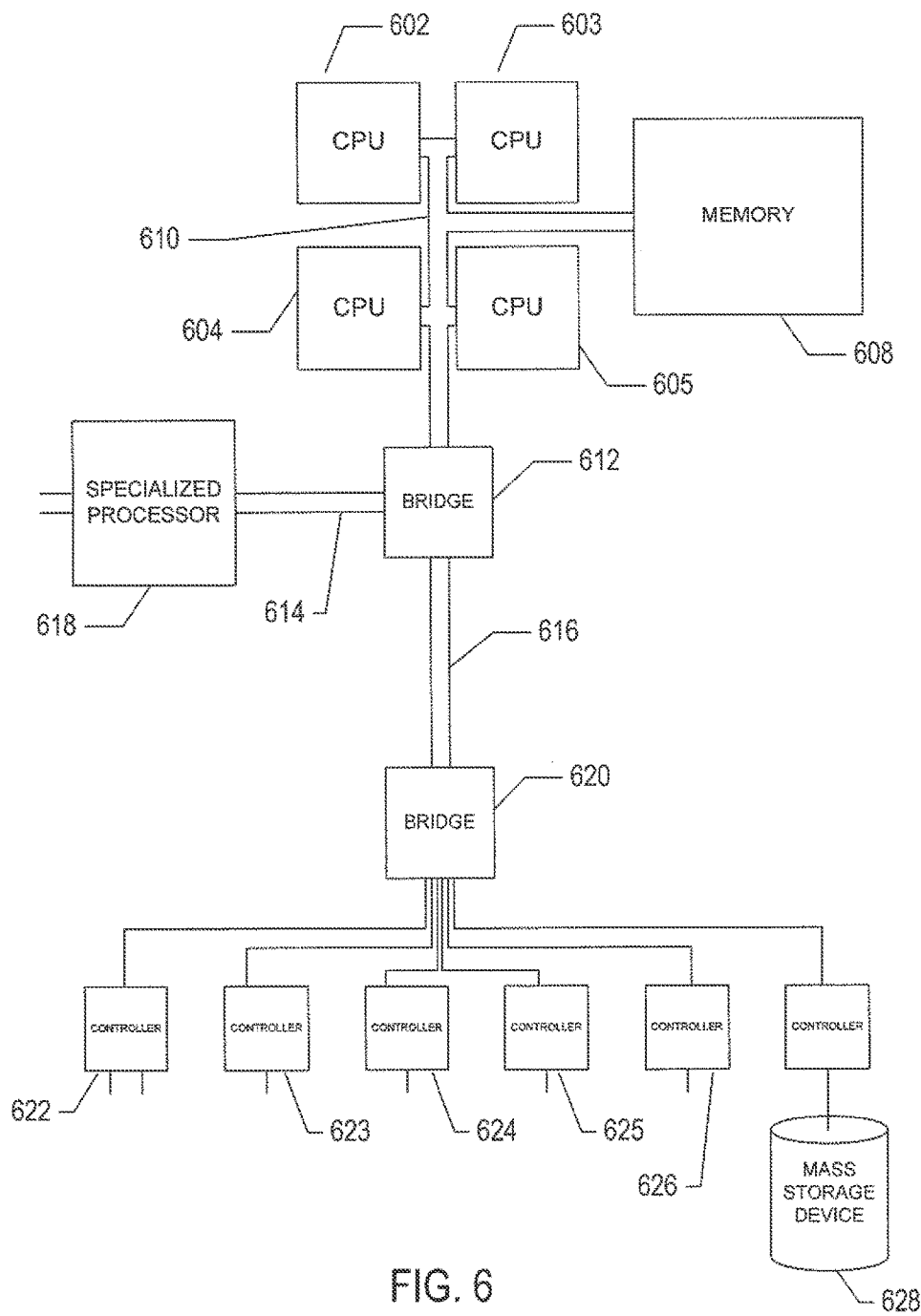
FIG. 6 illustrates a generalized computer architecture that represents an example of the type of computing machinery that may be included in an intelligent controller, server computer, and other processor-based intelligent controllers and cloud-based systems, according to some embodiments.

FIG. 6 illustrates a generalized computer architecture that represents an example of the type of computing machinery that may be included in an intelligent controller, server computer, and other processor-based intelligent controllers and cloud-based systems. The computing machinery includes one or multiple central processing units ("CPUs") 602-605, one or more electronic memories 608 interconnected with the CPUs by a CPU/memory-subsystem bus 610 or multiple busses, a first bridge 612 that interconnects the CPU/memory-subsystem bus 610 with additional busses 614 and 616 and/or other types of high-speed interconnection media, including multiple, high-speed serial interconnects. These busses and/or serial interconnections, in turn, connect the CPUs and memory with specialized processors, such as a graphics processor 618, and with one or more additional bridges 620, which are interconnected with high-speed serial links or with multiple controllers 622-627, such as controller 627, that provide access to various different types of mass-storage devices 628, electronic displays, input devices, and other such components, subcomponents, and computational resources.

Figure 7:
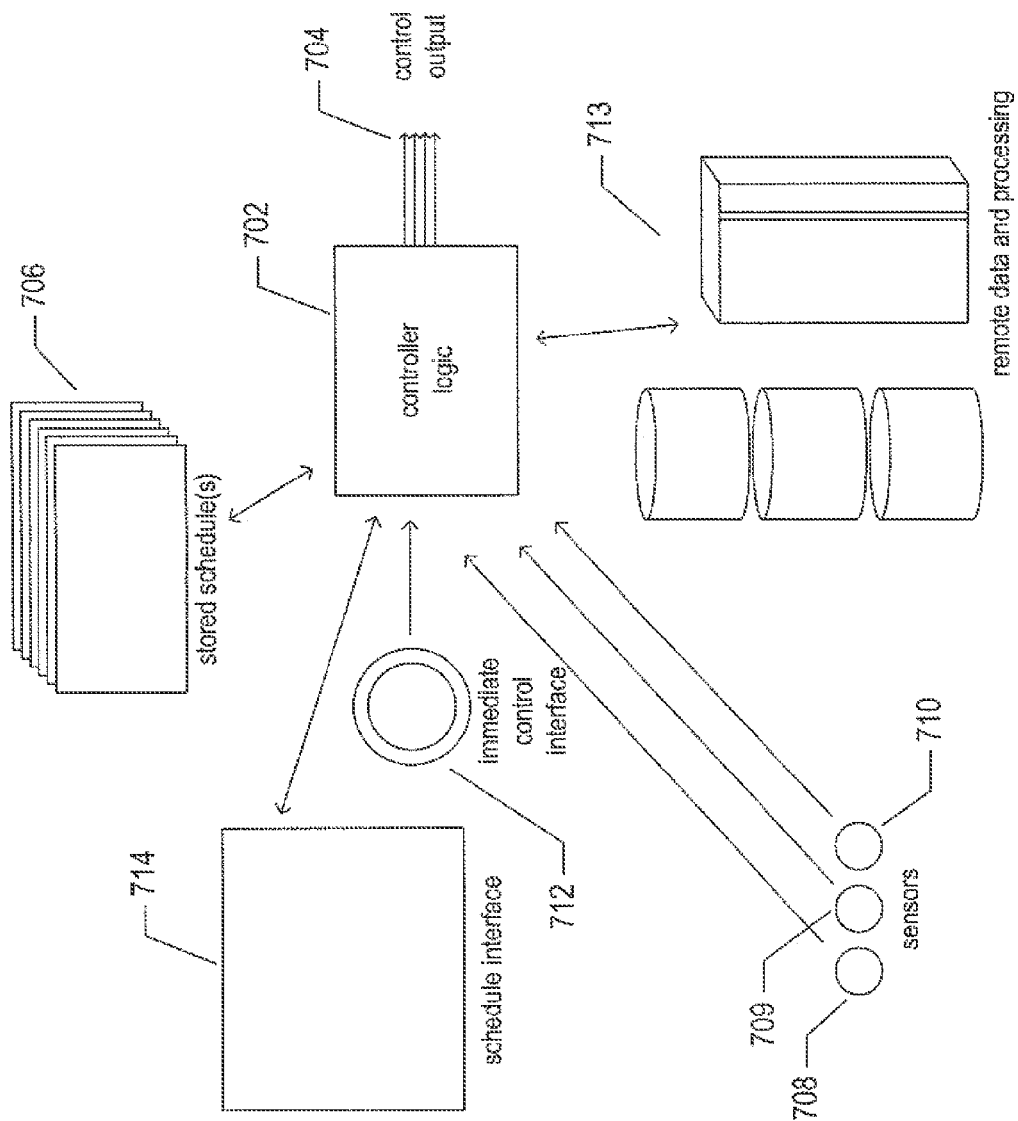
FIG. 7 illustrates features and characteristics of an intelligent controller of the general class of intelligent controllers, according to some embodiments.

FIG. 7 illustrates features and characteristics of an intelligent controller of the general class of intelligent controllers. An intelligent controller includes controller logic 702 generally implemented as electronic circuitry and processor-based computational components controlled by computer instructions stored in physical data-storage components, including various types of electronic memory and/or mass-storage devices. It should be noted, at the onset, that computer instructions are machine-readable instructions stored in physical data-storage devices and executed within processors comprise the control components of a wide variety of modern devices, machines, and systems, and are as tangible, physical, and real as any other component of a device, machine, or system. Occasionally, statements are encountered that suggest that computer-instruction-implemented control logic is "merely software" or something abstract and less tangible than physical machine components. Those familiar with modern science and technology understand that this is not the case. Computer instructions executed by processors are physical entities stored in physical devices. Otherwise, the processors would not be able to access and execute the instructions. The term "software" can be applied to a symbolic representation of a program or routine, such as a printout or displayed list of programming-language statements, but such symbolic representations of computer programs are not executed by processors. Instead, processors fetch and execute computer instructions stored in physical states within physical data-storage devices.

The controller logic 702 accesses and uses a variety of different types of stored information and inputs in order to generate output control signals 704 that control the operational behavior of one or more controlled entities. The information used by the controller logic may include one or more stored control schedules 706, received output from one or more sensors 708-710, immediate control inputs received through an immediate-control interface 712, and data, commands, and other information received from remote data-processing systems, including cloud-based data-processing systems 713. In addition to generating control output 704, the controller logic 702 provides an interface 714 that allows users to create and modify control schedules and may also output data and information to remote entities, other intelligent controllers, and to users through an information-output interface.

Figure 8:
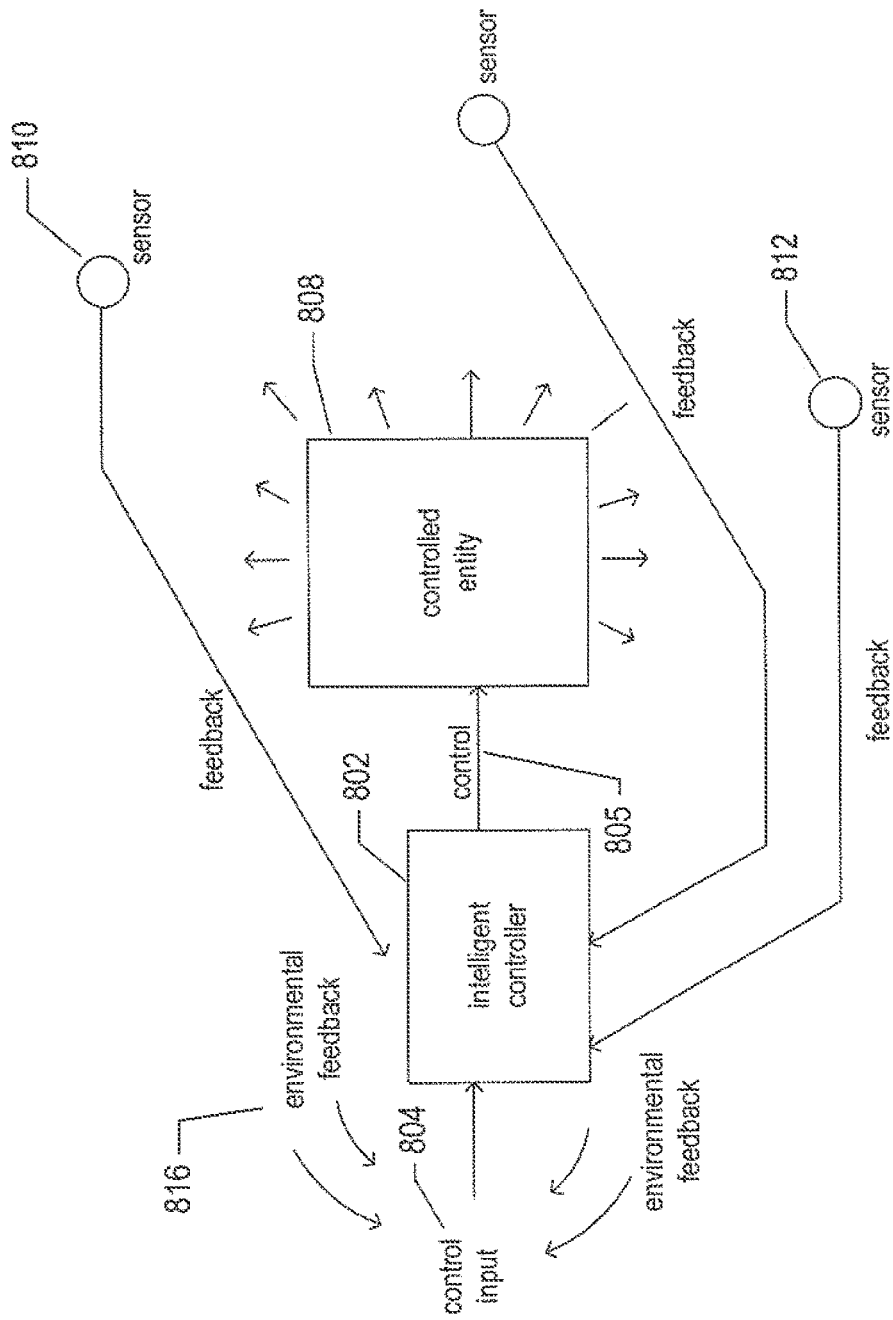
FIG. 8 illustrates a typical control environment within which an intelligent controller operates, according to some embodiments.

FIG. 8 illustrates a typical control environment within which an intelligent controller operates. As discussed above, an intelligent controller 802 receives control inputs from users or other entities 804 and uses the control inputs, along with stored control schedules and other information, to generate output control signals 805 that control operation of one or more controlled entities 808. Operation of the controlled entities may alter an environment within which sensors 810-812 are embedded. The sensors return sensor output, or feedback, to the intelligent controller 802. Based on this feedback, the intelligent controller 802 modifies the output control signals 805 in order to achieve a specified goal or goals for controlled-system operation. In essence, an intelligent controller modifies the output control signals according to two different feedback loops. The first, most direct feedback loop includes output from sensors that the controller can use to determine subsequent output control signals or control-output modification in order to achieve the desired goal for controlled-system operation. In many cases, a second feedback loop involves environmental or other feedback 816 to users which, in turn, elicits subsequent user control and scheduling inputs to the intelligent controller 802. In other words, users can either be viewed as another type of sensor that outputs immediate-control directives and control-schedule changes, rather than raw sensor output, or can be viewed as a component of a higher-level feedback loop.

Figure 9:
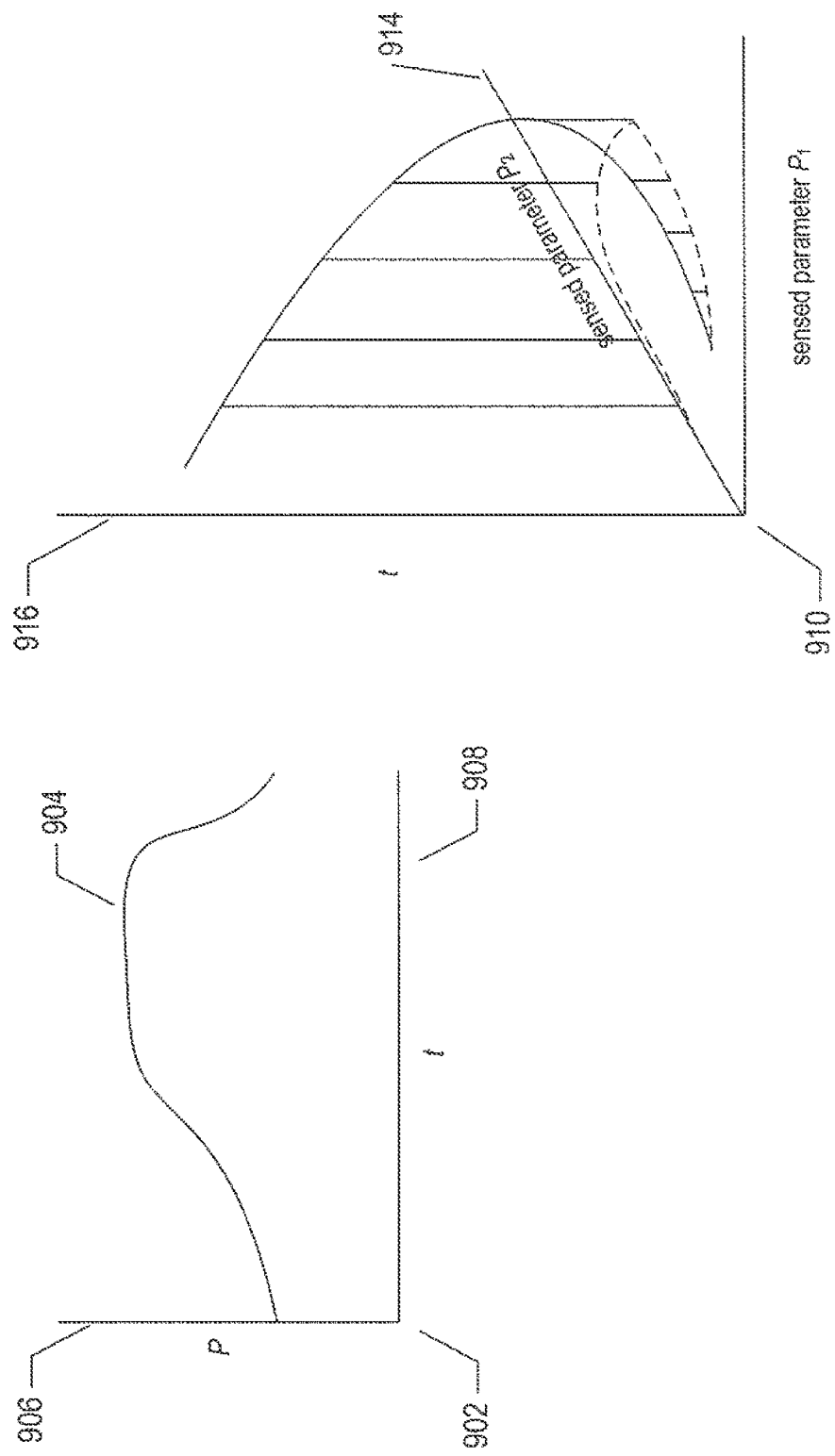
FIG. 9 illustrates the general characteristics of sensor output, according to some embodiments.

There are many different types of sensors and sensor output. In general, sensor output is directly or indirectly related to some type of parameter, machine state, organization state, computational state, or physical environmental parameter. FIG. 9 illustrates the general characteristics of sensor output. As shown in a first plot 902 in FIG. 9, a sensor may output a signal, represented by curve 904, over time t, with the signal directly or indirectly related to a parameter P, plotted with respect to the vertical axis 906. The sensor may output a signal continuously or at intervals, with the time of output plotted with respect to the horizontal axis 908. In certain cases, sensor output may be related to two or more parameters. For example, in plot 910, a sensor outputs values directly or indirectly related to two different parameters $P_1$ and $P_2$, plotted with respect to axes 912 and 914, respectively, over time, plotted with respect to vertical axis 916. In the following discussion, for simplicity of illustration and discussion, it is assumed that sensors produce output directly or indirectly related to a single parameter, as in plot 902 in FIG. 9. In the following discussion, the sensor output is assumed to be a set of parameter values for a parameter P. The parameter may be related to environmental conditions, such as temperature, ambient light level, sound level, and other such characteristics. However, the parameter may also be the position or positions of machine components, the data states of memory-storage address in data-storage devices, the current drawn from a power supply, the flow rate of a gas or fluid, the pressure of a gas or fluid, and many other types of parameters that comprise useful information for control purposes.

Figure 10A:
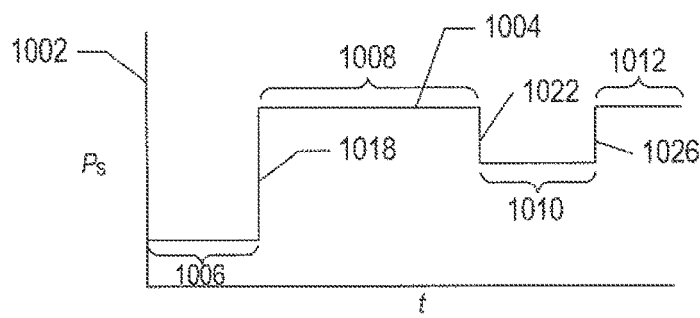
FIGS. 10A-10D illustrate information processed and generated by an intelligent controller during control operations, according to some embodiments.

FIGS. 10A-10D illustrate information processed and generated by an intelligent controller during control operations. All the figures show plots, similar to plot 902 in FIG. 9, in which values of a parameter or another set of control-related values are plotted with respect to a vertical axis and time is plotted with respect to a horizontal axis. FIG. 10A shows an idealized specification for the results of controlled-entity operation. The vertical axis 1002 in FIG. 10A represents a specified parameter value, $P_s$. For example, in the case of an intelligent thermostat, the specified parameter value may be temperature. For an irrigation system, by contrast, the specified parameter value may be flow rate. FIG. 10A is the plot of a continuous curve 1004 that represents desired parameter values, over time, that an intelligent controller is directed to achieve through control of one or more devices, machines, or systems. The specification indicates that the parameter value is desired to be initially low 1006, then rise to a relatively high value 1008, then subside to an intermediate value 1010, and then again rise to a higher value 1012. A control specification can be visually displayed to a user, as one example, as a control schedule.

Figure 10B:
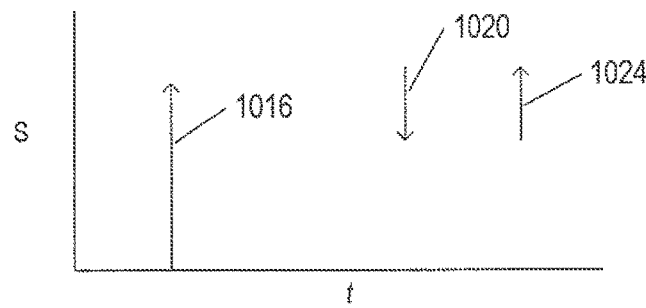

FIG. 10B shows an alternate view, or an encoded-data view, of a control schedule corresponding to the control specification illustrated in FIG. 10A. The control schedule includes indications of a parameter-value increase 1016 corresponding to edge 1018 in FIG. 10A, a parameter-value decrease 1020 corresponding to edge 1022 in FIG. 10A, and a parameter-value increase 1024 corresponding to edge 1026 in FIG. 10A. The directional arrows plotted in FIG. 10B can be considered to be setpoints, or indications of desired parameter changes at particular points in time within some period of time.

The control schedules learned by an intelligent controller represent a significant component of the results of automated learning. The learned control schedules may be encoded in various different ways and stored in electronic memories or mass-storage devices within the intelligent controller, within the system controlled by the intelligent controller, or within remote data-storage facilities, including cloud-computing-based data-storage facilities. In many cases, the learned control schedules may be encoded and stored in multiple locations, including control schedules distributed among internal intelligent-controller memory and remote data-storage facilities. A setpoint change may be stored as a record with multiple fields, including fields that indicate whether the setpoint change is a system-generated setpoint or a user-generated setpoint, whether the setpoint change is an immediate-control-input setpoint change or a scheduled setpoint change, the time and date of creation of the setpoint change, the time and date of the last edit of the setpoint change, and other such fields. In addition, a setpoint may be associated with two or more parameter values. As one example, a range setpoint may indicate a range of parameter values within which the intelligent controller should maintain a controlled environment. Setpoint changes are often referred to as "setpoints."

Figure 10C:
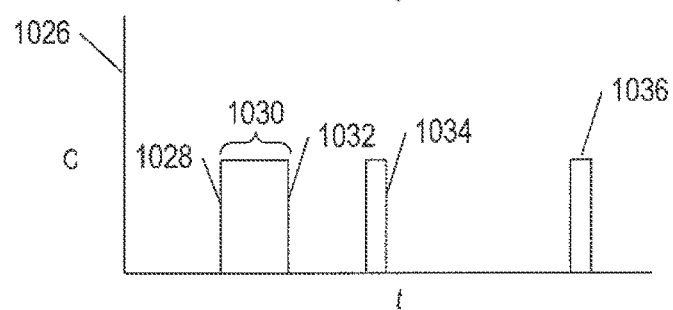

FIG. 10C illustrates a control output by an intelligent controller that might result from the control schedule illustrated in FIG. 10B. In this figure, the magnitude of an output control signal S is plotted with respect to the vertical axis 1026. For example, the control output may be a voltage signal output by an intelligent thermostat to a heating unit, with a high-voltage signal indicating that the heating unit should be currently operating and a low-voltage output indicating that the heating system should not be operating. Edge 1028 in FIG. 10C corresponds to setpoint 1016 in FIG. 10B. The width of the positive control output 1030 may be related to the length, or magnitude, of the desired parameter-value change, indicated by the length of setpoint arrow 1016. When the desired parameter value is obtained, the intelligent controller discontinues output of a high-voltage signal, as represented by edge 1032. Similar positive output control signals 1034 and 1036 are elicited by setpoints 1020 and 1024 in FIG. 10B.

Figure 10D:
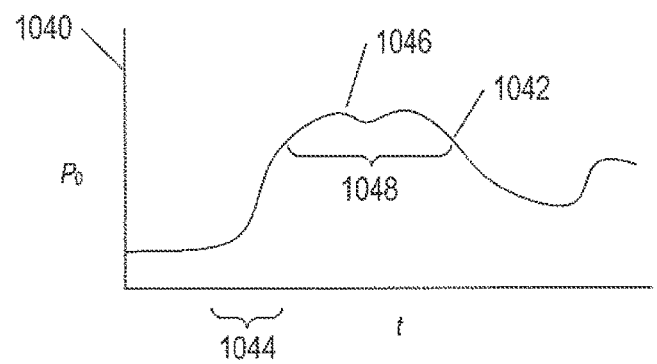

Finally, FIG. 10D illustrates the observed parameter changes, as indicated by sensor output, resulting from control, by the intelligent controller, of one or more controlled entities. In FIG. 10D, the sensor output, directly or indirectly related to the parameter $P_O$, is plotted with respect to the vertical axis 1040. The observed parameter value is represented by a smooth, continuous curve 1042. Although this continuous curve can be seen to be related to the initial specification curve, plotted in FIG. 10A, the observed curve does not exactly match that specification curve. First, it may take a finite period of time 1044 for the controlled entity to achieve the parameter-valued change represented by setpoint 1016 in the control schedule plotted in FIG. 10B. Also, once the parameter value is obtained, and the controlled entity directed to discontinue operation, the parameter value may begin to fall 1046, resulting in a feedback-initiated control output to resume operation of the controlled entity in order to maintain the desired parameter value. Thus, the desired high-level constant parameter value 1008 in FIG. 10A may, in actuality, end up as a time-varying curve 1048 that does not exactly correspond to the control specification 1004. The first level of feedback, discussed above with reference to FIG. 8, is used by the intelligent controller to control one or more control entities so that the observed parameter value, over time, as illustrated in FIG. 10D, matches the specified time behavior of the parameter in FIG. 10A as closely as possible. The second level feedback control loop, discussed above with reference to FIG. 8, may involve alteration of the control specification, illustrated in FIG. 10A, by a user, over time, either by changes to stored control schedules or by input of immediate-control directives, in order to generate a modified control specification that produces a parameter-value/time curve reflective of a user's desired operational results.

There are many types of controlled entities and associated intelligent controllers. In certain cases, control output may include both an indication of whether the controlled entity should be currently operational as well as an indication of a level, throughput, or output of operation when the controlled entity is operational. In other cases, the control output may be simply a binary activation/deactivation signal. For simplicity of illustration and discussion, the latter type of control output is assumed in the following discussion.

Methods for Generating Virtual Smart-Meter Data Based on Intelligent Controller Collected Data A smart meter is a meter that records smart-meter data corresponding to consumption of utilities or services provided by a utility company in intervals of time and communicates smart-meter data back to the utility company for monitoring and billing purposes. In the following description the terms "utility" and "service" are used inter-changeably and both terms are used to refer to natural gas, electricity, or water or any other service provided by a utility company. Smart meters enable two-way communication between the smart meter and the utility company or public utility. Examples of smart meters include smart electricity meters that measure electricity consumption, smart gas meters that measure natural gas consumption, and smart water meters that measure water consumption. Unlike home energy monitors, smart meters can gather smart-meter data for remote reporting and are capable of two-way communications between the smart meter and the utility company. Smart meters are also different from other types of meters, such as interval or time-of-use meters, because smart meters collect real-time or near real-time sensor data, provide service outage notifications, and provide service quality monitoring. Because smart meters provide a way of measuring utility consumption in intervals of time, utilities are able to introduce different prices based on the time of day and season. Smart meters also provide a number of potential benefits to households by enabling smart-meter users to estimate bills based on consumption and may also help users better manage their energy use by providing up-to-date information on the cost of gas, water, and electricity consumption in the currency of the customer's country.

Figure 11:
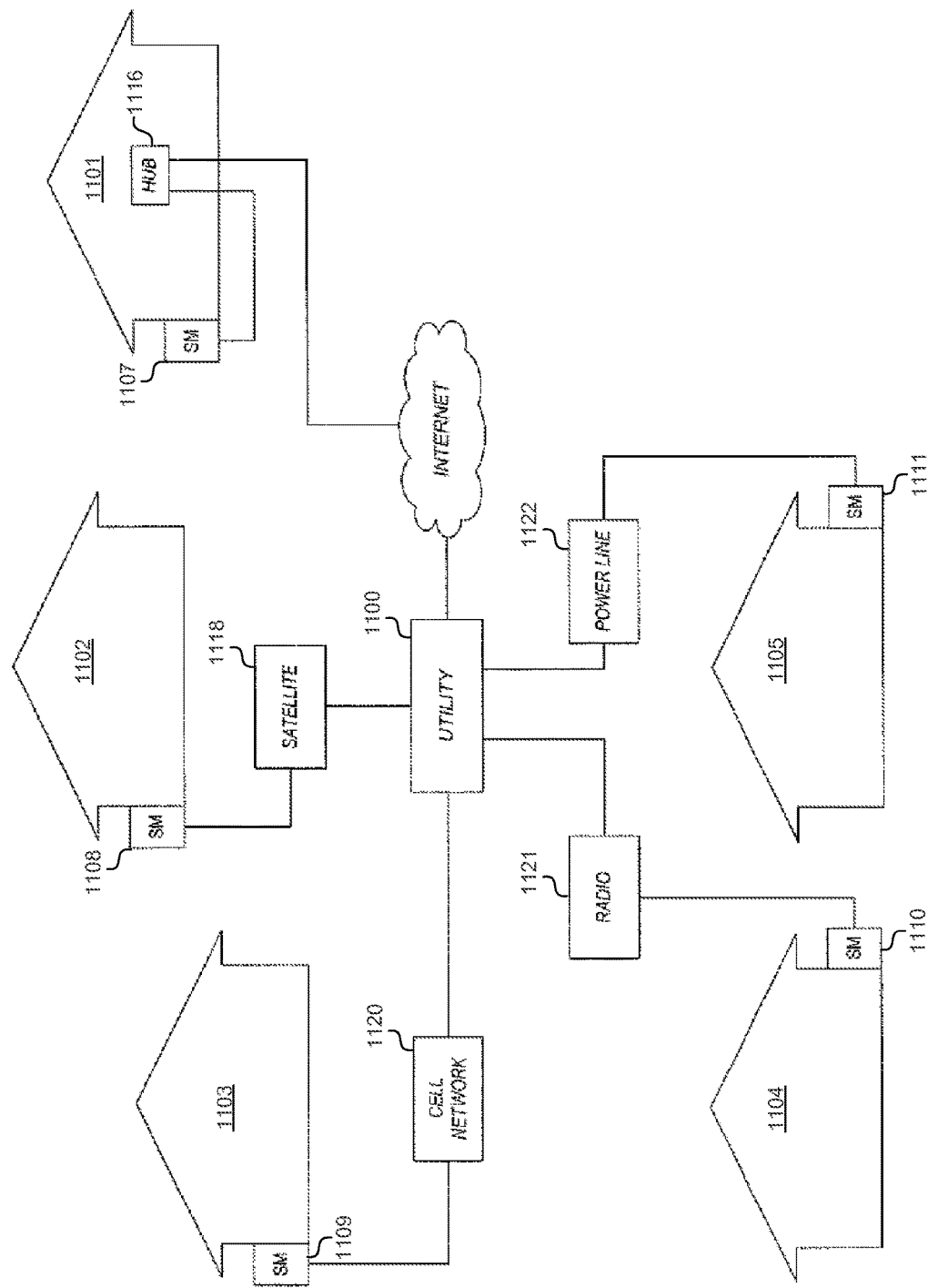
FIG. 11 illustrates examples of different communication media smart meters can use to communicate with a utility company, according to some embodiments.

Smart meters can be equipped with any one of a number of different media for two-way communication with a utility company. Each smart meter is able to reliably and securely communicate smart-meter data back to a utility company and receive operating instructions from the utility company. FIG. 11 illustrates examples of different communication media smart meters can use to communicate with a utility company 1100. In FIG. 11, each of the smart homes 1101-1105 includes one of six smart meters 1107-1111 that records smart-meter data associated with electricity consumption, water consumption, or natural gas consumption. For example, the smart meters 1107-1111 can be smart electricity meters that record the amount of electricity the smart homes 1101-1105 consume per interval of time. In the example of FIG. 11, each of the smart meters 1107-1111 uses a different communication medium to transmit smart-meter data to the utility company 1100 and receive instructions from the utility company 1100. Smart meter 1107 is connected to the Internet 1114 via a hubbed network 1116, such as Wi-Fi, Ethernet, or any other Internet related network connection. The smart meter 1107 communicates with the utility company 1100 via the Internet 1114 and the hub 1116 located in the smart home 1101. Smart meter 1108 communicates with the utility company 1100 using communication satellites 1118. Smart meter 1109 communicates with the utility company 1100 using mobile communications technologies 1120, such as 3G/4G wireless communications. Smart meter 1110 communicates with the utility company 1100 using licensed radio or a combination of licensed and unlicensed radio 1121. Finally, smart meter 1111 communicates with the utility company 1100 using power-line communication 1122, which is a technique for transmitting data on a conductor that is also used to simultaneously carry electricity to the smart home 1105.

The smart meters 1107-1111 can use any one of a number of different communications protocols. For example, ANSI C12.18 is an ANSI standard protocol used for two-way communications with a smart meter. ANSI C12.19 specifies the data tables to be used, and ANSI C12.21 is an extension of C12.18 written for modem communications. Other communication protocols, such as those set by the International Electrotechnical Commission digital formats can be used, such as IEC 61107 and IEC 62056. The Open Smart Grid Protocol is a family of specifications published by the European Telecommunications Standards Institute used in conjunction with the ISO/IEC 14908 control networking standard for smart metering and smart grid applications. In addition, TCP/IP technology can be used as a communication platform for smart meter applications, so that utilities can deploy multiple communication systems, while using IP technology as a common management platform. Other communications protocols include a single, universal connector separating the function of the smart grid device and its communication module.

Figure 12:
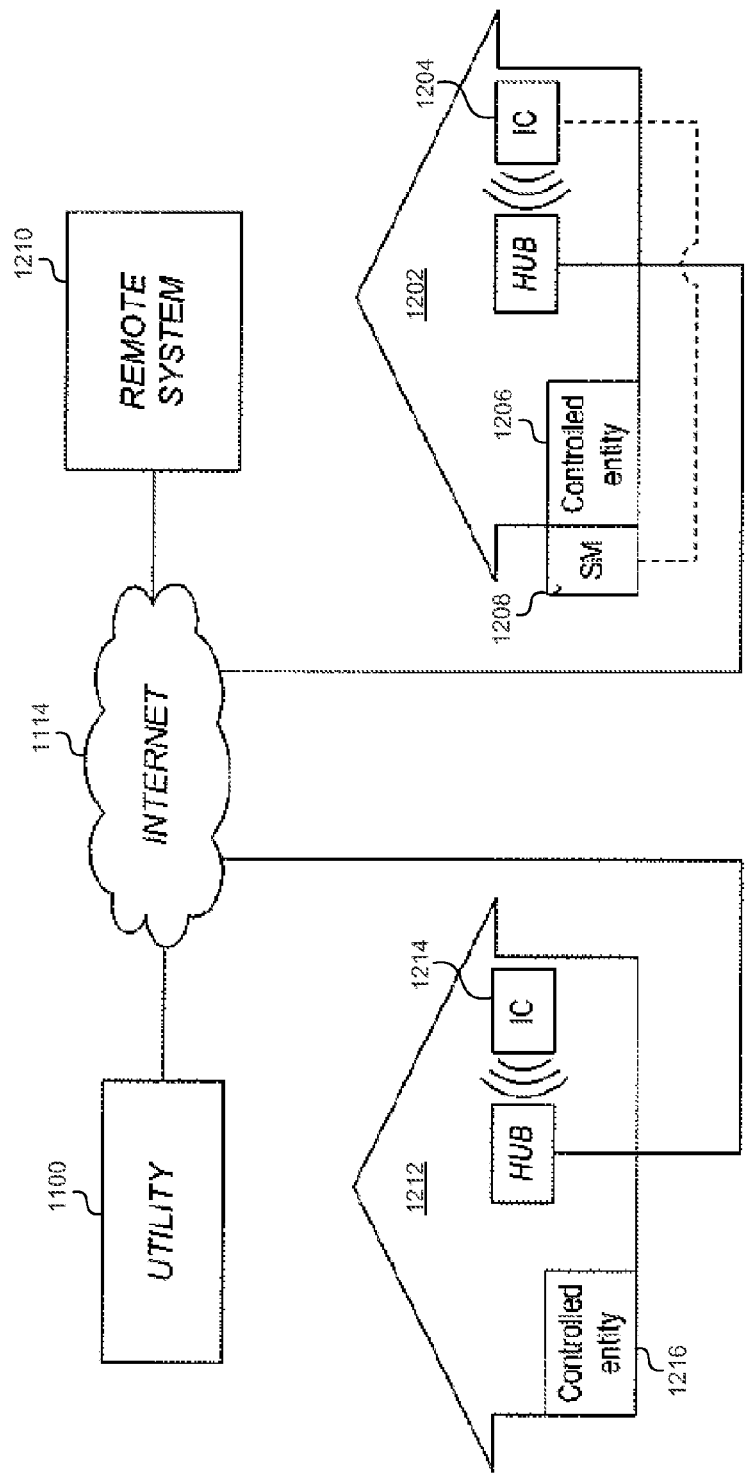
FIG. 12 illustrates a first smart home with an intelligent controller that controls operation of a controlled entity and includes a smart meter, according to some embodiments.

FIG. 12 illustrates a first smart home 1202 with an intelligent controller 1204 that controls operation of a controlled entity 1206 and includes a smart meter 1208. The smart meter 1206 can be in communication with the utility company 1100 using any one or more of the communication techniques described above with reference to FIG. 11. In this example, the intelligent controller 1204 is connected to the Internet 1114 via a network hub 1210 and is in direct communication with the smart meter 1208 so that when the smart meter 1208 transmits recorded smart-meter data to the utility company 1100, the smart meter 1208 also transmits the same recorded smart-meter data to the intelligent controller 1204. The intelligent controller 1204 controls operation of the controlled entity 1206 and generates operational data that is sent along with the smart-meter data to a remote system 1210 via the Internet 1114. Operational data can be raw data collected from the one or more intelligent-controller sensors, control specifications and control schedules input to the intelligent controller 1204 by the intelligent-controller user, and any other data generated by the intelligent controller 1204 in response to the raw data collected by the one or more sensors, control specification and control schedules. The remote system 1210 can represent one or both of the entities 210 and 213 described above with reference to FIG. 2, or represent another cloud-based computer system that processes data provided by the intelligent controller 1204. Because the smart home 1202 includes a smart meter 1206, the smart home 1202 occupant may be able to access the smart-meter data from a user account provided by the utility company, or because the smart meter 1206 sends smart-meter data to the intelligent controller 1204, the intelligent controller 1204 can display the smart-meter data on the intelligent controller 1204 user interface.

Figure 13:
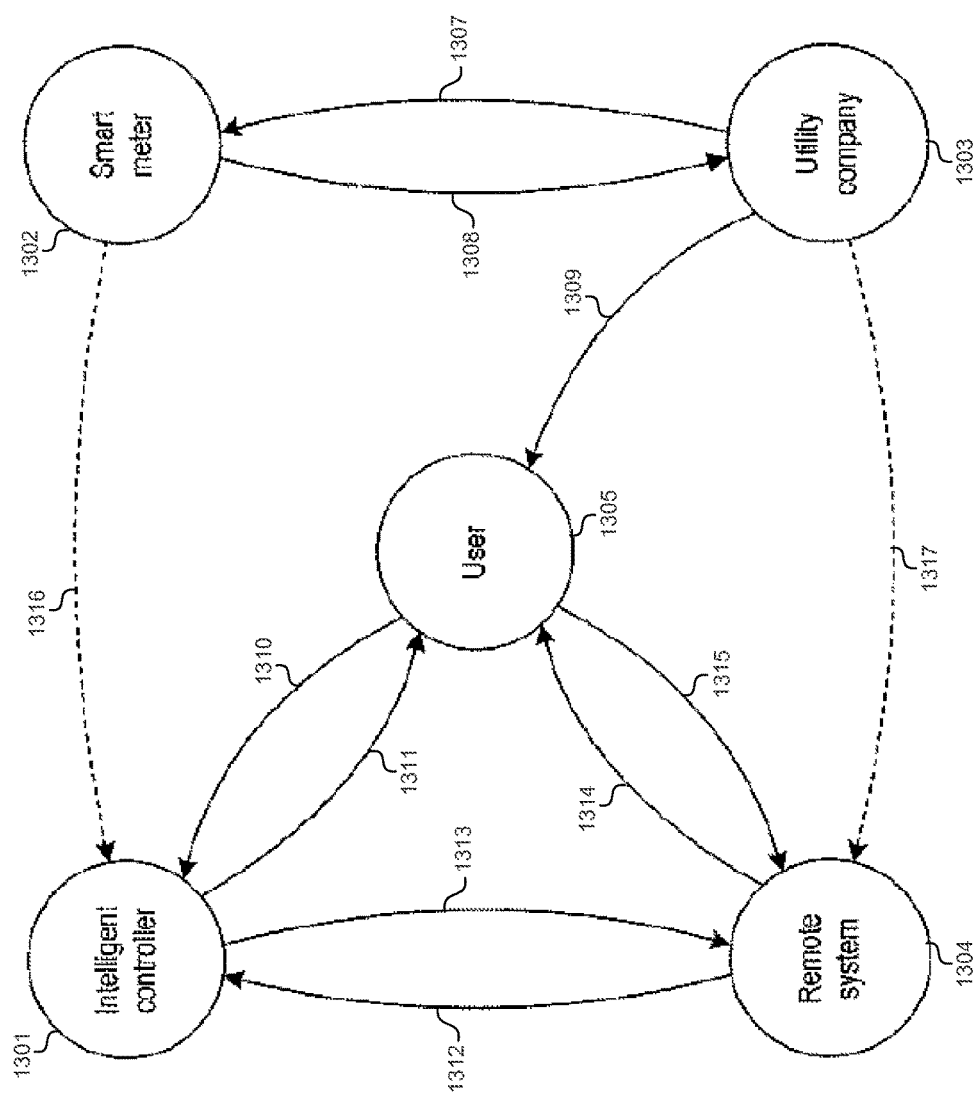
FIG. 13 illustrates various ways in which an intelligent controller, a smart meter, a utility company, a remote system, according to some embodiments.

The remote system 1210 is not limited to receiving smart-meter data from intelligent controllers, as described above with reference to FIG. 11. FIG. 13 illustrates various ways in which an intelligent controller 1301, a smart meter 1302, a utility company 1303, a remote system 1304, and a user 1305 can exchange data. The user 1305 represents an occupant or owner of smart home equipped with the intelligent controller 1301 and the smart meter 1302. Directional arrows 1307-1315 represent communications between the entities. In particular, directional arrows 1307 and 1308 represent communications between the smart meter 1302 and the utility company 1303. The communications can be carried out using any one or the media and protocols described above with reference to FIG. 11. Directional arrow 1309 represents the user's 1305 access to an on-line user interface that enables the user 1305 to access the user's utility company account information and may provide the user access to smart-meter data and may present the user 1305 with time-interval costs based on different time-interval billing rates. Directional arrows 1310 and 1311 represent the intelligent controller 1301 displaying notices from the intelligent controller 1301 to the user 1305 and the intelligent controller 1301 receiving operational settings, such as adjusting a control schedule, from the user 1305. Directional arrows 1312 and 1313 represent the remote system 1304 receiving operational data from the intelligent controller 1301 and the intelligent controller 1301 receiving commands and information from the remote system 1304. Directional arrows 1314 and 1315 represent the remote system 1304 providing the user 1305 access to operational data collected by the intelligent controller 1301 and the user 1305 entering information to the remote system 1304. For example, when the user 1305 purchases and installs the intelligent controller 1301 the user 1305 can register the intelligent controller 1301 with the manufacturer or vendor by providing address information and provide information on the layout of the smart home. Dashed-directional arrows 1316 and 1317 represent ways in which smart-meter data generated by the smart meter 1302 can be retrieved by the remote system 1304. As described above in the example of FIG. 12, the smart meter 1302 can directly transmit smart-meter data to the intelligent controller 1301 when the smart meter 1302 transmits smart-meter data to the utility company 1303, and the remote system 1304 can retrieve the smart-meter data from the intelligent controller 1301. Alternatively, the user 1305 can grant the remote system 1304 access to the user's account with the utility company 1303, enabling the remote system 1304 to retrieve the smart-meter data from the utility company 1303.

Figure 14:
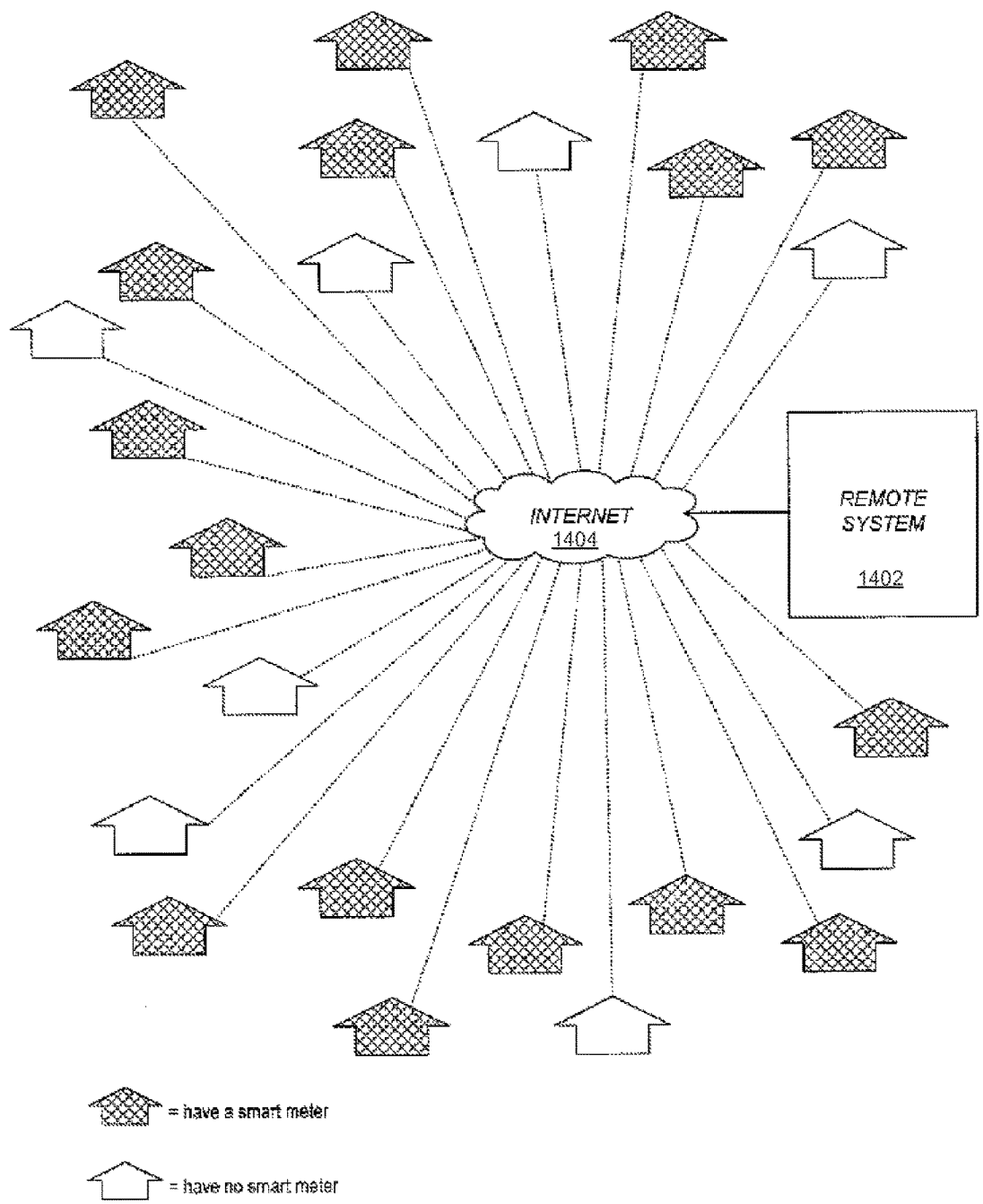
FIG. 14 illustrates a number of smart-home environments with similar intelligent controllers connected to a remote system, according to some embodiments.

Returning to FIG. 12, a second smart home 1212 has an intelligent controller 1214 that controls operation of a controlled entity 1216, but, unlike the first smart home 1202, the second smart home 1212 does not have a smart meter. The intelligent controller 1214 is connected to the Internet 1114 via a network hub 1210 and sends operational data to the remote system 1210. Methods and systems described below are directed to using operational data and smart-meter data collected from a number of smart homes that have smart meters and similar intelligent controllers to formulate a mathematical-based model that can be used to generate virtual smart-meter data from operational data provided by intelligent controllers in smart homes that do not have smart meters, such as the smart home 1212. In particular, FIG. 14 illustrates a number of smart-home environments with similar intelligent controllers connected to a remote system 1402 via the Internet 1404, as described above with reference to FIG. 2. The phrase "similar intelligent controllers" refers to intelligent controllers that have common features, operation, and produce the same kind of operational data. For example, intelligent thermostats are an example of similar intelligent controllers, intelligent hazard-detection units are also an example of similar intelligent controllers, and smart switches are another example of similar intelligent controllers. Shading represents smart homes that have an intelligent controller and a smart meter, and unshaded smart homes have an intelligent controller but do not have a smart meter. Operational data and smart-meter data associated with the shaded smart homes equipped with intelligent controllers and smart meters is collected by the remote system 1402. The operational data and smart-meter data collected from the smart homes with intelligent controllers and smart meters is used to formulate a mathematical model that can, in turn, be used to generate virtual smart-meter data from the operational data collected from the unshaded smart homes that have intelligent controllers but do not have smart meters. The virtual smart-meter data approximates the smart-meter data that would be collected by a smart meter.

Mathematical models that relate operational data to smart-meter data are now described. Smart-meter data associated with a smart-home environment can be represented mathematically using column vector notation as follows:

$$\check{S} = \begin{bmatrix} s_1 \\ s_2 \\ s_3 \\ M \\ s_N \end{bmatrix} \quad (1)$$

where $s_i$ represents the ith smart-meter data element, and N represents the number of smart-meter data elements.

A smart-meter data element $s_i$ is a numerical value that represents the amount of a utility provided by a utility company to a user. For example, the element $s_1$ can be a numerical value that represents the total amount of electricity, water or natural gas consumed in a 24 hour period. The element $s_2$ can be a numerical value that represents the amount of electricity, water, or natural gas consumed in a time interval, such as a one hour time interval.

It should be noted that the operational data may also include extrinsic data regarding the layout, year of the home, controlled entity model, and any other data that relates the building in which the intelligent controller is installed and the controlled entity. For example, if the intelligent controller is an intelligent thermostat and the controlled entity is a natural gas heating unit, relevant extrinsic data that can be included in the operational data can be the layout of the home, such as square footage and number of rooms, year the home was built, and the heating unit model.

On the other hand, the operational data collected and/or generated by an intelligent controller can also be represented mathematically using column vector notation as follows:

$$\check{Q} = \begin{bmatrix} q_1 \\ q_2 \\ q_3 \\ M \\ q_M \end{bmatrix} \quad (2)$$

where $q_j$ represents the jth operational data element, and M represents the number of operational data elements.

An operational data element $q_j$ is a numerical value that represents a particular type of raw data collected by sensors and/or data generated by the intelligent controller in response to the raw data collected by the one or more sensors, control specification and control schedules. For example, the element $q_1$ can be a numerical value that represents a setpoint when a controlled entity is to be turned on or off. The element $q_2$ can represent a parameter, such as temperature, measured by a sensor at a particular time of day.

Smart-meter data $\check{S}$ can be mathematically related to operational data $\check{Q}$ by a function that maps the operational data to the smart-meter data as follows:

$$\check{S} = G[\check{Q}] \quad (3)$$

where G represents a function that relates the operational data to each element of the smart-meter data.

The function G may also have an inverse $G^{-1}$ that maps the smart-meter data to the operational data as follows:

$$\check{Q} = G^{-1}[\check{S}] \quad (4)$$

Figure 15A:
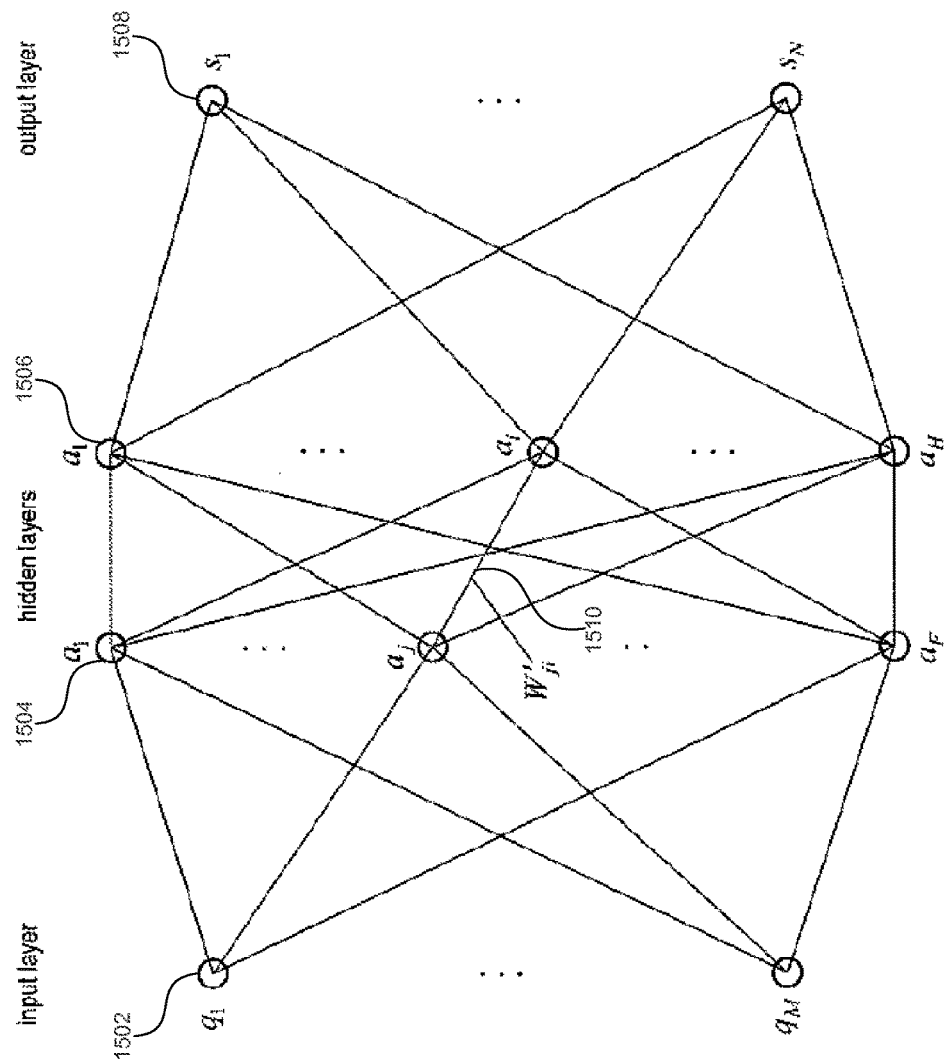
FIG. 15A illustrates a graph of an example neural network.

In certain embodiment, the function G can be computed using neural network-based techniques to produce a mathematical model of the relationship between known operational data and smart-meter data. Neural networks are a computational modeling technique that changes structure during a learning phase and can be used to model the complex relationship between the smart-meter data $\check{S}$ and the operational data $\check{Q}$. Learning is achieved by iteratively adjusting the numerical values of weights in a network until the network-action computing performance reaches an acceptable threshold or after a set number of iterations have been executed. FIG. 15A illustrates a graph of an example neural network 1500 that represents a network of weighted relationships between the smart-meter data $\check{S}$ and the operational data $\check{Q}$. In this example, the neural network 1500 includes an input layer 1502, two hidden layers 1504 and 1506, and an output layer 1508. The input layer 1502 is composed of nodes that correspond to the operational data elements of $\breve{Q}$, and the output layer 1508 is composed of nodes that correspond to the smart-meter data elements of $\breve{S}$. Hidden layers 1504 and 1506 are composed of nodes that represent hidden units denoted by $a_i$. Hidden layer 1504 is composed of F nodes that correspond to F hidden units, and hidden layer 1506 is composed of H nodes that correspond to H hidden units, where F and H are positive integers. Certain pairs of nodes are connected by links or edges, such as link 1510, that represent weigths denoted by $W'_{ji}$. Each weight determines the strength and sign of a connection between two nodes. It should be noted that neural networks are not limited to two hidden layers and a fixed number of nodes in each layer. The number of hidden layers and number of nodes in each hidden layer can be selected based on computation efficiency. In other words, the number of hidden layers can range from a few as one to some number greater than two, and the number of nodes in each hidden layer is not limited.

FIG. 15B presents an example of a pseudocode for multilayer feed-forward neural networks that execute learning through back propagation. The number of layers in the neural network is denoted by a positive integer L. It should be noted that this pseudocode is not intended to limit the number of steps or to be exhaustive of the numerous ways in which a multilayer feed-forward neural network can be implemented to compute a relationship between operational data and smart-meter data, but is instead provided as one example of a computation approach to computing the relationship between operational data and smart-meter data.

In step 1, the weights $W'_{ji}$ are initialized to values between 0 and 1. The weights can be initialized using a random number generator that assigns a randomly computed value between 0 and 1 to each of the weights. The initialization is performed one time and the weights are computed for a set of corresponding operational and smart-meter data associated with a type of intelligent controller. In step 2, steps 3 through 10 are repeated to calculate, or train, a set of weights that defines a relationship between the set of operational and smart-meter data associated with smart homes having smart meters and similar intelligent controllers.

In step 3, the smart-meter data and operational data are retrieved from the database. Each operational data element is a node in the input layer, and each smart-meter data element is a node in the output layer, as illustrated in FIG. 15A. In the for-loop of step 4, each node or operational data element $q_j$ in the input layer is assigned to a hidden unit $a_j$. In the for-loop of step 5, for each layer l between 2 and L, $h(sum_i)$ is calculated and assigned to a hidden unit $a_i$ for each node, where h is an activation function. The activation function, h, can be a threshold activation function that outputs 1 when the input is positive and 0 otherwise. Alternatively, the activation function can be a sigmoid function. Examples of sigmoid activation functions include $h(sum_i)=\tan h(sum_i)$ and $h(sum_i)=1/(1+e^{-sum_i})$. In the for-loop of step 6, for each node in the output layer an error $Error_i$ and a modified error $\Delta_i$ are calculated, where h' represents the first derivative of the activation function h. The modified error corresponds to a fraction of the error in the nodes of the output layer. Step 7 is a for-loop that executes back propagation and weight updates in steps 8 and 9 beginning with L−1 and ending with the input layer (i.e., l=1). In the for-loop of step 8, the modified error is calculated for each hidden layer l, and in the for-loop of step 9, the weights are updated for each node in the hidden layer l+1. In step 10, when the $Error_i$ for each node in the output layer is less than a defined error threshold, steps 3 through 10 are repeated for another set of smart-meter data and operational data. Otherwise, if one of the errors $Error_i$ exceeds or equals the predefined threshold, steps 5 through 10 are repeated. Note that in other embodiments rather than using a threshold, steps 5 through 9 can be repeated for a preset number of iterations.

Figure 16:
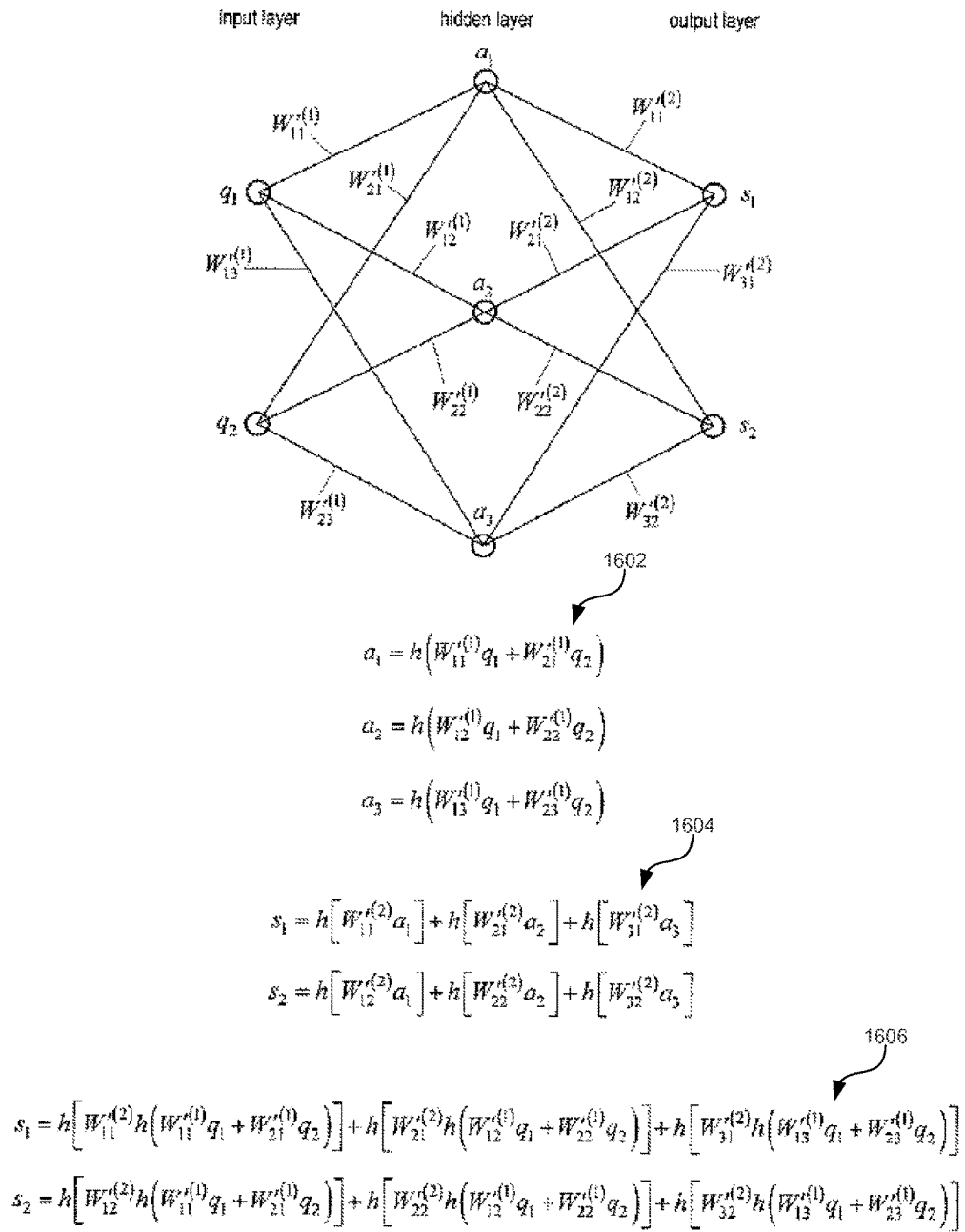
FIG. 16 illustrates a simple example of a feed-forward neural network.

Steps 3 through 10 can be repeated for a large number of smart homes with intelligent controllers and smart meters in order to computationally generate a set of weights that define a relationship between operational and smart-meter data associated with a particular type of intelligent controller. The resulting set of weights can then be used to calculate virtual smart-meter data for intelligent-controller users who do not have smart meters. FIG. 16 shows a simple example of a feed-forward neural network 1600 with an operational data set composed of two operational data elements $q_1$ and $q_2$ and a smart-meter data set also composed of two smart-meter data elements $s_1$ and $s_2$. In this example only one hidden layer composed of three hidden units $a_1$, $a_2$, and $a_3$ is selected to determine a set of weights. In FIG. 16, a first set of weights that link the operational data elements $q_1$ and $q_2$ to the hidden units $a_1$, $a_2$, and $a_3$ are denoted by $W'_{11}{}^{(1)}$, $W'_{21}{}^{(1)}$, $W'_{12}{}^{(1)}$, $W'_{13}{}^{(1)}$, $W'_{22}{}^{(1)}$, and, $W'_{23}{}^{(1)}$, and a second set of weights that link the hidden units $a_1$, $a_2$, and $a_3$ to the smart-meter data elements $s_1$ and $s_2$ are denoted by $W'_{11}{}^{(2)}$, $W'_{21}{}^{(2)}$, $W'_{31}{}^{(2)}$, $W'_{12}{}^{(2)}$, $W'_{22}{}^{(2)}$, and, $W'_{32}{}^{(2)}$. The weights can be calculated using a feed-forward neural network with back propagation, such as the pseudocode described above with reference to FIG. 15B, for a large number of smart homes with similar or the same intelligent controllers and smart meters. Once weights have been determined, virtual smart-meter data can be calculated for a smart home that has an intelligent controller but is not equipped with a smart meter. Virtual smart-meter data $s_1$ and $s_2$ can be calculated by first calculating the hidden units $a_1$, $a_2$, and $a_3$ as a function of the operational data and the first set of weights, as represented by a first set of equations 1602. Next, virtual smart-meter data $s_1$ and $s_2$, represented by equations 1604, is calculated as a function of the hidden units $a_1$, $a_2$, and $a_3$ calculated in equations 1602 and the second set of weights. FIG. 16 includes equations 1606 that combines equations 1602 and 1604 to calculate virtual smart-meter data $s_1$ and $s_2$ as a function of the operational data and the two sets of weights.

The simple example in FIG. 16 demonstrates how an unknown smart-meter data element can be calculated from operational data and a trained set of weights. In practice, a feed-forward neural network with backward propagation can be used to calculate operational data from smart-meter data by identifying the smart-meter data as the input layer and the operational data as the output layer and following the same computational method described above with reference to FIG. 15B. In other words, a feed-forward neural network with backward propagation can be used to generate a mathematical model that relates operational data as the output layer and smart-meter data as the input layer.

The function G defined in Equation (3) can also represent N functions with each function mapping the operational data $\breve{Q}$ to one smart-meter data element of $\breve{S}$:

$$\check{S} = G[\check{Q}] = \begin{bmatrix} s_1(\check{Q}) \\ s_2(\check{Q}) \\ s_3(\check{Q}) \\ M \\ s_N(\check{Q}) \end{bmatrix} \quad (5)$$

In Equation (5), each smart-meter data element is calculated as a function of the operational data. The inverse function $G^{-1}$ can also be a series of M functions with each function mapping the smart-meter data to one smart-meter data element of $\check{Q}$:

$$\check{Q} = G^{-1}[\check{S}] = \begin{bmatrix} q_1(\check{S}) \\ q(\check{S}) \\ q_3(\check{S}) \\ M \\ q_M(\check{S}) \end{bmatrix} \quad (6)$$

In Equation (6), each operational data element is calculated as a function of the smart-meter data.

In certain embodiments, the function G can represent a matrix given by:

$$\check{S} = G[\check{Q}] = W\check{Q} \quad (7)$$

where $$W = \begin{bmatrix} W_{11} & W_{12} & W_{13} & L & W_{1M} \\ W_{21} & W_{22} & W_{23} & & \\ W_{31} & W_{32} & W_{33} & & M \\ M & & & O & \\ W_{N1} & & L & & W_{NM} \end{bmatrix} \quad (8)$$

and with the $W_{ij}$'s are real-valued weights.

In other words, each smart-meter data element given in Equation (5) can be a linear function of the operational data as follows:

$$s_i(\check{Q}) = \sum_{j=1}^{M} W_{ij} q_j \quad (9)$$

Likewise, the inverse function $S^{-1}$ can represent a matrix given by:

$$\check{S} = G^{-1}[\check{Q}]w\check{Q} \quad (10)$$

where $$w = \begin{bmatrix} w_{11} & w_{12} & w_{13} & L & w_{1N} \\ w_{21} & w_{22} & w_{23} & & \\ w_{31} & w_{32} & w_{33} & & M \\ M & & & O & \\ w_{M1} & & L & & w_{MN} \end{bmatrix} \quad (11)$$

and the $w_{ji}$'s are real-valued weights.

In other words, each operational data element given in Equation (6) can be a linear function of the smart-meter data as follows:

$$q_j(\check{S}) = \sum_{i=1}^{N} w_{ji} s_i \quad (12)$$

The weights $W_{ij}$'s and $w_{ji}$'s in Equations (9) and (12), respectively, can be determined using the numerical optimization method, such as the conjugate gradient method, or by empirically adjusting the weights using smart-meter data and operational data obtained from a number of smart homes equipped with smart meters and an intelligent controller. In other embodiments, the weights $W_{ij}$'s in Equation (9) can be determined using numerical optimization method or empirically and the weights $w_{ji}$'s in matrix Equation (11) can be calculated by computing a pseudoinverse of the matrix Equation (8). In other embodiments, the weights $w_{ij}$'s in Equation (11) can be determined using numerical optimization method or empirically and the weights $W_{ji}$'s in matrix Equation (9) can be calculated by computing a pseudoinverse of the matrix Equation (11).

In other embodiments, more complex polynomial functions can be formulated to characterize the relationships between the smart-meter data and the operational data. In other words, each smart-meter data element given in Equation (5) can be a polynomial function of the operational data:

$$s_i(\check{Q}) = \sum_{j=1}^{M} B_{ij} q_j^{A_{ij}} C_i \quad (13)$$

where $A_{ij}$, $B_{ij}$, and $C_i$ are real-valued constants.

In addition, each operational data element given in Equation (6) can be a polynomial function of the smart-meter data:

$$q_j(\check{S}) = \sum_{i=1}^{N} b_{ji} s_i^{a_{ji}} c_j \quad (14)$$

where $a_{ji}$, $b_{ji}$, and $c_j$ are real-valued constants.

The constants $A_{ij}$, $R_{ij}$, and $C_i$ in Equation (13) and the constants $a_{ji}$, $b_{ji}$, and $c_j$ in Equation (14) can be determined empirically by adjusting the constants so that smart-meter data and operational data obtained from a large number of test participants satisfy Equations (5) and (6).

In other embodiments, rational functions can be formulated to characterize the relationships between the smart-meter data and the operational data. For example, each smart-meter data element given in Equation (5) can be calculated using a rational polynomial function of the operational data:

$$s_i(\overset{\vee}{Q}) = \frac{\sum_{j=1}^{M} B_{ij} q_j^{A_{ij}} + C_i}{\sum_{j=1}^{M} D_{ij} q_j^{E_{ij}} + J_i} \quad (15)$$

where $A_{ij}$, $B_{ij}$, $C_i$, $D_{ij}$, $E_{ij}$, and $J_i$ are real-valued constants.

In addition, each operational data element given in Equation (6) can be calculated using a rational polynomial function of the smart-meter data:

$$q_j(\overset{\vee}{S}) = \frac{\sum_{i=1}^{N} b_{ji} s_i^{a_{ji}} + c_j}{\sum_{i=1}^{N} e_{ji} s_i^{f_{ji}} + g_j} \quad (16)$$

where $a_{ji}$, $b_{ji}$, $c_j$, $e_{ji}$, $f_{ji}$, and $g_j$ are real-valued constants.

The constants in Equations (15) and (16) can be determined empirically by adjusting the constants so that smart-meter data and operational data obtained from a large number of test participants satisfy Equations (5) and (6).

Figure 17:
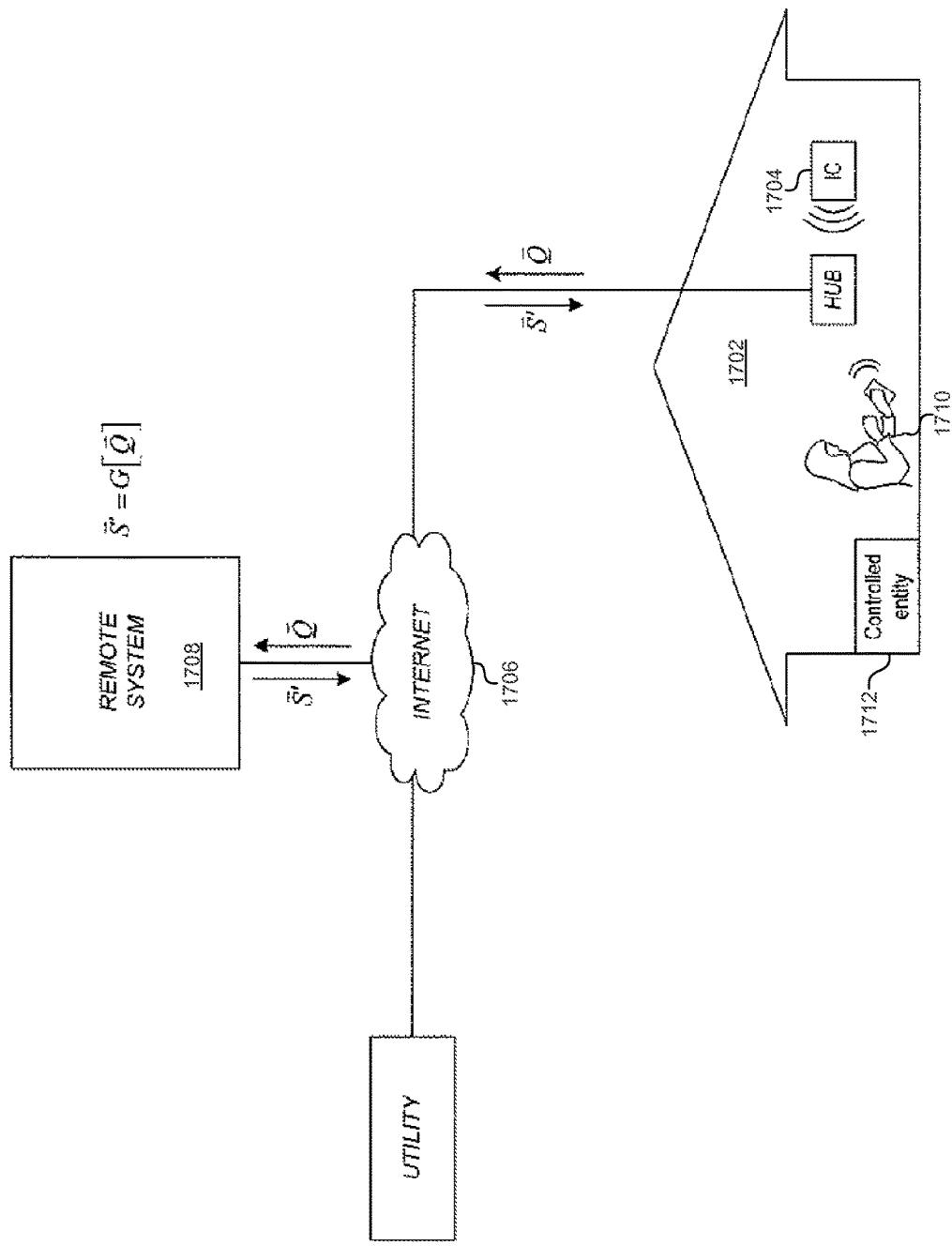
FIG. 17 illustrates a smart home that receives virtual smart-meter data as a result of providing operational data from an intelligent controller 1704.

FIG. 17 illustrates a smart home 1702 that receives virtual smart-meter data $\overset{\vee}{S}{}'$ as a result of providing operational data $\overset{\vee}{Q}$ from an intelligent controller 1704. In this example, the intelligent controller 1704 collects and transmits operational data $\overset{\vee}{Q}$ over the Internet 1706 to a remote system 1708. Based on the operational and smart-meter data collect from a number of smart homes with smart meters and similar intelligent controllers, a function G is calculated as described above and is used to calculate virtual smart-meter data $\overset{\vee}{S}{}'$. The virtual smart-meter data $\overset{\vee}{S}{}'$ is transmitted back to the user 1710. The user 1710 can view the virtual smart-meter data $\overset{\vee}{S}{}'$ using the intelligent controller 1704 user interface or using a user interface provided by the intelligent controller manufacture or vendor. The virtual smart-meter data $\overset{\vee}{S}{}'$ can also be used to adjust the operational settings of the intelligent controller 1704 to lower the cost of operating a controlled entity 1712.

Note that extrinsic data may also be appended to the operational data. Extrinsic data can be data that mathematically represents the layout or the home 1702, year the home was built, controlled entity 1712 model, and any other data that relates to the controlled entity 1712 and the home 1702. For example, if the intelligent controller is an intelligent thermostat and the controlled entity is a natural gas, forced air furnace, relevant extrinsic data can be appended to the operational data and used by the remote system to calculate G. The extrinsic data can be the layout of the home, such as square footage and number of rooms, year the home was built, and the furnace model.

Figure 18A:
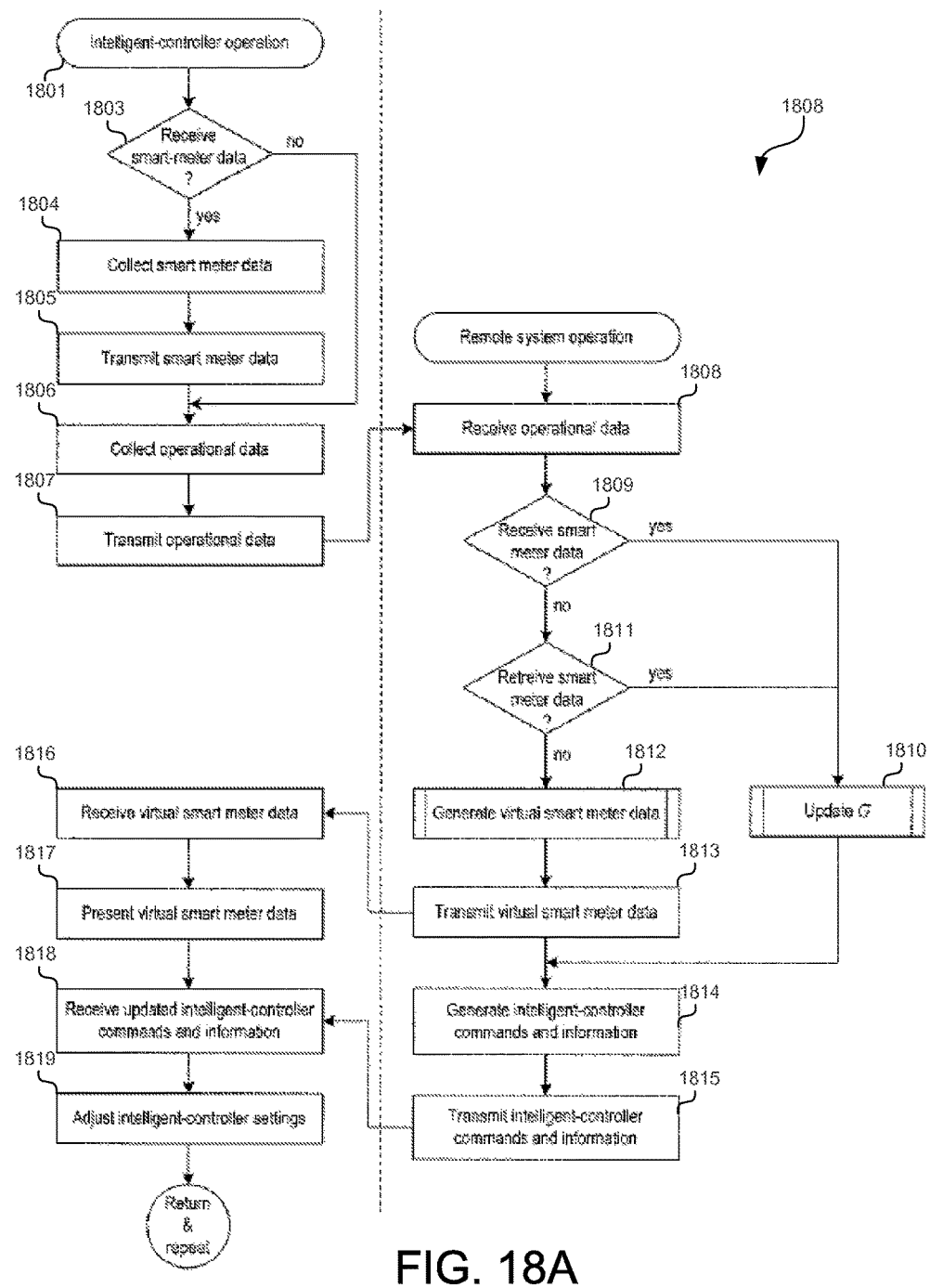
FIG. 18A illustrates a high-level interaction between an intelligent controller and a remote system.
Figure 18B:
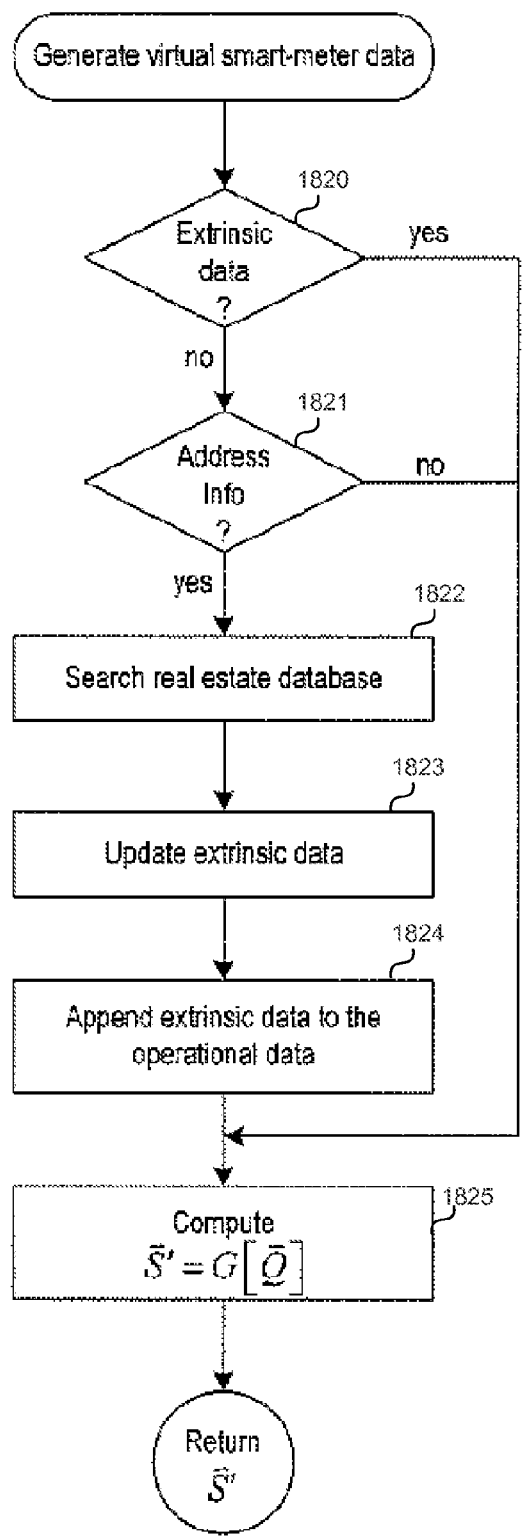
FIG. 18B illustrates a flow-control diagram for the routine "generate virtual smart-meter data" called in a step of FIG. 18A.
Figure 18C:
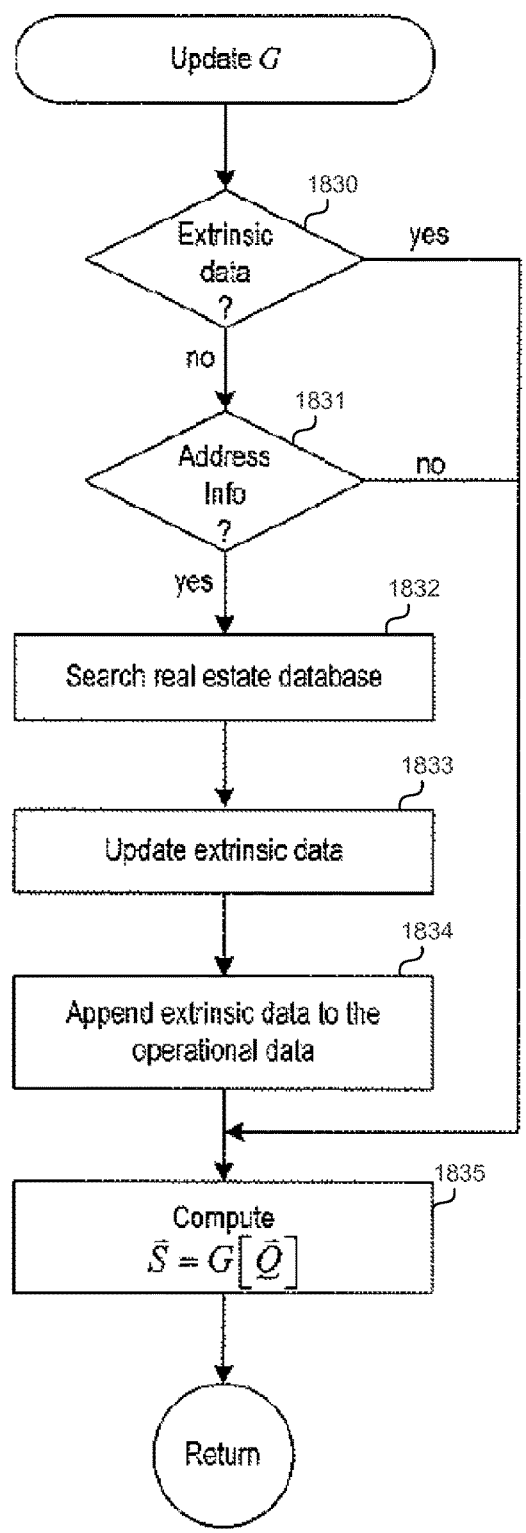
FIG. 18C illustrates a flow-control diagram for the routine "update G" called in a step of FIG. 18A.

Next, FIGS. 18A-18C illustrate an example implementation of a method that incorporates the above described mathematical models for generating virtual smart-meter data. At the onset, it should be noted that the following implementation is but one of many different possible implementations that can be obtained by varying many different design and implementation parameters, including modular organization, control structures, data structures, programming language, hardware components, firmware, and other such design and implementation parameters.

FIG. 18A illustrates a high-level interaction between an intelligent controller and a remote system. Left-hand column 1801 represents steps executed by an intelligent controller, and right-hand column 1802 represents steps executed by a remote system interacting with the intelligent controller. In step 1803, when the intelligent controller is in communication with a smart meter, as described above with reference to FIG. 12, and the intelligent controller receives smart-meter data generated by the smart meter, control flows to step 1804. Otherwise, when the intelligent controller is not in communication with a smart meter, or the building does not have a smart meter, control flows to step 1806. In step 1804, the intelligent controller collects stored smart-meter data. In step 1805, the intelligent controller transmits the collected smart-meter data to the remote system. Note also that the intelligent controller can be used to transmit the smart-meter data to a utility company, as described above with reference to FIG. 12. In step 1806, the intelligent controller collects stored operational data. In step 1807, the intelligent controller transmits the operational data to the remote system, as described above with reference to FIG. 2.

In step 1808 of column 1802, the remote system receives and stores the operational data associated with the intelligent controller in a database. In step 1809, when the remote system receives smart-meter data from the intelligent controller, the remote system stores the smart-meter data and control flows to step 1810. On the other hand, when the remote system does not receive smart-meter data control flows to step 1811. In step 1811, when the remote system is able to retrieve smart-meter data associated with the building from the utility company as described above with reference to FIG. 13, the remote system stores the smart-meter data and control flows to step 1810. Otherwise, control flows to step 1812. In step 1810, a routine called "update G" is called to update the weights or constants associated with a function G based on the operational data and smart-meter data. The function G relates operational data to smart-meter data as described above with reference to FIG. 15 and Equations (1) through (16). In step 1812, a routine called "generate virtual smart-meter data" is called to calculate virtual smart-meter data associated with a home that has an intelligent controller but does not have a smart meter. In step 1813, the virtual smart-meter data generated in step 1812 is transmitted to the intelligent controller. In step 1813, the virtual smart-meter data generated in step 1812 can alternatively be sent to the intelligent controller manufacturer, vendor or organization that provides the intelligent-controller user the virtual smart-meter data, as described above with reference to FIG. 13. In step 1814, the remote system generates intelligent-controller commands and information based on the virtual smart-meter data and the operational data. The intelligent controller commands and information include instructions that can be used by the intelligent controller to change the control schedule and settings to better match the habits of people living the home, improve operation of a controlled entity, and decrease demand on the services provided by utility companies. Alternatively, when control flows through step 1810, the remote system generates intelligent-controller commands and information based on the smart-meter data and the operational data in step 1814. In step 1815, the intelligent controller commands and information are transmitted to the intelligent controller.

Returning to column 1801, in step 1816, virtual smart-meter data transmitted to the intelligent controller from the remote system is received and stored. In step 1817, the virtual smart-meter data can presented on the intelligent-controller user interface. Alternatively, in step 1817, the intelligent controller can send the virtual smart-meter data over the home network hub to a smart phone, tablet, or personal computer in order to enable the intelligent-controller user to view the virtual smart-meter data. In step 1818, the intelligent controller receives intelligent controller commands and information transmitted from the remote system. In step 1819, the intelligent controller adjust control schedules and control settings based on the intelligent controller commands and information generated by the remote system.

FIG. 18B illustrates a flow-control diagram for the routine "generate virtual smart-meter data" called in step 1812 of FIG. 18A. In step 1820, when extrinsic data regarding the home in which the intelligent controller is known, control flows to step 1825. Extrinsic data can be home layout, such as the number of floors and rooms, the year the home was built, square footage, and the address or zip code the home is located in. If extrinsic data is not available, control flows to step 1821. In step 1821, when address information has been provide by the intelligent-controller user, control flows to step 1822, otherwise, control flows to step 1825. In step 1822, the remote system uses address information provided by the intelligent-controller user to search real estate databases to determine the home layout, year the home was built, and square footage. In step 1823, the remote system database can be updated to include the extrinsic data. In step 1824, the extrinsic data obtained in step 1822 can be appended to the operational data. In step 1825, virtual smart-meter data $\overset{v}{S}{}'$ is computed. The virtual smart-meter data can be computed using weights generated using weights obtained from a feed-forward neural network as described above in the example of FIG. 16. Alternatively, the virtual smart-meter data can be computed from Equations (6), (13), or (15). It should be noted that when no extrinsic data is available or can be determined, only the operational data provided by the intelligent controller is used to calculate the virtual smart-meter data.

FIG. 18C illustrates a flow-control diagram for the routine "update G" called in step 1810 of FIG. 18A. Steps 1830-1834 are essentially the same as the steps 1820-1824 described above with reference to the routine illustrated in FIG. 18B. In step 1835, smart-meter data $\overset{v}{S}$ and operational data $\overset{v}{Q}$ are used to update the function G. For example, the smart-meter data and the operational data can be used to recomputed the weights obtained using a feed-forward neural network as described above in the example of FIG. 15. Alternatively, the smart-meter data and the operational data can be used to recomputed or adjust the constants associated with the Equations (6), (13), or (15). It should be noted that when no extrinsic data is available or can be determined, only the operational data provided by the intelligent controller is used to update the function G.

An Intelligent Thermostat as an Example of an Intelligent Controller

In the following description, an intelligent thermostat is described as just one example of an intelligent controller that can be used with the above describes methods. The intelligent thermostat described below is equipped with a selectively layered functionality that exposes unsophisticated users to a simple user interface, but provides advanced users with an ability to access and manipulate many different energy-saving and energy tracking capabilities. Even for the case of unsophisticated users who are only exposed to the simple user interface, the intelligent thermostat provides advanced energy-saving functionality that runs in the background. The intelligent thermostat uses multi-sensor technology to learn the heating and cooling environment in which the intelligent thermostat is located and to optimize energy-saving settings.

The intelligent thermostat also learns about the users, beginning with a setup dialog in which the user answers a few simple questions, and then continuing, over time, using multi-sensor technology to detect user occupancy patterns and to track the way the user controls the temperature using schedule changes and immediate-control inputs. On an ongoing basis, the intelligent thermostat processes the learned and sensed information, automatically adjusting environmental control settings to optimize energy usage while, at the same time, maintaining the temperature within the environment at desirable levels, according to the learned occupancy patterns and comfort preferences of one or more users. Advantageously, the selectively layered functionality of the intelligent thermostat allows for effective operation in a variety of different technological circumstances within home and business environments. For simple environments having no wireless home network or Internet connectivity, the intelligent thermostat operates effectively in a standalone mode, learning and adapting to an environment based on multi-sensor technology and user input. However, for environments that have home network or Internet connectivity, the intelligent thermostat operates effectively in a network-connected mode to offer additional capabilities.

When the intelligent thermostat is connected to the Internet via a home network, such as through IEEE 802.11 (Wi-Fi) connectivity, the intelligent thermostat may: (1) provide real-time or aggregated home energy performance data to a utility company, intelligent thermostat data service provider, intelligent thermostats in other homes, or other data destinations; (2) receive real-time or aggregated home energy performance data from a utility company, intelligent thermostat data service provider, intelligent thermostats in other homes, or other data sources; (3) receive new energy control instructions and/or other upgrades from one or more intelligent thermostat data service providers or other sources; (4) receive current and forecasted weather information for inclusion in energy-saving control algorithm processing; (5) receive user control commands from the user's computer, network-connected television, smart phone, and/or other stationary or portable data communication appliance; (6) provide an interactive user interface to a user through a digital appliance; (7) receive control commands and information from an external energy management advisor, such as a subscription-based service aimed at leveraging collected information from multiple sources to generate energy-saving control commands and/or profiles for their subscribers; (8) receive control commands and information from an external energy management authority, such as a utility company to which limited authority has been voluntarily given to control the intelligent thermostat in exchange for rebates or other cost incentives; (9) provide alarms, alerts, or other information to a user on a digital appliance based on intelligent thermostat-sensed HVAC-related events; (10) provide alarms, alerts, or other information to the user on a digital appliance based on intelligent thermostat-sensed non-HVAC related events; and (11) provide a variety of other useful functions enabled by network connectivity.

The subject matter of the instant disclosure is related to the subject matter of the following commonly assigned applications, each of which is incorporated by reference herein: U.S. Ser. No. 13/034,674 filed Feb. 24, 2011 (Ref. No. NES0006-US); U.S. Ser. No. 13/034,678 filed Feb. 24, 2011 (Ref. No. NES0007-US); U.S. Ser. No. 13/269,501 filed Oct. 7, 2011 (Ref. No. NES0120-US); U.S. Ser. No. 13/632,093 filed Sep. 30, 2012 (Ref. No. NES0122-US); U.S. Ser. No. 13/632,028 filed Sep. 30, 2012 (Ref. No. NES0124-US); U.S. Ser. No. 13/275,307 filed Oct. 17, 2011 (Ref. No. NES0160-US); U.S. Ser. No. 13/632,041 filed Sep. 30, 2012 (Ref. No. NES0162-US); U.S. Ser. No. 13/467,025 filed May 8, 2012 (Ref. No. NES0177-US); U.S. Ser. No. 13/988,435 filed Jan. 3, 2012 (Ref. No. NES0190-US); PCT Application Ser. No. PCT/US12/00007 filed Jan. 3, 2012 (Ref. No. NES0190-PCT); U.S. Ser. No. 13/866,578 filed Apr. 19, 2013 (Ref. No. NES0211-US); U.S. Ser. No. 13/632,070 filed Sep. 30, 2012 (Ref. No. NES0234-US); U.S. Ser. No. 13/624,878 filed Sep. 21, 2012 (Ref. No. NES0236-US); U.S. Ser. No. 13/842,213 filed Mar. 15, 2013 (Ref. No. NES0253-US); and U.S. Ser. No. 13/866,199 filed Apr. 19, 2013 (Ref. No. NES0335-US).

Figure 19:
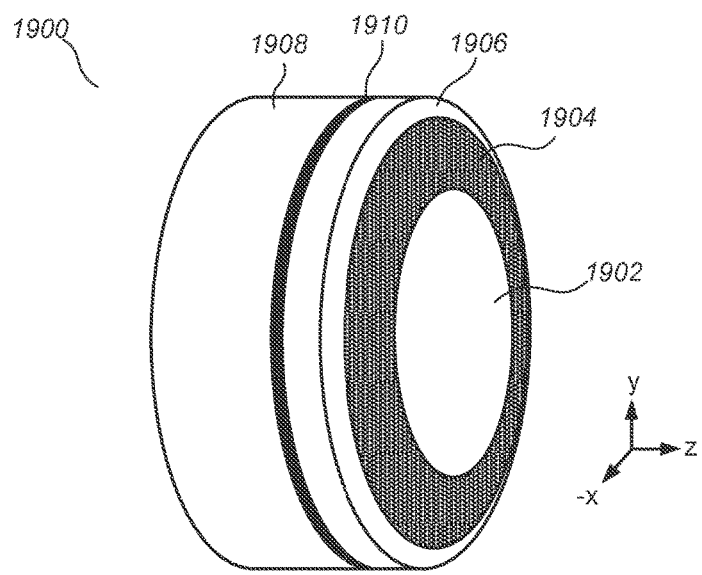
FIG. 19 illustrates a perspective view of an intelligent thermostat, according to some embodiments.

FIG. 19 illustrates a perspective view of an intelligent thermostat found to be particularly advantageous for use in conjunction with one or more of the described embodiments. The intelligent thermostat 1900 has a sleek, elegant appearance. The intelligent thermostat 1900 comprises a circular main body 1908 with a diameter of about 8 cm and that has a visually pleasing outer finish, such as a satin nickel or chrome finish. A cap-like structure comprising a rotatable outer ring 1906, a sensor ring 1904, and a circular display monitor 1902 is separated from the main body 1908 by a small peripheral gap 1910. The outer ring 1906 may have an outer finish identical to that of the main body 1908, while the sensor ring 1904 and circular display monitor 1902 may have a common circular glass (or plastic) outer covering that is gently arced in an outward direction and that provides a sleek yet solid and durable-looking overall appearance. The sensor ring 1904 contains any of a wide variety of sensors, including infrared sensors, visible-light sensors, and acoustic sensors. The glass or plastic that covers the sensor ring 1904 may be smoked or mirrored such that the sensors themselves are not visible to the user. An air venting functionality may be provided, via the peripheral gap 1910, which allows the ambient air to be sensed by the internal sensors without the need for gills or grill-like vents.

Figures 20A, 20B:
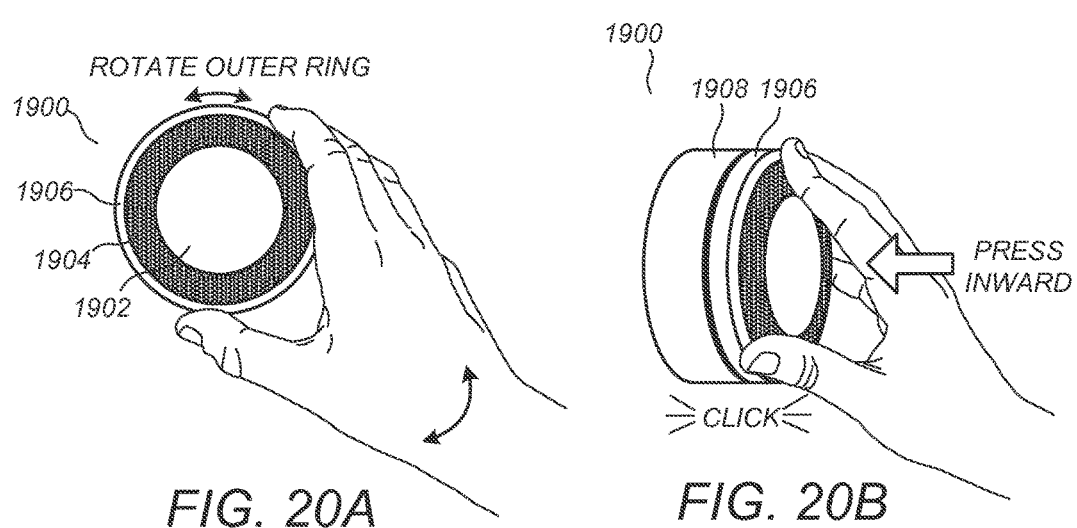
FIGS. 20A-20B illustrate the intelligent thermostat of FIG. 19 being controlled by a user, according to some embodiments.

FIGS. 20A-20B illustrate the intelligent thermostat 1900 of FIG. 19 as it is being controlled by a user. The intelligent thermostat 1900 is controlled by two types of user input: (1) a rotation of the outer ring 1906 (FIG. 20A); and (2) an inward push on the outer ring 1906 (FIG. 20B) until an audible and/or tactile "click" occurs. The inward push may cause the outer ring 1906 to move forward, while in another implementation, the entire cap-like structure, including both the outer ring 1906 and the glass covering of the sensor ring 1904 and circular display monitor 1902, move inwardly together when pushed. The sensor ring 1904, the circular display monitor 1902, and the common glass covering do not rotate with outer ring 1906 in one implementation. In the drawings shown herein, the "z" direction is outward from the wall, the "y" direction is the toe-to-head direction relative to a walk-up user, and the "x" direction is the user's left-to-right direction.

By rotation of the outer ring 1906, or ring rotation, and inward pushing of the outer ring 1906, or inward click, the intelligent thermostat 1900 can receive all necessary information from the user for basic setup and operation. The outer ring 1906 is mechanically mounted in a manner that provides a smooth yet viscous feel to the user, for further promoting an overall feeling of elegance while also reducing spurious or unwanted rotational inputs. The intelligent thermostat 1900 recognizes three fundamental user inputs: (1) ring rotate left, (2) ring rotate right, and (3) inward click. In other implementations, more complex fundamental user inputs can be recognized, such as double-click or triple-click inward presses and speed-sensitive or acceleration-sensitive rotational inputs.

Figure 21A:
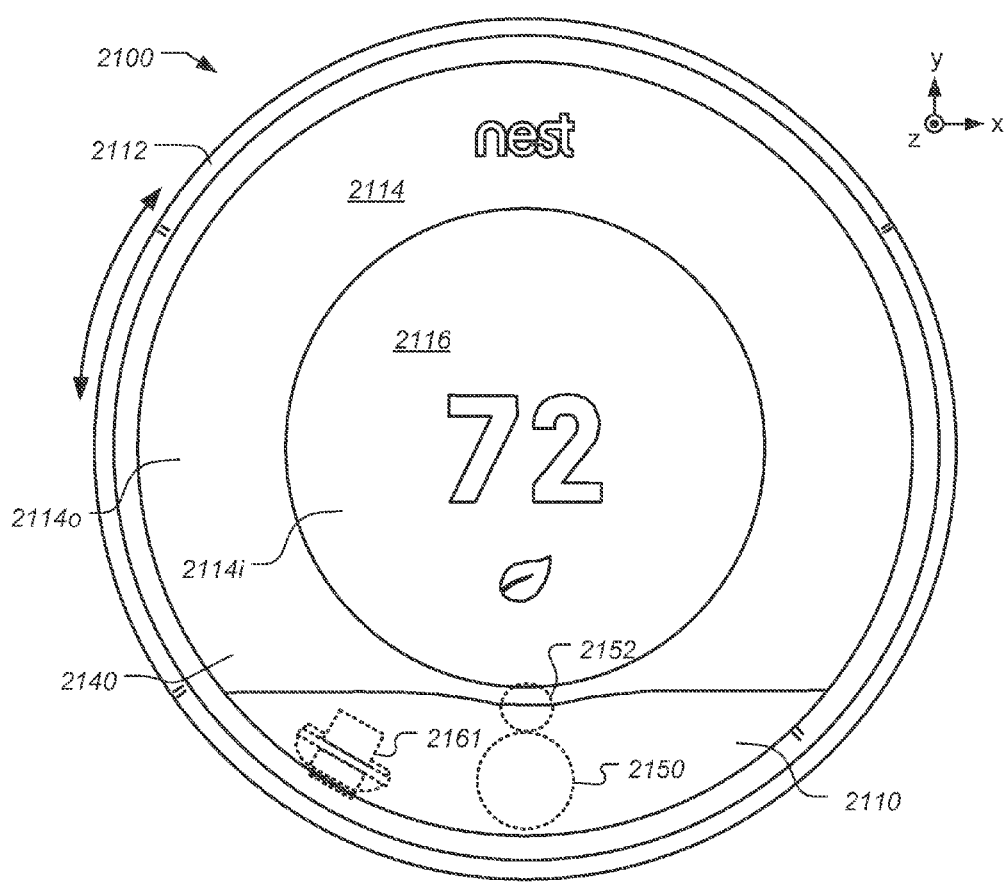
FIGS. 21A-21D illustrate front, bottom, side, and rear perspective views, respectively, of an intelligent thermostat, according to some embodiments.
Figure 21B:
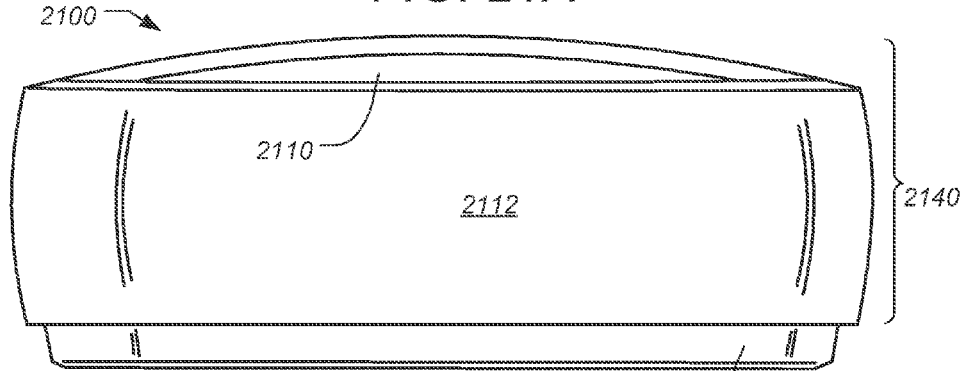
Figure 21C:
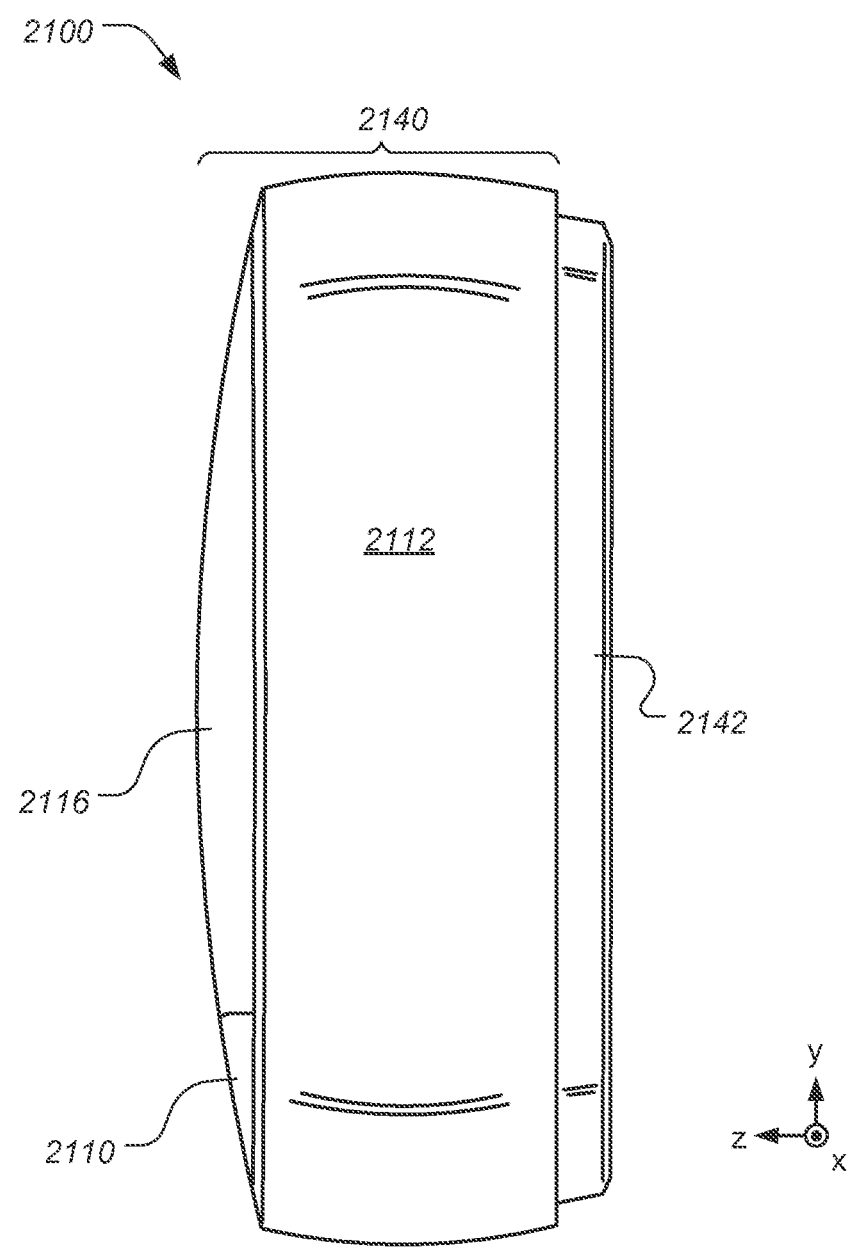
Figure 21D:
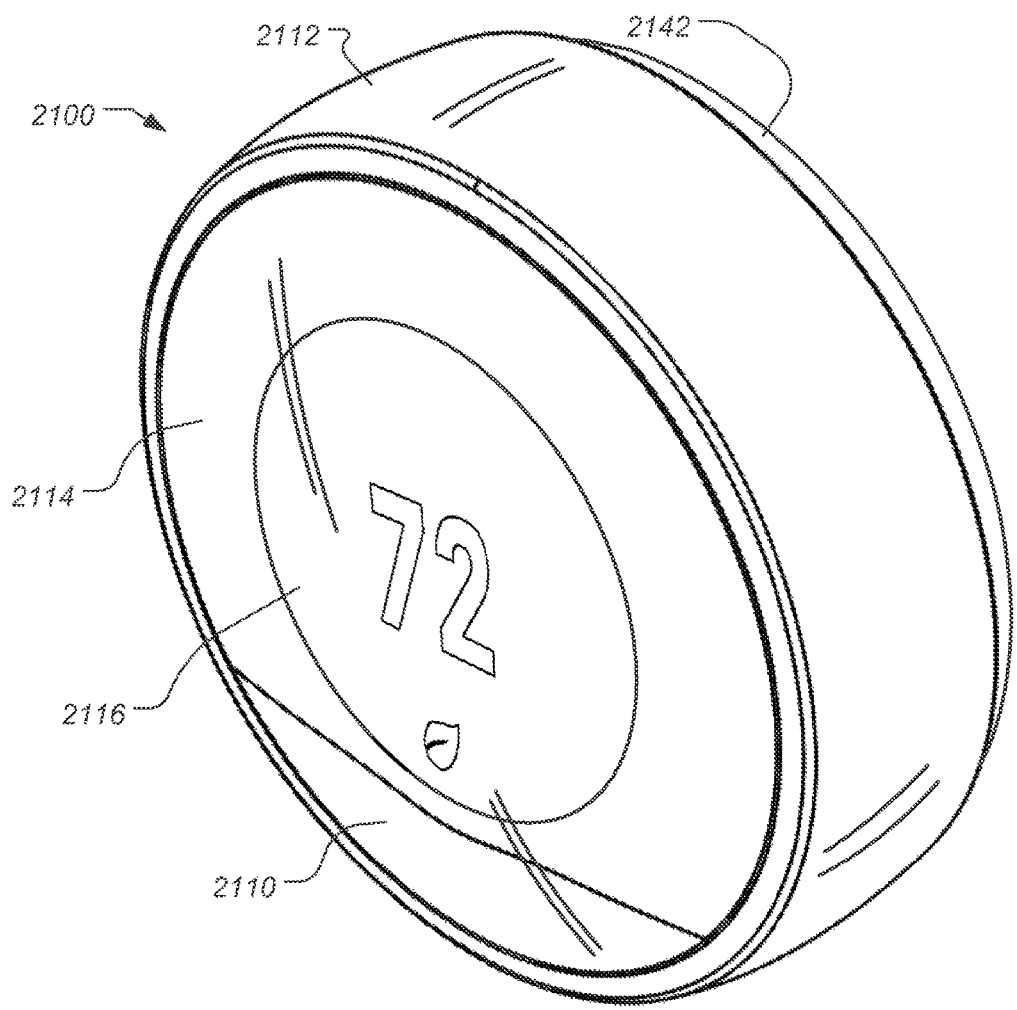

FIGS. 21A-21D illustrate an intelligent thermostat 2100 that is similar in certain respects to the intelligent thermostat 1900 of FIGS. 19-20B, supra, the intelligent thermostat 2100 having a visually pleasing, smooth, sleek and rounded exterior appearance while at the same time including multiple environmental sensors, multiple occupancy sensors, intelligent processing and logging capability, and network connectivity capability. FIG. 21A is front view, FIG. 21B is a bottom elevation view, FIG. 21C is a right side elevation view, and FIG. 21D is perspective view of intelligent thermostat 2100. Intelligent thermostat 2100 is wall mountable, is circular in shape, and has an outer rotatable ring 2112 for receiving user input. The outer rotatable ring 2112 allows the user to make adjustments, such as selecting a new setpoint temperature. Rotation of the outer ring 2112 can be sensed by an onboard optical finger navigation (OFN) module 2161 that is configured and positioned to sense movement of a textured surface on an inner surface of the outer ring 2112. The front face of the intelligent thermostat 2100 comprises a clear cover 2114 that according to some embodiments is polycarbonate, and a Fresnel lens 2110 having an outer shape that matches the contours of the curved outer front face of the intelligent thermostat 2100. For some embodiments, an inward pressing of the outer ring 2112 and/or the clear cover 2114 of the intelligent thermostat 2100 causes inward motion of the entire outer ring 2112 and cover 2114 ("inward click") toward the wall, and therefore a very large percentage of the visible portion of the intelligent thermostat 2100 moves toward the wall during an inward click. This can be contrasted with the intelligent thermostat 1900 of FIG. 19, supra, for which an inward pressing of the outer ring 1906 and/or the glass covering over display monitor 1902 and sensor ring 1904 causes an inward motion of the outer ring 1906 and glass covering toward the stationary circular main body 1908 to reduce the thickness of the peripheral gap 1910, and therefore a relatively modest percentage of the visible portion of the intelligent thermostat 1900 moves toward the wall during an inward click. Behind the Fresnel lens is a passive infrared sensor 2150 for detecting occupancy, i.e., for detecting the presence of a person who is generally in the same room or space as the intelligent thermostat 2100. As shown in FIGS. 21A-21D, the front edge of rotating ring 2112, front face 2114 and Fresnel lens 2110 are shaped such that they together form an integrated convexly rounded front face that has a common outward arc or spherical shape gently arcing outward.

Although being formed from a single lens-like piece of material such as polycarbonate, the cover 2114 has two different regions or portions including an outer portion 2114o that is painted or smoked and a central portion 2114i that is visibly clear so as to facilitate viewing of an electronic display 2116 disposed thereunderneath. According to one embodiment in which the diameter of the intelligent thermostat 2100 is about 80 mm, the diameter of the electronic display 2116 is about 45 mm. A second downwardly-tilted PIR sensor 2152 is provided to detect an approaching user, i.e., a person who is close enough that they may be intending to physically interact with the intelligent thermostat 2100 and/or may be intending to read the electronic display 2116. The proximity sensor 2152 can be used to detect proximity in the range of about one meter so that the intelligent thermostat 2100 can initiate "waking up" when the user is approaching the thermostat. Such use of proximity sensing is useful for enhancing the user experience by being "ready" for interaction or viewing as soon as, or very soon after, the user is ready to interact with or view the thermostat. Further, the wake-on-proximity functionality also allows for energy savings within the thermostat by allowing the electronic display 2116 and certain of its internal components to "sleep" when no user interaction or viewing is taking place or about to take place. Intelligent thermostat 2100 further comprises a rechargeable battery (not shown in FIGS. 21A-21D) and associated charging circuitry that uses power from the backplate 2142 that is obtained either via a common wire, if available, or from power harvesting (sometimes referred to as power stealing, power sharing, or parasitic powering) from one or more HVAC system call relay wire(s) if a common wire is not available, as described in U.S. Ser. No. 13/467,025 (Ref. No. NES0177-US), supra.

The intelligent thermostat 2100 further includes a processing system (not shown in FIGS. 21A-21D), a display driver (not shown in FIGS. 21A-21D), and a wireless communication system (not shown in FIGS. 21A-21D). The processing system is configured and programmed to carry out the governance of the operation of intelligent thermostat 2100 including various user interface features. The processing system is further programmed and configured to carry out other operations as described further hereinabove, hereinbelow and/or in other ones of the commonly assigned incorporated applications, such as, but not limited to: automated self-programming of an HVAC schedule based on user temperature setting inputs and other factors; automated and optimally-timed determination, based on historical occupancy statistics, that the house is likely unoccupied and corresponding automated temperature setback to reduce energy use during those times; automated prediction of an estimated time to reach a target temperature and corresponding displayed advisory on the user interface; automated data logging and uploading of data logs to a central cloud-based server; automated and optimized control of particular HVAC equipment, such as heat pumps, based on current and historical operating statistics and current and forecasted outside weather; automated gradual schedule migration (with informed user consent) to lower-energy settings over selected periods of time such that users are less likely to feel uncomfortable at the lower-energy temperature setpoints; automated generation and continuous updating of a home thermal model and HVAC characteristics for improved HVAC control; automated and optimized cooperation (with informed user consent) with utility demand-response event notifications by computation and continual updating of optimal temperature setpoint trajectories to maximize selected metrics of energy time-shifting while also minimizing selected metrics of user discomfort; and a variety of other useful and energy-saving, comfort-producing functionalities. In furtherance of these objectives, the wireless communications system is used to communicate with devices such as home wireless routers, other thermostats or HVAC system components, or other smart-home devices, with such communications being, for example, peer-to-peer communications, communications through one or more servers located on a private network, and/or communications through a cloud-based service.

Figure 22A:
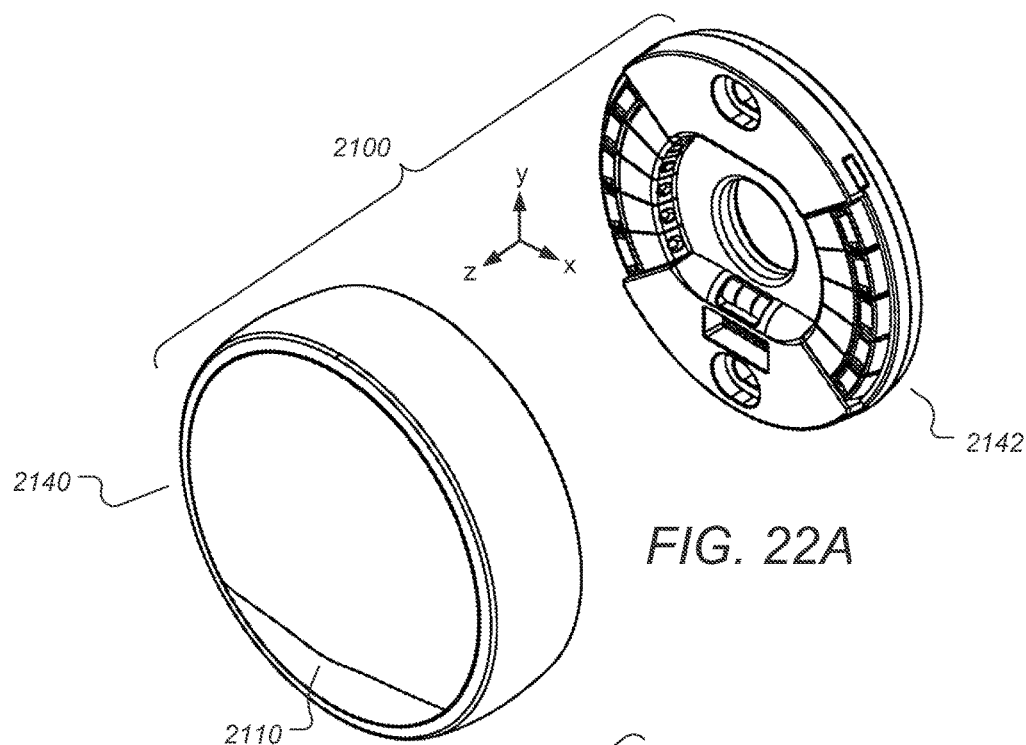
FIGS. 22A-22B illustrate exploded front and rear perspective views, respectively, of the intelligent thermostat, according to some embodiments.
Figure 22B:
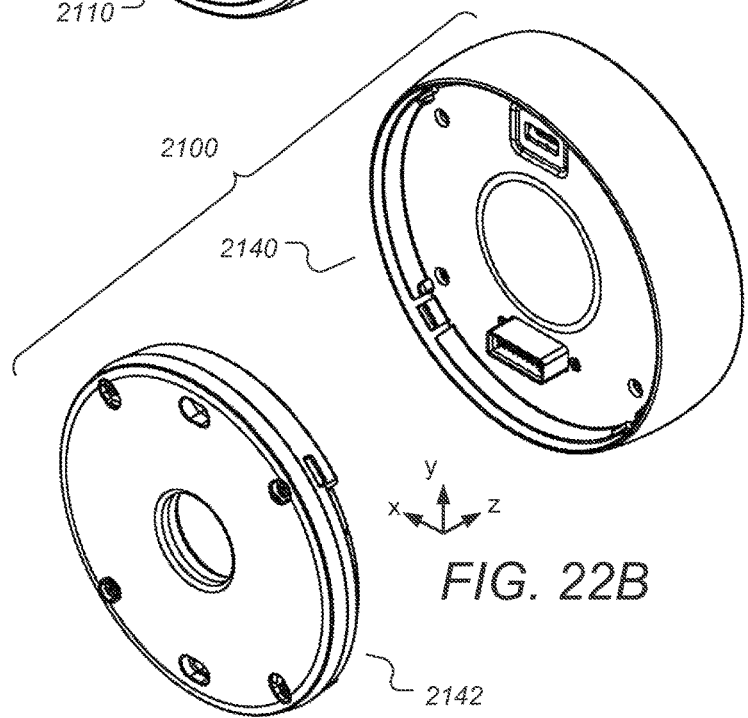

FIGS. 22A-22B illustrate exploded front and rear perspective views, respectively, of the intelligent thermostat 2100 with respect to its two main components, which are the head unit 2140 and the backplate 2142. For ease of installation, configuration and/or upgrading, especially by a non-expert installer such as a user, as well as for providing other features and advantages, the intelligent thermostat 2100 comprises a two-part mechanical assembly including a head unit 2140 and a backplate 2142. The backplate 2142 is configured and dimensioned to be affixed to a wall or other supporting surface, and comprises wiring terminals for coupling to HVAC wires that lead to the HVAC system being controlled. The head unit 2140 is removably mountable to the backplate 2142. Different portions of the functionality of the intelligent thermostat 2100 are judiciously apportioned between the head unit 2140 and the backplate 2142 such that a variety of different goals, objectives, and functionalities are achieved by virtue of their combination.

Figure 23A:
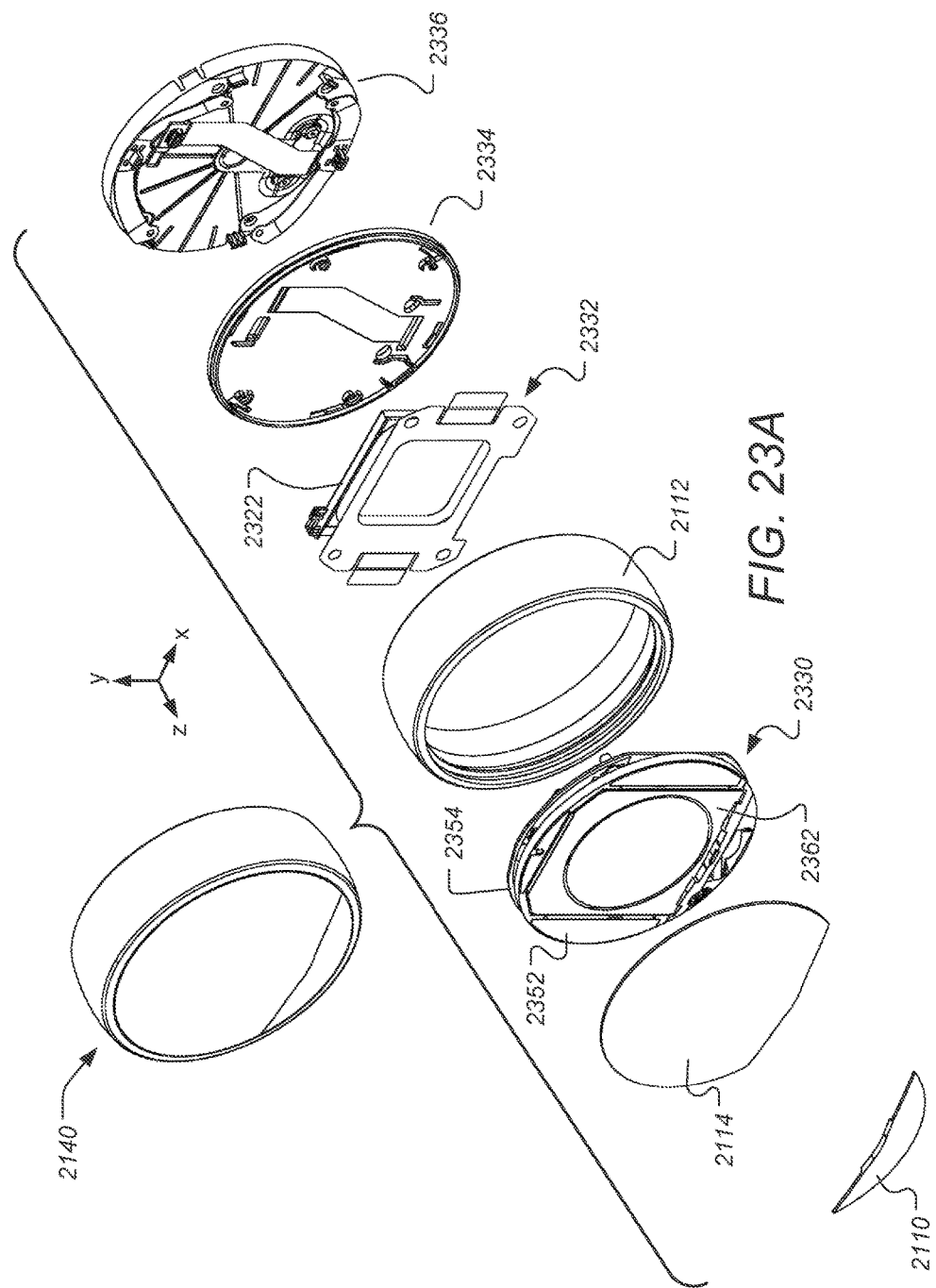
FIGS. 23A-23B illustrate exploded front and rear perspective views, respectively, of a head unit frontal assembly of the head unit, according to some embodiments.
Figure 23B:
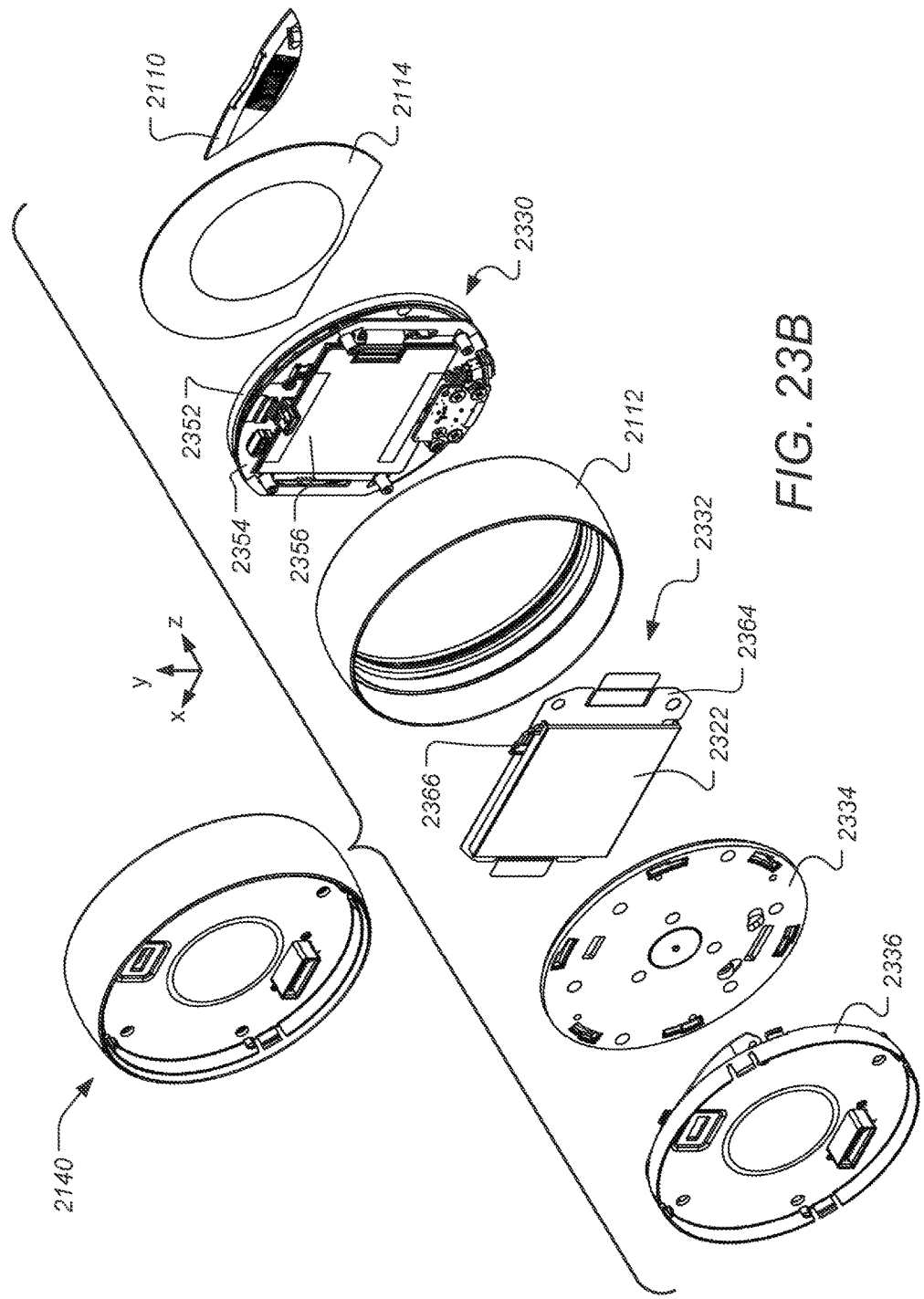

FIGS. 23A-23B illustrate exploded front and rear perspective views, respectively, of the head unit 2140 with respect to its primary components. Head unit 2140 includes a back cover 2336, a bottom frame 2334, a battery assembly 2332, the outer ring 2112 (which is manipulated for ring rotations), a head unit frontal assembly 2330, the front lens 2114, and the Fresnel lens 2110. Head unit frontal assembly 2330 includes a top frame 2352 that contains an LCD module 2362, and further comprises a head unit printed circuit board 2354 that contains a substantial portion of the head unit electronic components including processing, memory, wireless communication, powering and battery charging, and other electronic components. Electrical components on the head unit frontal assembly 2330 can connect to electrical components on the backplate 2142 by virtue of ribbon cables and/or other plug type electrical connectors on back cover 2336. According to some embodiments, circuitry and components are mounted on both sides of PCB 2354, while in other embodiments the majority of the circuitry and components are contained on the forward-facing side (i.e., facing outward from the wall) of the head unit PCB 2354. An RF shielding can 2356 (visible in FIG. 23B) surrounds most or all of the circuitry and components of the head unit PCB 2354 and serves to shield the circuitry and components from electromagnetic interference. The portion of RF shielding 2356 that is visible in FIG. 23B shields the underside of the electrical components on the forward-facing side of the PCB 2354. The RF shielding 2356 is also present over the forward-facing side of the PCB 2354 (not visible in FIG. 23B) such that those components are fully surrounded by RF shielding.

Battery assembly 2332 includes a rechargeable Lithium-Ion battery 2322, which for one preferred embodiment has a nominal voltage of 3.7 volts and a nominal capacity of 560 mAh. To extend battery life, however, the battery 2322 is normally not charged beyond 450 mAh by the thermostat battery charging circuitry. Moreover, although the battery 2322 is rated to be capable of being charged to 4.2 volts, the thermostat battery charging circuitry normally does not charge it beyond 3.95 volts. Battery assembly 2332 also includes connecting wires 2366, and a battery mounting film 2364 that is attached to battery 2322 using a strong adhesive and to the rear shielding can 2356 of head unit PCB 2354 using a relatively weaker adhesive. By using a weaker adhesive to mount the film 2364 of battery assembly 2332 to shielding can 2356 of the PCB 2354, subsequent replacement of battery assembly 2332 (including battery 2322) is facilitated. According to some embodiments, the battery assembly 2332 is user-replaceable.

Figure 24A:
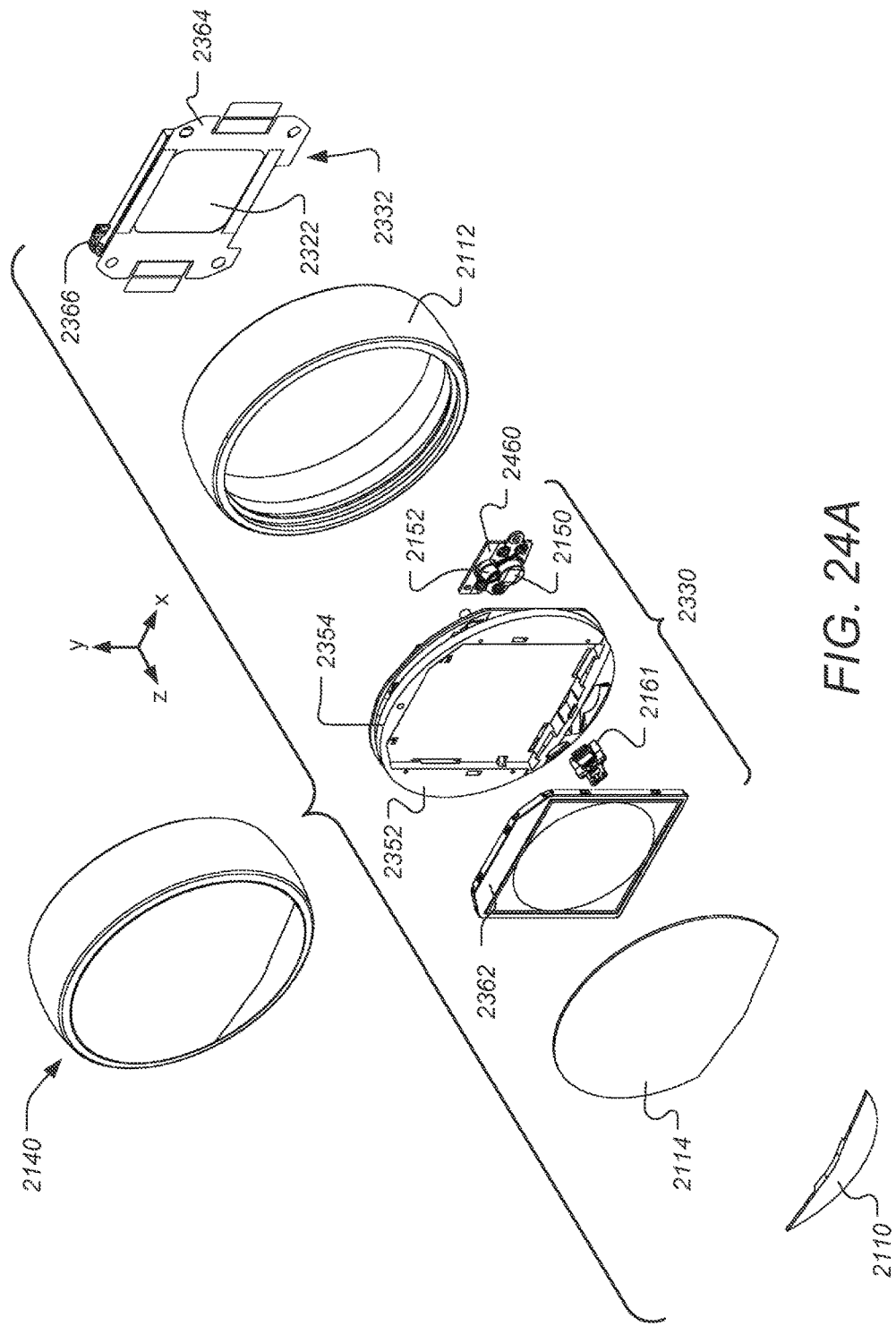
FIGS. 24A-24B illustrate exploded front and rear perspective views, respectively, of a backplate of the intelligent thermostat, according to some embodiments.
Figure 24B:
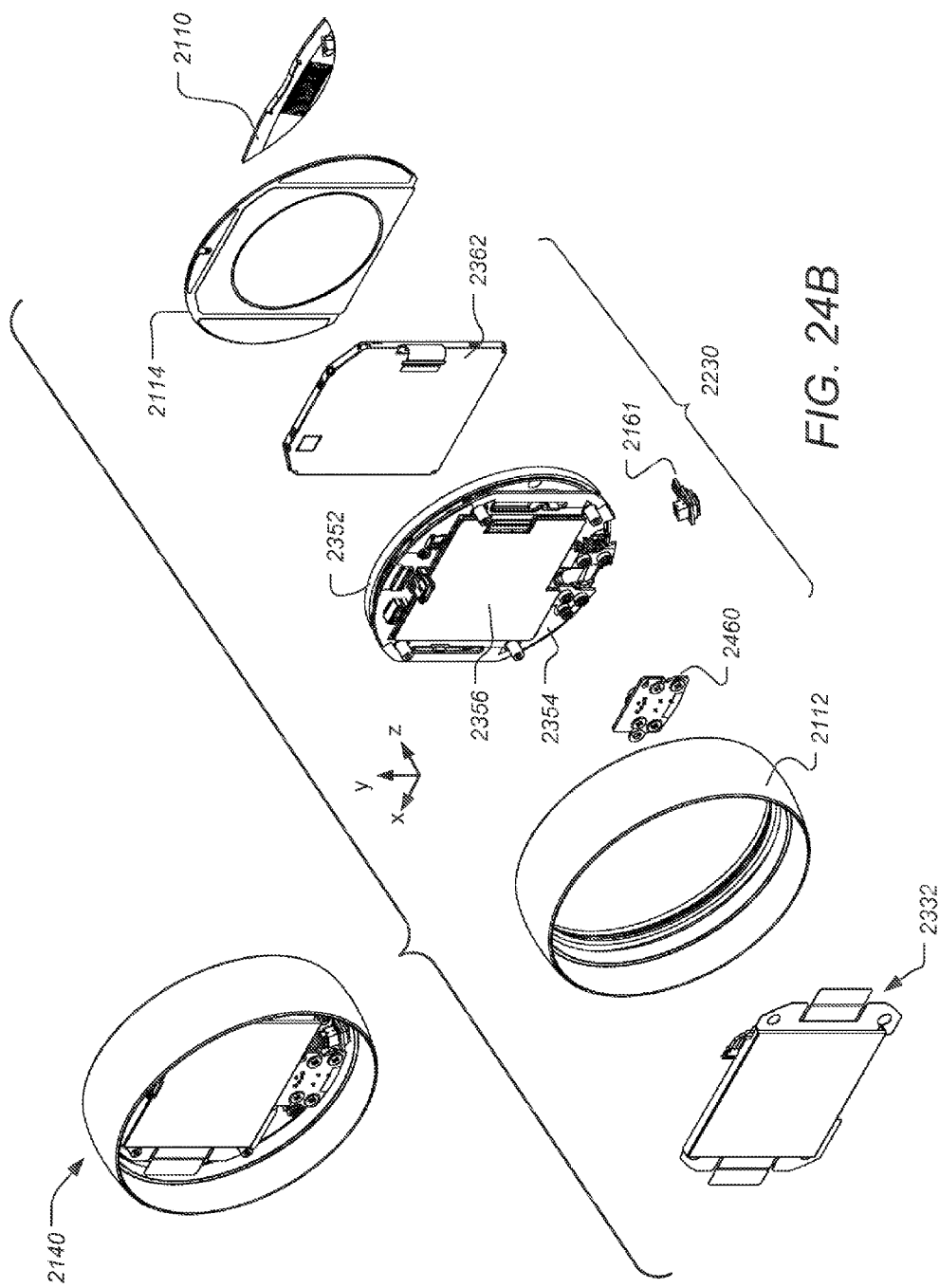

FIGS. 24A-24B illustrate additional exploded front and rear perspective views, respectively, of the head unit 2140, with further illustration of enumerated components of the head unit frontal assembly 2330. Head unit frontal assembly 2330 comprises the head unit top frame 2352, the head unit PCB 2354, and the LCD module 2161. As illustrated, the optical finger navigation module 2161 (see FIG. 21A, supra) is implemented as a daughter board that connects to the head unit PCB 2354 and is positioned thereon so that it can sense rotation of the outer ring 2112. The OFN module 2161 is directed radially outwardly (that is, perpendicular to the z-axis and away from the center of the thermostat). The OFN module 2161 uses methods analogous to the operation of optical computer mice to sense the movement of a textured surface on an inner face of the outer ring 2112. Notably, the OFN module 2161 is one of the very few sensors that are controlled by a relatively power-intensive head unit microprocessor rather than a relatively low-power backplate microprocessor, which are discussed further with respect to FIGS. 26-27, infra. Among other functions, the relatively low-power backplate microprocessor is used for polling and controlling sensors for temperature, humidity, infrared proximity, ambient light level detection, and inward-click user inputs so that the relatively high-powered head unit microprocessor can be in a low-power sleep state for most of the time. Notably, control of the OFN module 2161 by the head unit microprocessor can be achieved without confounding this power conservation strategy, because the head unit processor will already be awake (by virtue of detection by the PIR motion sensors 2150/2152) by the time the user manually turns the rotatable ring 2112. Advantageously, very fast response to the user's turning of the rotatable ring 2112 can be provided by the head unit microprocessor.

Also visible in FIGS. 24A-24B is Fresnel lens 2110 that operates in conjunction with the two PIR motion sensors 2150 and 2152 (see FIG. 21A, supra) that are mounted on a PIR mini-board 2460, which in turn attaches to the back side (i.e., the wall-facing side) of PCB 2354. Openings at corresponding locations of the top frame 2352 and PCB 2354 allow infrared radiation that has passed through Fresnel lens 2110 to impinge upon the PIR motion sensors 2150 and 2152. Two or more temperature sensors are also located in the head unit 2140 and cooperate to acquire reliable and accurate room temperature data. One of the temperature sensors is located on the daughter board of the OFN module 2161 and the other is mounted on the head unit PCB 2354.

Figure 26:
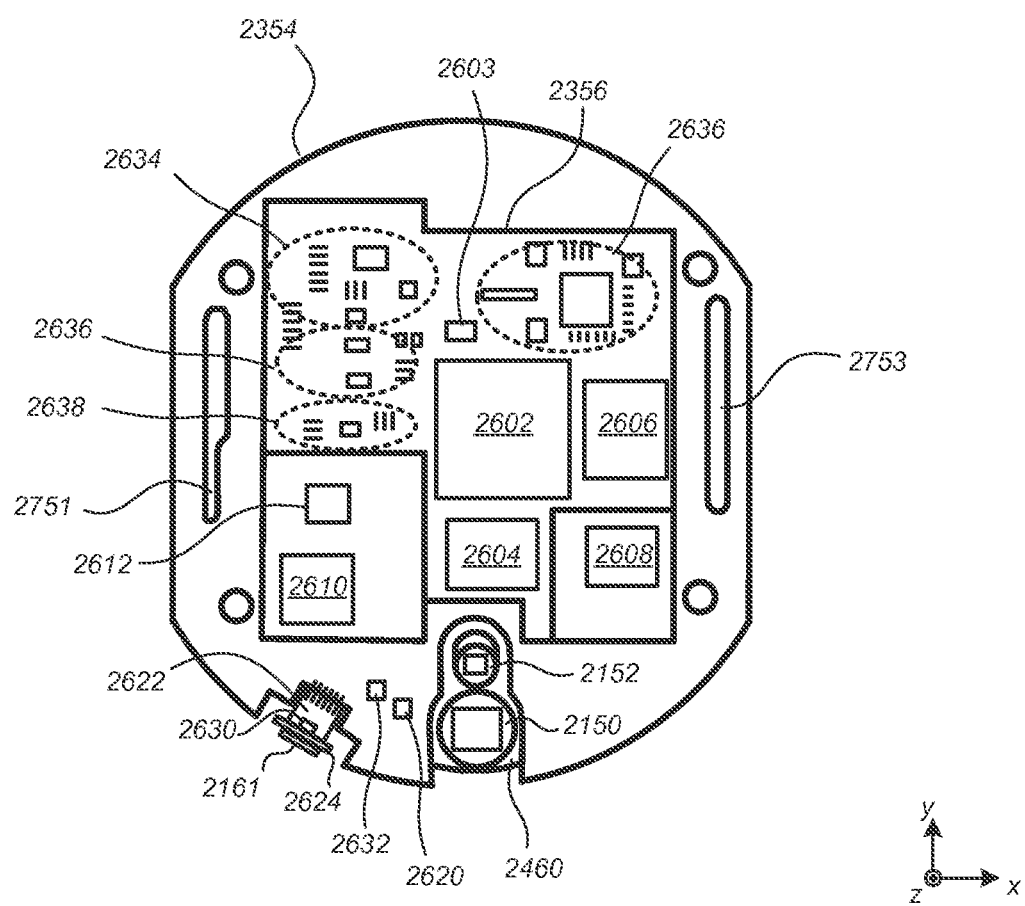
FIG. 26 illustrates a front view of a head unit circuit board of the head unit, according to some embodiments.

FIGS. 25A-25B illustrate exploded front and rear perspective views, respectively, of the backplate unit 2142. Backplate unit 2142 comprises a backplate rear plate 2582, a backplate circuit board 2580, and a backplate cover 2570. Visible in FIG. 25A are HVAC wire connectors 2584 that include integrated mechanical wire insertion sensing circuitry, and relatively large capacitors 2586 that are used by part of the power stealing circuitry that is mounted on the backplate circuit board 2580. According to some embodiments, backplate circuit board 2580 includes a microcontroller, electronic circuitry that achieves HVAC actuation functionality (i.e., connecting and disconnecting different pairs of HVAC wire terminals according to the required HVAC function), and various functional support and power electronics. For some embodiments, the HVAC switching and powering functionalities can be similar to that described in U.S. Ser. No. 13/467,025 (Ref. No. NES0177-US), supra. For some embodiments, the backplate circuit board 2580 further contains a temperature/humidity sensor integrated together in a common IC chip. Wire connectors 2584 are provided to allow for connection to HVAC system wires, which pass though the large central circular opening 2590 when the backplate unit 2142 is mounted to the wall. Also visible in FIGS. 25A-25B are two mounting holes 2592 and 2594 for use in fixing the backplate to the wall. The laterally extending mounting holes 2592 and 2594, together with an integrated bubble level 2572 and bubble level holder 2574 facilitate leveling during installation without requiring an external leveling gauge, thereby further enhancing the ease of a non-expert installation of the intelligent thermostat 2100. FIG. 26 illustrates a front aerial view of the head unit PCB 2354. The head unit circuit board 2354 comprises a head unit microprocessor 2602, such as a Texas Instruments AM3703 chip, and an associated oscillator 2603, along with DDR SDRAM memory 2604 (which may be, for example, 64 MB or greater in size), and mass NAND flash storage 2606 (which may be, for example, 256 MB or greater in size). A Wi-Fi module 2608, such as a Murata Wireless Solutions LBWA19XSLZ module, which is based on the Texas Instruments WL1270 chipset supporting the 802.11 b/g/n WLAN standard, is provided in a separate compartment of RF shielding 2356 for Wi-Fi capability. Associated with Wi-Fi module 2608 is supporting circuitry (not shown) such as a 26 MHz crystal oscillator (not shown). Head unit PCB further comprises an IEEE 802.15.4-compatible wireless communication module 2610, such as an Ember EM357 chip available from Silicon Laboratories, Inc., also in a separately shielded RF compartment. Using a protocol that is compatible with IEEE 802.15.4, which is a standard that specifies the physical and media access control layers for relatively low-rate wireless personal area networks, the intelligent thermostat 2100 may be provided with an ability to communicate directly with different smart-home sensors for achieving any of a variety of useful environmental control and monitoring objectives. Associated with the IEEE 802.15.4 module 2610 is supporting circuitry such a 24 MHz crystal oscillator (not shown) and a front end chip 2612, such as a SKY65384 Front-End Module available from Skyworks Solutions, Inc., that comprises a transmit amplifier, a low-noise amplifier for receive, and a transmit/receive switch. Preferably, both the Wi-Fi module 2608 and IEEE 802.15.4 module 2610 are dynamically programmable, with programs for each being stored in the mass NAND flash storage 2606 and loaded thereon upon reboot, which provides an ability for respective—new, different, or updated programs to be downloaded from a central server, stored in the mass NAND flash storage 2606, and then loaded into the respective wireless modules 2608/2610.

Head unit PCB 2354 further includes the PIR mini-board 2460 that is screw-mounted thereto (screws not shown) below the plane thereof, the PIR mini-board 2460 for supporting the forward-facing (occupancy detecting) PIR detector 2150, and the diagonally-downward-facing (proximity detecting) PIR detector 2152, such that each of the PIR detectors protrudes through an inwardly extending opening of the head unit PCB 2354. By way of example and not by way of limitation, the forward-facing (occupancy detecting) PIR detector 2150 may be a PYD 1794 pyroelectric detector, and the diagonally-downward-facing (proximity detecting) PIR detector 2152 can be a PYD 5731 pyroelectric detector, both available from Excelitas Technologies Corp.

Head unit PCB 2354 further includes a physical/electrical connector 2622 that mounts thereto inside of an inwardly facing recess along a perimeter thereof. Mateably attached to the physical/electrical connector 2622 is a daughterboard 2624 that, when so attached, rises perpendicular to the head unit PCB 2354 (i.e., in the z-direction in FIG. 26). Mounted on an outwardly facing surface of the daughterboard 2624 is the optical finger navigation (OFN) module 2161 (see FIG. 21, supra) for tracking rotation of the outer ring 2112. By way of example, the OFN module 2161 can be an ADBS-A350 OFN Sensor available from Avago Technologies. Mounted on an inwardly facing surface of the daughterboard 2624, and rising substantially above the plane of the head unit PCB 2354, is a first temperature sensor 2630. Mounted on the surface of the head unit PCB 2354 is a second temperature sensor 2632, along with a nearby ambient light sensor (ALS) module 2620. The temperature sensors 2630 and 2632 can each be, for example, a TMP112 Digital Temperature Sensor available from Texas Instruments.

Head unit PCB further includes, inside the RF shielding 2356, battery charging circuitry 2634, preferably including an LTC4085-3 chip available from Linear Technologies Corporation, or other devices or circuitry that provides equivalent functionality and advantages. The LTC4085-3 is a USB power manager and Li-Ion/Polymer battery charger chip originally developed for portable battery-powered applications. Head unit PCB 2354 further includes main power management circuitry 2636 including DC/DC step-down conversion and voltage regulation circuitry. Head unit PCB 2354 further includes piezoelectric driving circuitry 2636 for actuating a piezoelectric buzzer that is mounted on a bottom surface of a top lid of the RF shielding 2356, for providing optional audible sounds such as a "tick" sound responsive to user ring rotations. Head unit PCB 2354 further includes display backlight voltage generation circuitry 2638.

Slotted openings 2751 and 2753 are provided in the head unit PCB 2354 to facilitate mechanical assembly including providing space for ribbon cables, such as a ribbon cable that runs from the back side of head unit PCB 2354 to the LCD module 2362 (see FIG. 23A, supra). Two RF antennae (not shown) are provided in the head unit PCB 2354, the antennae running alongside the respective slotted openings 2751 and 2753.

Figure 27:
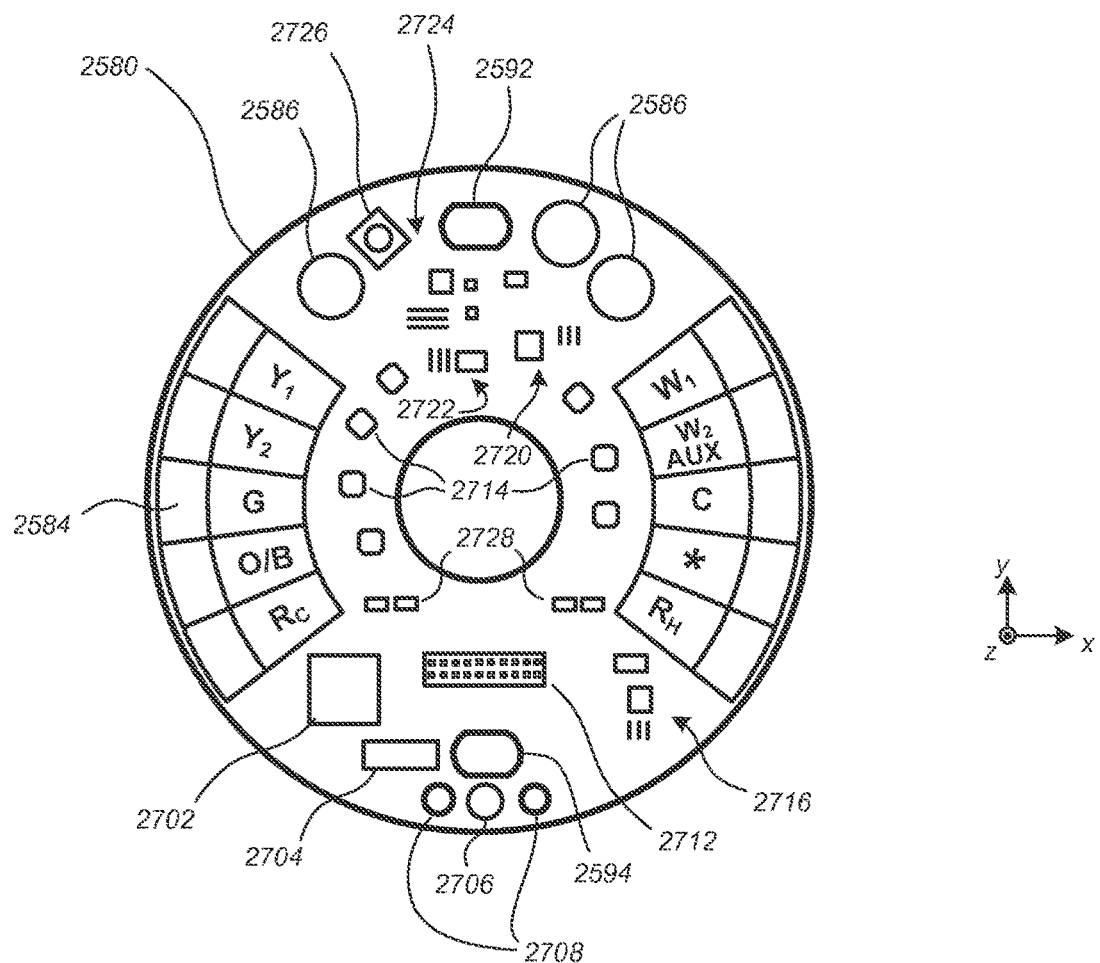
FIG. 27 illustrates a front view of a backplate circuit board of the backplate, according to some embodiments.

FIG. 27 illustrates an aerial view of the backplate circuit board 2580. The backplate circuit board 2580 comprises a backplate processor/microcontroller 2702 that is responsible for generally orchestrating the operation of the backplate 2142, including activating the switching circuits coupled to the HVAC wires, and that is furthermore is responsible for controlling and polling most of the environmental sensors of the thermostat 2100. The backplate processor/microcontroller 2702 may comprise, for example, an ST Micro STM32L151VB microcontroller unit that may include, for example, an ultra-low-power ARM 32-bit Cortex-M3 CPU, 128 Kbytes of flash memory, 16 kB of RAM, and various other components such as direct memory access controllers, analog to digital converters, input/output ports, communication interfaces, and so forth for achieving the described functionalities.

To maximize the amount of time for which the relatively high-powered head unit processor 2602 of FIG. 26 supra can remain in a low-power sleep state, it is preferably the relatively low-powered backplate processor/microcontroller 2702 that controls and polls not only the sensors contained in the backplate 2142, but that also controls and polls most of the sensors contained in the head unit 2140. For one embodiment, in addition to controlling and polling a temperature/humidity sensor chip 2706 contained on the backplate circuit board 2580, the backplate processor/microcontroller 2702 furthermore controls and polls every sensor contained in the head unit 2140 except for the optical finger navigation (OFN) module 2161. As such, the backplate processor/microcontroller 2702 controls and polls the following components of the head unit 2140: the first temperature sensor 2630, the second temperature sensor 2632, the ambient light sensor (ALS) 2620, the forward-facing (occupancy detecting) PIR detector 2150, and the diagonally-downward-facing (proximity detecting) PIR detector 2152. Electrical connectivity between the backplate processor/microcontroller 2702 and the subject head unit sensors is achieved using a 20-pin connector 2712, along with one or more port expanders on the head unit circuit board, by which the electrical connections are established when the head unit 2140 is mated to the backplate 2142. Backplate circuit board 2580 further comprises a timing crystal chip 2704 that may provide, for example, a 32.768 kHz signal that may be used by the backplate processor/microcontroller 2702 for timing reference purposes. The backplate processor/microcontroller 2702 performs, in addition to the controlling and polling of the various sensors, sensing for mechanical wire insertion at installation, alerting the head unit regarding current vs. setpoint temperature conditions and actuating the switches accordingly, and other functions such as looking for appropriate signals on the inserted HVAC wires at installation and thereafter.

Backplate circuit board 2580 further comprises the combined temperature/humidity sensor chip 2706 positioned near a lower periphery thereof. The temperature/humidity sensor chip 2706 can comprise, by way of example and not by way of limitation, a Sensirion SHT21 module. Thermal isolation of the temperature/humidity sensor chip 2706 from the rest of the backplate circuit board 2580 is facilitated by virtue of the lower mounting through-hole 2594 along with two additional through-holes 2708. Further disposed on the backplate circuit board 2580 in an arcuate arrangement neararound a peripheral portion of thereof are the HVAC wire connectors 2584 that include integrated mechanical wire insertion sensing capability, which are further described in U.S. Ser. No. 13/624,878 (Ref. No. NES0236-US), supra.

Backplate circuit board 2580 further comprises encapsulated transformer/diode circuits 2714 that are used for transformer-based isolation of the control and logic circuitry from the HVAC connection and switching circuitry, as described in U.S. Ser. No. 13/034,674 (Ref. No. NES0006-US), supra. Disposed on the back side of the backplate circuit board 2580 (not shown) are field effect transistor (FET) switches (not shown) that perform the HVAC switching functionality and that are electrically disposed on the isolated HVAC connection and switching circuitry side of the transformer/diode circuits 2714. The FET switches perform, inter alia, the basic closing and opening between the requisite HVAC terminals according to the desired HVAC function. As described in U.S. Ser. No. 13/467,025 (Ref. No. NES0177-US), supra, one or more of the FET switches (not shown) are also judiciously configured and controlled to facilitate power stealing during active HVAC cycles for circumstances in which there is no "C-wire" available to power the thermostat 2100. The use of FETs in the switching circuitry allows for active power stealing, i.e., taking power during the HVAC ON cycle, by briefly diverting power from the HVAC relay circuit to the reservoir capacitors for a very small interval, such as 100 micro-seconds. This time is small enough not to trip the HVAC relay into the OFF state but is sufficient to charge up the reservoir capacitors. The use of FETs allows for this fast switching time (100 micro-seconds), which would be difficult to achieve using relays (which stay on for tens of milliseconds). Also, such relays would readily degrade with fast switching, and they would also make audible noise. In contrast, the FETS operate with essentially no audible noise.

Backplate circuit board 2580 further comprises various other DC-power generation circuitry for providing power that is used by the backplate processor/microcontroller 2702, the environmental sensors controlled thereby, the various other backplate circuit board components, and for providing a DC power rail voltage (e.g., 4.4 VDC) that is input to the battery charging circuitry of the head unit 2140. Operation of the various DC-power generation circuitry is described in U.S. Ser. No. 13/034,674 (Ref. No. NES0006-US), supra, U.S. Ser. No. 13/034,678 (Ref. No. NES0007-US), supra, and/or U.S. Ser. No. 13/467,025 (Ref. No. NES0177-US), supra. Such DC-power generation circuitry includes, for example, bootstrap and primary LDO circuitry 2716, bridge rectifier circuitry 2720, the relatively large storage capacitors 2586, soft-start circuitry 2722, and buck converter circuitry 2724 including inductor 2726. Backplate circuit board 2580 further comprises wire insertion sensing and voltage sensing circuitry 2728, further portions of which are located on the back side of the backplate circuit board 2580.

Figures 28A, 28B:
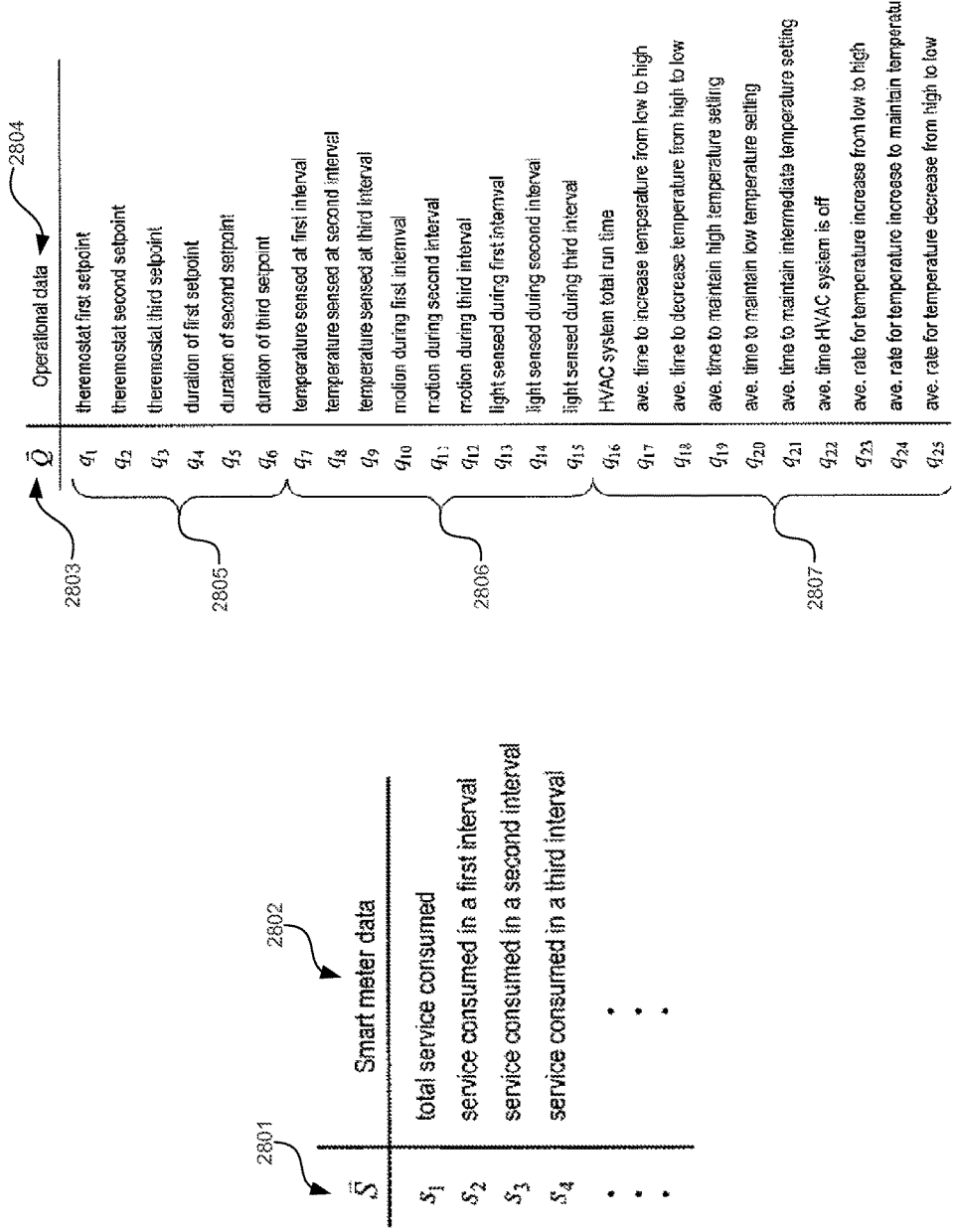
FIGS. 28A-28B present example tables of smart-meter data recorded by a smart meter and operational data collected by an intelligent thermostat, according to some embodiments.

FIG. 28A illustrates a table of example smart-meter data recorded by a natural gas smart meter. Second column 2802 lists examples of the type of smart-meter data recorded by a smart meter. First column 2801 represents smart-meter data elements of a smart-meter data vector $\vec{S}$ assigned to numerically represent the smart-meter data in column 2802. Smart-meter data element $s_1$ represents the total amount of a utility or service consumed over a number of subintervals of time, and smart-meter data elements $s_2$, $s_3$, and $s_4$ represent the amount of the utility or service consumed in just four subintervals of time. For example, the utility can be natural gas or electricity provided by a utility company and the intervals $s_2$, $s_3$, and $s_4$ can each represent the volume of gas or number of watts consumed during a particular hour of the day. The smart-meter data element $S_1$ can represent the total volume of gas or total number of watts consumed in a 24 hour period.

FIG. 28B illustrates a table of example operational data collected and generated by an intelligent thermostat. Second column 2804 represents the types of operational data which can be composed of control data 2805 entered by an intelligent thermostat user, raw data 2806 measured by the intelligent thermostat sensors, and data 2807 generated by the intelligent thermostat. First column 2803 represents operational data elements of an operational data vector $\vec{Q}$ assigned to numerically represent the operational data in column 2804. For example, operational data element $q_1$ represents a thermostat setting for a first interval of time, $q_7$ represents a temperature sensed at the beginning of the first interval, and $q_{16}$ represents the total runtime of an HVAC system. Of course it is understood that more than one operational data element can be used to represent different raw data, setpoints and other data generated by the intelligent thermostat.

Electricity and natural gas pricing usually peaks at certain predictable times of the day and season. In particular, if generation is constrained, prices can rise when electricity and gas obtained from other regions or more costly sources are brought online. Because smart meters can record interval consumption of a service, such as natural gas and electricity, smart-meter data and other operational data can be used to adjust user consumption habits to be more responsive to market prices. FIGS. 29A-29H illustrate examples of the kinds of operational data that can be collected from and intelligent thermostat and used in calculating virtual smart-meter data and to adjust schedule settings of an intelligent thermostat.

Figure 29A:
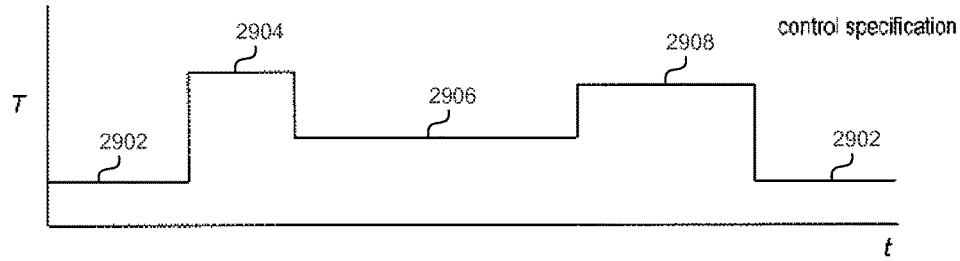
FIGS. 29A-29H illustrate examples of operational data and virtual smart-meter data that can be generated and used to adjust schedule settings of an intelligent thermostat, according to some embodiments.

FIG. 29A illustrates a plot of user desired temperatures an intelligent thermostat is directed to achieve according to the thermostat settings. The specification indicates that the temperature is desired to be initially low 2902, then rise to a high temperature 2904, then subsides to an intermediate temperature 2906, then rise to a relatively high temperature 2908, and then drop to the low temperature 2902. The temperature control specification can be visually displayed to the user on the intelligent thermostat interface or on an organization or vender website.

Figure 29B:
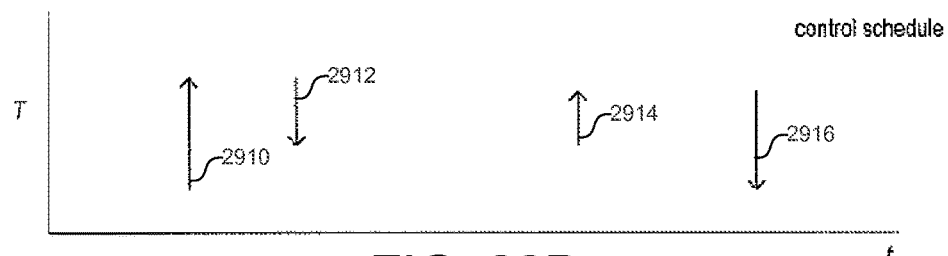
Figure 29C:
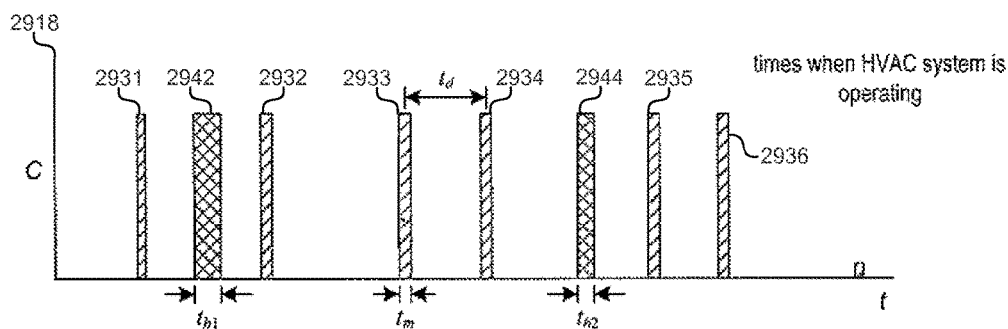

FIG. 29B shows a control schedule corresponding to the control specification illustrated in FIG. 29A. The control schedule includes a temperature increase 2910, a temperature decrease 2912, a temperature increase 2914, and temperature decrease 2916 that correspond to the user input thermostat settings. The directional arrows correspond to setpoints, or indications of desired temperature changes, at particular points in time as set by the user.

FIG. 26C illustrates a plot of control output from the intelligent thermostat to the HVAC system that might result from the intelligent thermostat attempting to maintain the desired control specification illustrated in FIG. 26A. Vertical axis 2918 represents the magnitude of a control signal. Each bar represents the magnitude of an output control signal over time. The control output may be a current or voltage signal sent from the intelligent thermostat to a heating unit, with a high-voltage signal indicating that the heating unit should be currently operating and a low- or no voltage output indicating that the heating system should not be operating. The width of each bar represents the amount of time the heating unit is operating, cross-hatched bars represent the heating unit operated to increase the temperatures according to the control schedule, and hash-marked bars represent the heating unit operated to maintain a desired temperature setting. The times the heating unit is operated to increase the temperature is denoted by $t_{h1}$ and $t_{h2}$, the times the heating unit is operated to maintain a desired temperature is denoted by $t_m$, and the time between operating the heating unit to maintain a desired temperature is denoted by $t_d$. The intelligent thermostat can calculate and record the average time to increase the temperature, calculate and record the average time to maintain a desired temperature, and calculate and record the time between operating the heating unit to maintain a desired temperature.

Figure 29D:
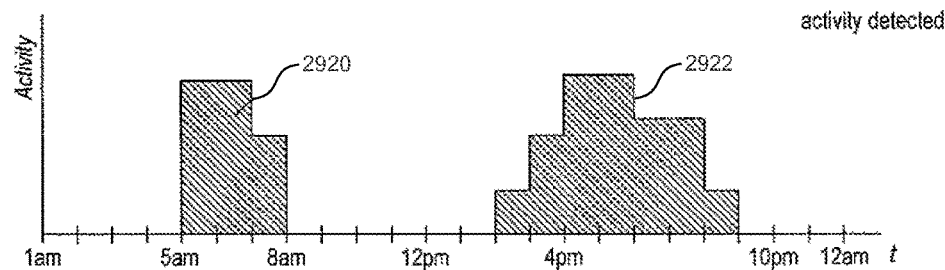

FIG. 29D illustrates a plot of activity sensed in the home by the intelligent thermostat motion sensors. Shaded regions 2920 and 2922 represent the level of activity detected by the thermostat motion sensors in a 24 hour period. In this example, between 1 am and 5 am no activity is detected in the home, which suggests that the occupants are sleeping. Between 5 am and 8 am the occupants are awake and engaged in morning activities, such as preparing to leave for work or school. Between 8 am and 2 pm no activity is detected in the home, which suggests that the occupants are away. However, shaded region 1922 indicates that activity begins at 2 pm and gradually increases and reduces to no activity at 9 pm.

Figure 29E:
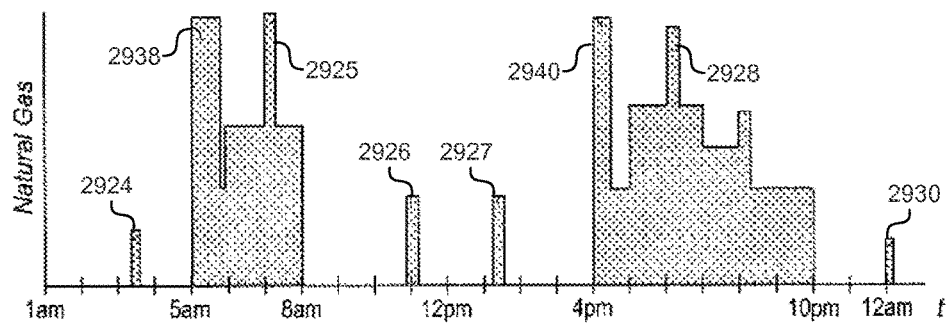

FIG. 29E illustrates a plot of virtual smart-meter data that represents an estimation of the natural gas consumed per hour during a 24 hour period generated as described above. Spikes 2924-2930 correspond to the time intervals 2931-2936 in FIG. 29C, respectively, when the heating unit is operated to maintain temperature according to the control schedule in FIG. 29A. Spikes 2938 and 2940 correspond to time intervals 2942 and 2944 in FIG. 29C, respectively, when the heating unit is operated to increase the temperature of the home. The remaining elevated portions represent other levels for natural gas consumption, such as to operate a gas stove or heat water stored in a hot water heater.

Figure 29F:
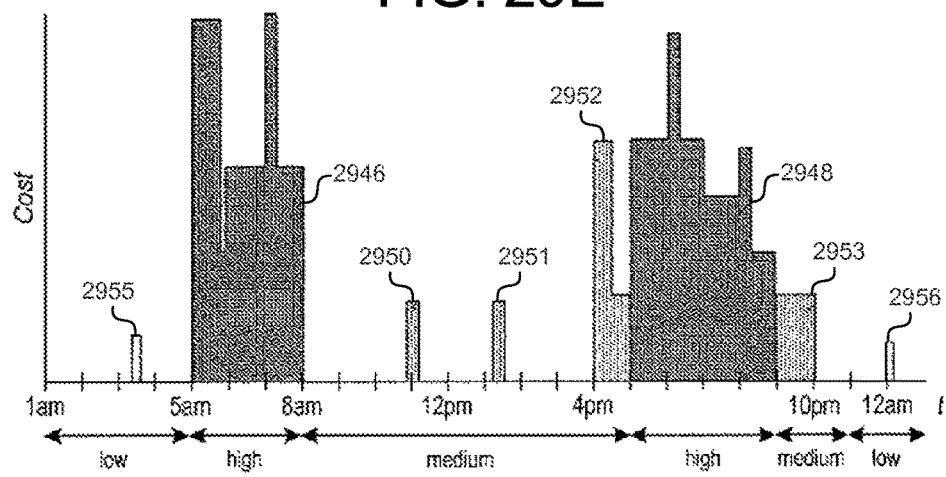

FIG. 29F illustrates a plot of estimated cost associated with the estimated natural gas consumption during the 24 hour period illustrated in FIG. 29E. The cost estimates can be based on the prices the utility company assigns to low, medium, and high periods of natural gas consumed during different the time intervals identified by labeled directional arrows below the time axis. The shaded regions represent costs that correspond to the natural gas usage plotted in FIG. 29E. Dark shaded regions 2946 and 2948 represent the cost of consuming natural over the highest price time intervals. Medium shaded regions 2950-2953 represent the cost of consuming natural gas over the medium price time intervals. Lightly shaded regions 2955 and 2956 represent the cost of consuming natural gas over the lowest price time intervals.

The data represented in FIGS. 28E and 29F can be presented to the intelligent-thermostat user via the intelligent thermostat interface or user interface provided by the intelligent thermostat manufacturer or vendor. The times to maintain and increase temperature settings represented in FIG. 29C, the activity levels represents in FIG. 29D, natural gas levels represented in FIG. 29E, and the costs represented in FIG. 29F represent just a portion of the data collected and generated by the intelligent thermostat to be used in generating virtual smart-meter data and in generating intelligent thermostat commands and information that can be sent to the intelligent thermostat to adjust thermostat settings.

Figure 29G:
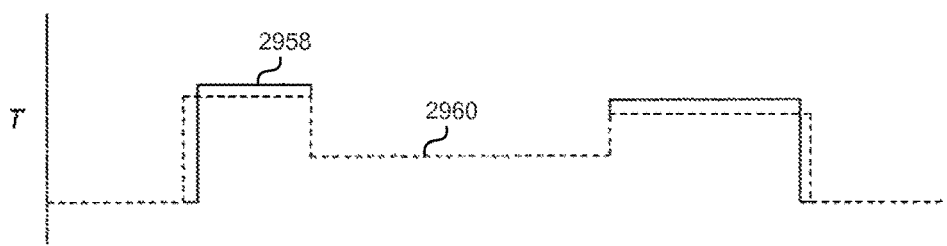

FIG. 29G illustrates a plot of an adjusted control specification based on the habits of occupants and a decrease in outside temperatures. For example, occupants may be present before the setpoint temperature increases as determined by motion sensors or the outside temperature so that the heating unit can be started later in order to account for shorter heating time needed to bring the indoor temperature to a desired high temperature setting. Solid curve 2658 represents an updated control specification with shorter periods for the higher temperature settings, and dotted lines 2660 represent the previous control specification illustrated in FIG. 26A.

Figure 29H:
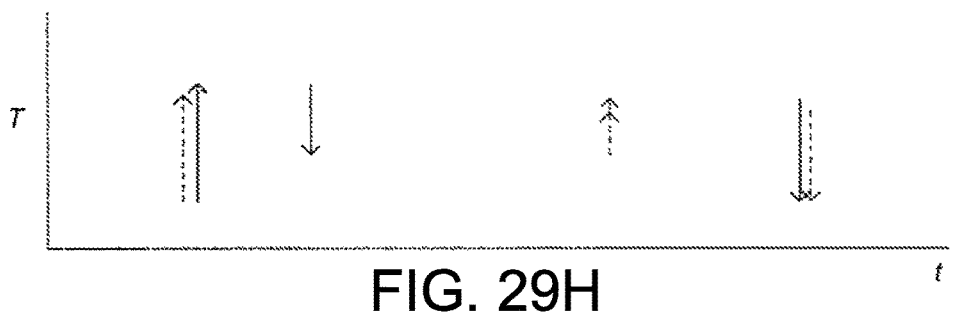

FIG. 29H illustrates a plot of an updated control schedule that corresponds to the updated control schedule illustrated in FIG. 26A. The solid directional arrows correspond to updated setpoints, or indications of temperature changes, at particular points in time as set by the remote system to better reflect the actual habits of occupants, changing weather conditions, or increase the energy efficiency of the HVAC system. Dashed directional arrows represent setpoints that correspond to previous setpoints illustrated in FIG. 26B.

Although the current disclosure has been described in terms of particular examples, it is not intended that the current disclosure be limited to these examples. Modifications within the spirit of the disclosure will be apparent to those skilled in the art. For example, the computational methods can be distributed between the intelligent controller and the remote system. In particular, in FIG. 18A, the step 1812 "generate virtual smart-meter data" can executed in the intelligent controller instead of the remote system. Because the remote system has access to the database of operational and smart-meter data for a large number of intelligent controllers and associated smart meters, the constants of Equations (1)-(16) or the weight from the feed-forward neural network can be computed by the remote system and transmitted to the intelligent controller that, in turn, computes the virtual smart-meter data. The method logic may include logic-circuit implementations, firmware, and computer-instruction-based routine and program implementations, all of which may vary depending on the selected values of a wide variety of different implementation and design parameters, including programming language, modular organization, hardware platform, data structures, control structures, and many other such design and implementation parameters.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A computer system comprising:
   one or more processors;
   one or more data-storage devices; and
   machine-readable instructions stored in one or more of the one or more data-storage devices that, when executed by the one or more processors, causes the one or more processors to perform operations comprising:
   accessing smart-meter data from a plurality of smart meters, wherein the plurality of smart meters measure energy usage for a plurality of homes;
   accessing operational data from a plurality of intelligent controllers, wherein the plurality of intelligent controllers control energy-consuming subsystems in the plurality of homes;
   receiving operational data of an intelligent controller in an enclosure;
   generating smart-meter data for the enclosure as a function of the operational data of the intelligent controller, wherein the function is based at least in part on the operational data from the plurality of intelligent controllers and the smart-meter data from the plurality of intelligent controllers; and
   causing the intelligent controller to operate an energy-consuming system in the enclosure based at least in part on the generated smart-meter data.

2. The computer system of claim 1, wherein the operations further comprise:
   retrieving extrinsic data associated with the enclosure in which the intelligent controller is located; and
   appending the extrinsic data to the operational data.

3. The computer system of claim 1, wherein the operations further comprise:
   searching real estate databases to determine extrinsic data associated with the enclosure in which the intelligent controller is located; and
   appending the extrinsic data to the operational data.

4. The computer system of claim 1, wherein the function further comprises a set of weights that relate the operational data from the plurality of intelligent controllers and the smart-meter data from the plurality of smart meters.

5. The computer system of claim 4, wherein the function is generated from a feed-forward neural network with backward propagation with the operational data from the plurality of intelligent controllers as an input layer and the smart-meter data from the plurality of smart meters as an output layer.

6. The computer system of claim 4, wherein the function comprises a series of polynomials that relate each element of the smart-meter data from the plurality of smart meters to the operational data from the plurality of intelligent controllers.

7. The computer system of claim 4, wherein the function comprises a series of rational polynomials that relate each element of the smart-meter data from the plurality of smart meters to the operational data from the plurality of intelligent controllers.

8. The computer system of claim 1, wherein the operational data of the intelligent controller further comprises data collected from intelligent controller sensors, control schedules, and data generated by the intelligent controller.

9. The computer system of claim 1, wherein the intelligent controller further comprises an intelligent thermostat.

10. The computer system of claim 1, wherein the plurality of smart meters further comprises one or more of a natural gas smart meter, an electricity smart meter, or a water smart meter.

11. A method to be carried out by a computer system that includes one or more processors and one or more data-storage devices, the method comprising:
    accessing smart-meter data from a plurality of smart meters, wherein the plurality of smart meters measure energy usage for a plurality of homes;
    accessing operational data from a plurality of intelligent controllers, wherein the plurality of intelligent controllers control energy-consuming subsystems in the plurality of homes;
    receiving operational data of an intelligent controller in an enclosure;
    generating smart-meter data for the enclosure as a function of the operational data of the intelligent controller, wherein the function is based at least in part on the operational data from the plurality of intelligent controllers and the smart-meter data from the plurality of intelligent controllers; and
    causing the intelligent controller to operate an energy-consuming system in the enclosure based at least in part on the generated smart-meter data.

12. The method of claim 11, further comprising:
    retrieving extrinsic data associated with the enclosure in which the intelligent controller is located; and
    appending the extrinsic data to the operational data.

13. The method of claim 11, further comprising:
    searching real estate databases to determine extrinsic data associated with the enclosure in which the intelligent controller is located; and
    appending the extrinsic data to the operational data.

14. The method of claim 11, wherein the function further comprises a set of weights that relate the operational data from the plurality of intelligent controllers and the smart-meter data collected from the plurality of smart meters.

15. The method of claim 14, wherein the function is generated from a feed-forward neural network with backward propagation with the operational data from the plurality of intelligent controllers as an input layer and the smart-meter data from the plurality of smart meters as an output layer.

16. The method of claim 14, wherein the function comprises a series of polynomials that relate each element of the smart-meter data from the plurality of smart meters to the operational data from the plurality of intelligent controllers.

17. The method of claim 14, wherein the function comprises a series of rational polynomials that relate each element of the smart-meter data from the plurality of smart meters to the operational data from the plurality of intelligent controllers.

18. The method of claim 11, wherein the operational data of the intelligent controller further comprises data collected from intelligent controller sensors, control schedules, and data generated by the intelligent controller.

19. The method of claim 11, wherein the intelligent controller further comprises an intelligent thermostat.

20. The method of claim 11, wherein the plurality of smart meters further comprises one or more of a natural gas smart meter, an electricity smart meter, or a water smart meter.

* * * * *